(12) United States Patent
Lalithambika et al.

(10) Patent No.: US 7,961,484 B2
(45) Date of Patent: Jun. 14, 2011

(54) BIPOLAR TRANSISTOR DRIVERS

(75) Inventors: Vinod A. Lalithambika, Cambridge Cambridgeshire (GB); Paul Ryan, Cambridgeshire (GB); David Michael Garner, London (GB); Russell Jacques, Cambridge (GB)

(73) Assignee: Cambridge Semiconductor Limited (GB)

( * ) Notice: Subject to any disclaimer, the term of this patent is extended or adjusted under 35 U.S.C. 154(b) by 457 days.

(21) Appl. No.: 12/109,087

(22) Filed: Apr. 24, 2008

(65) Prior Publication Data
US 2009/0040796 A1     Feb. 12, 2009

(30) Foreign Application Priority Data

Apr. 27, 2007  (GB) .................................. 0708196.1

(51) Int. Cl.
*H02H 7/122*  (2006.01)
*H02M 3/335*  (2006.01)
*H02M 7/217*  (2006.01)
(52) U.S. Cl. ............... 363/56.09; 363/21.04; 363/21.12
(58) Field of Classification Search .............. 363/21.04, 363/21.09, 21.12, 21.17, 127, 56.09–56.11
See application file for complete search history.

(56) References Cited

U.S. PATENT DOCUMENTS

| | | | |
|---|---|---|---|
| 4,055,794 A | 10/1977 | Ickes et al. | |
| 4,178,628 A | 12/1979 | Shepard, Jr. | |
| 4,410,810 A * | 10/1983 | Christen | 327/375 |
| 4,628,743 A * | 12/1986 | Miller et al. | 73/861.95 |
| 4,749,876 A | 6/1988 | Gale et al. | |
| 4,937,731 A * | 6/1990 | Konopka | 363/143 |
| 4,987,362 A | 1/1991 | Zwanziger | |
| 5,017,802 A | 5/1991 | Feldtkeller | |
| 5,107,190 A * | 4/1992 | Schultz et al. | 315/387 |
| 5,371,667 A * | 12/1994 | Nakao et al. | 363/124 |
| 5,559,661 A | 9/1996 | Meinders | |
| 5,793,624 A * | 8/1998 | Couture et al. | 363/89 |
| 5,861,719 A | 1/1999 | Koskowich et al. | |
| 6,097,582 A | 8/2000 | John et al. | |

(Continued)

FOREIGN PATENT DOCUMENTS

DE        102005012151        6/2006

(Continued)

OTHER PUBLICATIONS

"United Kingdom Application Serial No. GB0708196.1, Search Report dated Aug. 5, 2008", 1 pg.

(Continued)

*Primary Examiner* — Adolf Berhane
*Assistant Examiner* — Jeffrey Gblende
(74) *Attorney, Agent, or Firm* — Schwegman, Lundberg & Woessner, P.A.

(57) ABSTRACT

We describe a switching power converter comprising a bipolar switching device (BJT or IGBT) switching an inductive load, and including a closed-loop control system. The control system comprises a voltage sensing system to sense a voltage on a collector terminal of the switching device and provide a voltage sense signal; a controller; and a drive modulation system coupled to an output of the controller for modulating a drive to the control terminal of said bipolar switching device responsive to a controller control signal; wherein said controller is configured to monitor changes in the sensed voltage during a period when said switching device is switched on and to control said drive modulation system to control the degree of saturation of said bipolar switching device when the device is switched on and hence improve turn-off times.

35 Claims, 33 Drawing Sheets

U.S. PATENT DOCUMENTS

| | | | |
|---|---|---|---|
| 6,140,884 A * | 10/2000 | Harpham et al. | 331/117 R |
| 6,262,898 B1 | 7/2001 | Louvel et al. | |
| 6,304,462 B1 * | 10/2001 | Balakrishnan et al. | 363/21.01 |
| 6,525,611 B1 * | 2/2003 | Dening et al. | 330/298 |
| 2002/0067204 A1 * | 6/2002 | Casagrande | 330/129 |
| 2003/0063484 A1 * | 4/2003 | Carsten | 363/127 |
| 2006/0057980 A1 * | 3/2006 | Haque et al. | 455/127.1 |
| 2007/0041224 A1 * | 2/2007 | Moyse et al. | 363/21.01 |
| 2007/0057778 A1 * | 3/2007 | Prince et al. | 340/384.6 |
| 2007/0274108 A1 | 11/2007 | Jacques | |
| 2008/0037293 A1 | 2/2008 | Jacques et al. | |
| 2008/0239761 A1 | 10/2008 | Jacques et al. | |
| 2008/0239762 A1 | 10/2008 | Jacques et al. | |
| 2008/0239764 A1 | 10/2008 | Jacques et al. | |
| 2009/0002050 A1 * | 1/2009 | Chen | 327/333 |

FOREIGN PATENT DOCUMENTS

| | | |
|---|---|---|
| EP | 0343536 A1 | 11/1989 |
| EP | 0398170 A2 | 11/1990 |
| GB | 1340040 | 12/1973 |
| GB | 2300530 | 11/1996 |

OTHER PUBLICATIONS

"United Kingdom Application Serial No. GB0817768.5, Search Report mailed Dec. 11, 2008", 1 pg.

"United Kingdom Application Serial No. GB0819050.6, Search Report dated Jan. 28, 2009", 1 pg.

"International Application No. PCT/GB2008/050300, International Search Report mailed Oct. 22, 2008", 2 pgs.

* cited by examiner

BIPOLAR TRANSISTOR DRIVERS

RELATED APPLICATION

This application claims priority under 35 U.S.C. 119 to United Kingdom Application No. 0708196.1, filed Apr. 27, 2007, which application is incorporated herein by reference and made a part hereof.

FIELD OF THE INVENTION

This invention relates to methods and apparatus, both analogue and digital, for driving bipolar switching devices such as a bipolar junction transistor (BJT) or insulated gate bipolar transistor (IGBT), in particular to control the degree of saturation when the device is on and hence improve turn-off times.

BACKGROUND TO THE INVENTION

FIG. 1a shows a typical high voltage NPN transistor which has a heavily N+ doped emitter, a moderately P doped base region and a lightly N doped collector, with a Heavily N+ doped collector ohmic contact.

With a high voltage on the collector, the collector-base junction is reverse-biased, and a charge depletion region extends largely into the collector due to its lower doping level. If a forward current is made to flow in the base-emitter junction, most of the current consists of electrons flowing from emitter to base, with a small current component of holes flowing from base to emitter, due to the higher N+ doping of the emitter relative to the P doping of the base.

With a thin base, most of the electrons from the emitter flow through the base region and into the collector, causing a collector current to flow which is typically much larger than the base current. As long as the collector voltage is sufficiently high the transistor operates in the "unsaturated" region of the characteristic curves of FIG. 1b, where the collector/base current ratio is approximately constant. Only electrons are injected into the collector from the emitter. As the collector is N doped these electrons are "majority" carriers, and collector current can change very rapidly in response to base current.

As the collector voltage reduces with current still flowing, the depletion region disappears, and a point is reached where the collector-base junction becomes forward biased (quasi-saturation begins). At high currents there will still be significant voltage (perhaps tens of volts) on the external collector contact due to the resistive I×R drop in the lightly doped region. The forward biased collector-base junction now begins to inject holes (minority carriers) into the lightly doped collector.

The techniques we describe later are particularly relevant to power semiconductor devices; when we refer to power devices we are generally referring to high voltage devices which typically operate with a voltage of greater than 50 volts, more usually greater than 100 volts or 200 volts. Generally (but not always) the devices operate at powers of greater than 1 watt. As described above, broadly speaking in a high voltage device (and also, less noticeably, in a low voltage device) the extended collector connection has a resistance and the bipolar transistor shown in the symbol of FIG. 1a can be considered to have a (non-linear) resistor in series between the device itself and the collector terminal. Effectively the internal device can be in saturation (for example, the base-collector junction being forward biased) whilst externally the collector-emitter voltage drop is governed by the voltage across the internal non-linear resistor (the resistance of which falls as the current rises due to the injection of carriers).

The presence of holes in the collector increases the electron density to maintain approximate charge neutrality, and the resulting electron-hole plasma lowers the collector resistance, and hence the voltage drop. If the base current is increased further the collector resistance drops roughly as the inverse of the base current, until eventually a point is reached where fixed resistances become dominant. Still higher base currents increase the stored charge in the collector region, but the collector-emitter voltage falls no further and the transistor is in full or deep saturation.

Turning off the bipolar transistor generally entails removal of all the charge stored in the collector. Two methods can remove charge from the bipolar's collector region:
1. Internal base-emitter current (charge supplied by the collector to maintain conduction);

Removal of forward base current from a saturated BJT stops the injection of minority charge into the collector, and the stored collector charge now flows into the emitter through the base, sustaining conduction. This internal base current is amplified by the current gain of the transistor, and is also a slow mechanism for turn-off.

2. External reverse base current;

Large reverse base currents are the most effective way to turn off BJTs quickly, particularly in conjunction with stored charge minimization schemes (such as avoiding deep saturation). There are various limitations on the amount of reverse base current that can be drawn, such as lateral base resistance, base-emitter junction breakdown voltage, and charge drift velocity from the collector into the base.

One technique for regulating the base current for switching a bipolar transistor is described in U.S. Pat. No. 5,017,802 but this circuit has the drawback that it is affected by the aforementioned (variable) collector resistance. It is also known to use a Baker clamp (a diode between the base and collector of a transistor) to prevent deep saturation when the transistor is driven hard, providing a path for excess base current, thus speeding up the response time of the transistor. However when a transistor is in quasi-saturation as described above the collector voltage can be greater than the base voltage and this type of clamp can fail.

Broadly speaking we will address the problem of controlling the base drive current in order to avoid excess stored charge at the desired instant of turn-off, with the aim of minimising turn-off time. The techniques we describe are particularly useful in power converters but are not restricted in their application to such circuits. This is because a power converter presents a combination of potentially conflicting requirements—use of a high voltage device with a low on resistance (for low loss and hence increased efficiency) and a fast switch-off—for example the circuit may be operating at, say, above 100 KHz.

SUMMARY OF THE INVENTION

According to a first aspect of the invention there is there provided a power converter comprising a bipolar switching device switching an inductive load, said power converter including a closed-loop control system for controlling the degree of saturation of said bipolar switching device when said bipolar switching device is switched on, said bipolar switching device having a collector terminal connected to switch power to said inductive load and a control terminal for controlling said switching, said closed-loop control system comprising: a voltage sensing system to sense a voltage on said collector terminal and to provide a voltage sense signal; a controller having an input coupled to receive said voltage sense signal from said voltage sensing system and having a control signal output; and a drive modulation system coupled to said output of said controller for modulating a drive to said control terminal of said bipolar switching device responsive to said controller control signal; and wherein said controller is configured to monitor changes in said sensed voltage during a period when said switching device is switched on and to control said drive modulation system to control said degree of saturation of said bipolar switching device when said device is switched on.

The controller and drive modulation system may be implemented in either analogue or digital circuitry, in the latter case the sensed signals being digitised and processed in the digital domain, or a combination of analogue and digital circuitry may be employed. The power converter may comprise any switch mode power converter including, but not limited to, a flyback converter and a forward converter such as an RDFC (resonant discontinuous forward converter). The skilled person will understand that in general in such a power converter one or more additional control loops will be present, for example for output voltage sensing/regulation.

In general the bipolar switching device has three terminals, an output terminal, a control terminal and a third terminal; in some preferred embodiments the device is operated in a common emitter configuration but in other embodiments the device may be operated in a common base or gate configuration in which case the control terminal may also be a power terminal, for example an emitter connection of the bipolar switching device. The bipolar switching device may comprise a BJT or IGBT.

In some preferred embodiments the switching device has a quasi-saturated state in which the device is substantially saturated and the voltage on the collector terminal varies with current through the device dependent upon an internal collector resistance. The controller may then be configured to control the degree of saturation to be within or adjacent a boundary of this quasi-saturated state. For example the saturation may be controlled to be more saturated or less saturated than a degree of saturation at the boundary of the quasi-saturated state, or the device may be controlled to be in the region of a knee in the saturation (such a knee is described further later).

In preferred embodiments the voltage sensing system includes a voltage limiter so that variations in the sensed voltage are detectable when the device is in saturation (when the collector voltage is generally relatively low), but so that the sensed voltage is limited when the device is off (when the collector voltage is generally high).

Such a sensing arrangement can be implemented by a modified Baker clamp comprising a diode coupled to the collector terminal and driven from a junction between a reference current generator and a resistor (so that this junction follows the collector voltage up to a voltage determined by the voltage across the resistor). Another voltage sensing system comprises a pair of clamping diodes coupled to power lines with a junction between the diodes coupled via a resistor to the collector terminal. However a preferred voltage sensing system comprises a capacitor with one side (plate) coupled to the collector terminal and a second side (plate) coupled to a reset device to reset a voltage on the capacitor when the switching device is on. The reset device may comprise a switch coupled to a reference voltage, for example ground to reset the voltage on the capacitor, after the switch is opened the voltage on the capacitor following the collector voltage. However other types of reset device may also be employed. For example a diode connected to a reference voltage, for example ground, will effectively reset the voltage on the capacitor to a minimum collector voltage (by inhibiting the second plate from going below the reference voltage).

A similar effect may also be achieved using a transistor with an emitter or source connection coupled to the second plate of the capacitor preferably, to reduce the effects of stray capacitance, a second capacitor is coupled to the second side (plate) of the capacitor to provide a capacitative divider for voltage sharing between the two capacitors. In a resonant converter use of such a capacitor also has the advantage of providing an additional current path (for example to ground). A further advantage is that if the closed loop control system is implemented on an integrated circuit then a connection to the second side of the capacitor may be brought out on a pin (COL) and connecting a second capacitor to this pin effectively allows the sensed voltage to be scaled, facilitating operation of the system at a range of different collector voltages (since the internal collector resistance can vary with the high voltage device employed).

The above-described capacitor-based voltage sensing system is particularly useful in a resonant converter such as an RDFC since in general there will already be a resonant capacitor on the primary side of the circuit and thus two functions can be performed by a single component. Moreover the capacitive sensing technique has the further advantage of relatively low power loss.

In some preferred embodiments the control system also includes a further switch connected to apply a forcing drive to the switching device when the device is initially turned on to force the device into saturation or quasi-saturation. Thus this further switch may be connected to a forcing current generator (in the case of a BJT) or a forcing voltage generator (in the case of an IGBT). Preferably the reset device is operated prior to applying the forcing drive and then when the forcing drive is removed subsequent variations in the collector voltage are monitored and controlled to control the degree of saturation (which includes quasi-saturation). By controlling a base or gate drive to the switching device (transistor).

In preferred embodiments the controller includes a comparator (error amplifier) to compare a signal derived from the sensed voltage with a reference and to provide an output for modulating the switching device drive responsive to a difference between the signal derived from the sensed voltage and the reference. In particular when driving an inductive load the collector current typically changes during the on-period of the switching device and thus the drive to the device also varies during the on-period. Preferably the level of the reference is chosen such that at the end of the on-period the switching device is only just saturated (quasi-saturated) so that the device can then be switched off quickly. The skilled person will appreciate that the signal compared to the reference need not be equal to the voltage on the collector terminal—for example it may be scaled, offset, integrated, peak detected, or otherwise processed. The characteristics of the control loop can be significant because the variation of saturation of the device over time may be complex—for example the collector voltage may decrease even if the collector current increases because in a BJT the ability to support a given collector current can improve over time (because of charge diffusion in the collector region). A suitable value for the reference level depends, in part, on the loop gain and may be selected, for example, by experiment for a particular application or set of applications.

Broadly speaking in embodiments the aim is to substantially minimise the collector voltage whilst limiting the degree of charge storage within the device. It may be thought desirable to operate at the afore-mentioned knee between quasi-saturation and de-saturation but this can cause instabilities because of increased loop gain and it may therefore be preferable to be able to control the operating point to voltages just below this knee. Thus in some preferred embodiments the power converter comprises a cyclical power converter and the controller includes a memory to store a value from one cycle for use in controlling the drive modulation in a subsequent cycle. This memory element may be implemented, for example, by means of an integrator and/or a peak detector. With such an arrangement the controller preferably also includes a switch to inhibit the sensed voltage from modulating the drive when the switching device is off. This may comprise, for example, a switch to isolate the voltage sense signal from the input to the controller when the switching device is off.

In embodiments the controller includes an integrator. This reduces the speed with which the drive to the switching device reacts to changes in the sensed collector voltage, thus helping to avoid major excursions in the drive caused by small changes in the sensed voltage, but nonetheless facilitating accurate control. More generally, remembering a value from a previous switching cycle can ameliorate the problem of insufficient drive at the start of the on-period (when the collector current is low). The aforementioned initial forcing drive can also assist a fast turn on of the switching device, especially if the collector is only lightly loaded. The controller may include a proportional-integral control element to control the drive modulation system responsive to a combination of the level of the voltage sense signal and an integral of the voltage sense signal. This helps the control loop to react more quickly to changes during the on-period whilst retaining the advantages of storing a sense, drive or control value from a previous cycle. However this arrangement can also suffer from instability.

In some particularly preferred embodiments the controller includes a peak detector with an input from the voltage sense signal and an output for controlling the drive modulation in response to a peak value of a signal derived from the sensed collector voltage. In some particularly preferred embodiments the peak detector comprises a leaky peak detector, that is a peak detector whose output value decays in time. It is further preferred that a proportion of its input signal is able to be present at the output. For example in embodiments the output is dependent upon the higher of an output of the peak detector and a level of the sensed or peak detected (input) signal. Such an arrangement is particularly useful where the peak detector provides an output which has a rate of rise dependent upon a level of the input signal, in which case the aforementioned combination facilitates a rapid response of the leaky peak detector.

Embodiments of a peak detector as described above can be conveniently implemented using a series coupled unidirectional follower, resistor, and capacitor. The unidirectional follower may, conceptually, comprise a diode (or rectifier) although in practice on an integrated circuit it may be implemented as a source or emitter follower.

The skilled person will understand that on an IC the resistor will generally be implemented using a MOSFET. As mentioned above, preferably a switch is included to isolate the input of the peak detector from the voltage sensing system during the off-period. The described series-connected arrangement provides an elegant implementation of a controller in which the rate of rise of the peak detector output is dependent upon a difference between the input and output voltages, and which also provides an output which is the higher of the peak detected and present input voltages.

In preferred embodiments the peak detected value is decayed on a cycle-by-cycle basis, by a small quantum each cycle. In this way the rate of reduction tracks the cycle rate rather than being tied to a fixed decay time. Such an arrangement may conveniently be implemented by dumping charge into a leak or decay capacitor connected across the peak detector capacitor each cycle (and to a reference in between). This exponentially decays the voltage on the peak detector capacitor to the reference over time. The selective connection of the leak capacitor to the peak capacitor or reference may be performed by one or more switches operated either at the cycle frequency or at a related or proportional frequency. Preferably the peak detected level is decayed during the off-period so as not to interfere with the peak detected level during the on-period. The reference level may be the same reference level as previously referred to (which sets the degree of saturation of the switching device). Optionally, however, a different, lower reference level may be employed to decay the peak detected level faster for, potentially, a faster turn-off.

In preferred embodiments the base or gate drive is thus selected according to a comparison between the processed sensed collector voltage and a reference level and the peak detected value is arranged to decay to the reference value so that in the absence of load the base or gate drive decays to zero.

The skilled person will appreciate that the comparator or error amplifier may be implemented either before or after the "processing" (for example, peak detection) of the sensed collector voltage. Thus, for example, leaky peak detection may be performed either on the sensed collector voltage or on the error signal (although preferably if the comparator/error amplifier is positioned after the controller an input buffer is provided to avoid loading the sensing element by the peak detector, in particular where the sensing element includes a capacitor).

The skilled person will understand that a peak detection based controller may be employed in a circuit with either cyclic or acyclic operation. Broadly speaking use of a peak detector facilitates applying sufficient drive soon enough in a subsequent cycle that heavy loads are able to be sustained later in the on-period. The arrangement is particularly responsive to the peak value of the load, and thus especially good for an inductive load (where there is a high load towards the end of the on-period, where the greatest degree of control is needed to turn the switching device off quickly). Further the element of proportional control enables the controller to respond quickly to an excursion of the load.

As described above, broadly speaking the drive modulation system modulates a drive to the bipolar switching device which may also be controlled, for example, by another control loop within the power converter for, say, output voltage regulation. The drive modulation system may perform one or more of pulse amplitude, pulse width, pulse frequency, and variable slope modulation. In a case where multiple pulses are applied to the control terminal of the bipolar switching device preferably at least one of the pulses near the end of the on-period is shorter than a period of an initial forced-on pulse. In this way the drive immediately prior to turn off is not overly high (for example in the case of a BJT a relatively small charge packet is delivered), thus assisting a rapid turn-off. The amplitude, width, frequency or slope of a pulse may depend on, more particularly be proportional to, an error signal from the controller.

In embodiments the drive modulation system is configured to deliver a pulse which is shorter than an on-period of the switching cycle, to maintain the device in saturation for substantially the complete duration of the remainder of the on-period of the switching cycle. For example in the case of a BJT such a pulse may comprise a current pulse to deliver a packet of charge which is just sufficient to maintain the switching device in saturation or quasi-saturation to the point of turn-off; the duration of such a pulse may be determined from a previous switching cycle. In the case of an IGBT a similar principle applies, considering the IGBT as a BJT driven by an FET, in which case a voltage pulse to the gate of the IGBT is just sufficient to maintain the switching device in saturation until the end of the on-period (broadly speaking, delivering a pulse of charge to the internal BJT of the IGBT which is sufficient to achieve this). Thus, in embodiments, a single such pulse is delivered to the control terminal of the switching device, after an initial forcing pulse, where present. In embodiments this pulse need not be rectangular and may comprise, for example, a substantially level portion followed by a decaying linear or non-linear slope, the parameters of the pulse (slope and start point of the slope) being variable. This pulse shape can help to sustain a high collector current towards the end of the on-period because a control terminal drive is still present at or near the end of the on-period.

In some preferred embodiments the drive modulation system comprises a transconductance amplifier, more particularly a differential transconductance amplifier with a reference voltage being provided to one input and an output from the controller, for example from a leaky peak detector as described above, being provided to a second input. A switch transistor may be included to apply a forcing current at the start of the on-period; this may be derived from a reference current generator, preferably controllable so that it can be turned off during the drive off-period. A turn-off switch may be included to help to withdraw remaining charge from the base.

Generally the power converter will also include a further controller to control an on-off timing of the bipolar switching device. For example in some applications this further controller may regulate an output of the power converter by primary or secondary side sensing although in other applications, for example some resonant discontinuous forward converter applications, such a further controller may still be included although no regulation function is performed. In embodiments the drive modulation system modulates the on-off timing control of this further controller. In some particularly preferred embodiments both the above-mentioned closed-loop control system and the further controller are integrated within a single integrated circuit.

In a related aspect the invention provides a method of controlling the degree of saturation of a bipolar switching device when said bipolar switching device is switched on, said bipolar switching device having a collector terminal and a control terminal for controlling switching of said device, the method comprising: sensing a voltage on said collector terminal during a period when said switching device is switched on; determining an error signal responsive to a difference between a signal derived from said sensed voltage and a reference; and modulating a drive to said control terminal of said bipolar switching device responsive to said error signal to control said degree of saturation of said bipolar switching device when said device is switched on.

Applications of the method are not limited to a power converter such as a forward or flyback converter, or to a circuit or system with cyclical operation; embodiments of the method may be employed with any type of load. (This is also true of the previously described apparatus according to aspects and embodiments of the invention).

In another aspect the invention provides a switch mode power converter including a bipolar switching device and a voltage sensing system for sensing a voltage on a terminal of said switching device, wherein said voltage sensing system comprises: a capacitor having one plate coupled to a terminal of said device and a second plate coupled to an output of said voltage sensing system; and a reset device having a first connection coupled to said second plate of said capacitor and a second connection coupled to a reference voltage to reset said voltage on said second plate of said capacitor to enable monitoring of subsequent variations of said voltage on said terminal of said switching device.

As previously described, the reset device may comprise, for example, a switch, diode or transistor. In the case of a switch a controller may be employed to control the switch to connect the first and second connections to reset the voltage on the second plate of the capacitor, to reset the voltage sensing system.

In another aspect the invention provides a switch mode power converter including a bipolar switching device and a saturation control system for controlling a degree of saturation of said switching device when said device is switched on, said saturation control system having a control loop including a controller responsive to a peak value of a signal derived from a voltage on a terminal of said bipolar switching device.

In some preferred embodiments the controller is responsive to a combination of the peak value and a value dependent on a present sensed voltage on the terminal (collector) of the bipolar switching device. In embodiments the peak detector may comprise series connected components as described above.

In a still further aspect the invention provides a switch mode power converter including a bipolar switching device and a saturation control system for controlling a degree of saturation of said switching device when said device is switched on, said saturation control system having a control loop including a controller responsive to a sensed voltage on a terminal of said bipolar switching device and including a system to apply a forcing drive to said bipolar switching device to initially force said device into saturation, and wherein said saturation control system is configured to afterwards control a degree of saturation of said switching device.

Employing a forcing drive such as a forcing current can assist in providing a fast turn-on for the switching device, particularly under low load conditions.

In a still further aspect the invention provides a method of controlling the drive to a BJT or IGBT transistor to control the saturation of said transistor, the method comprising determining a quantity of charge in the transistor for a combination of collector current and a time for which said collector current flows, and delivering a pulse of current or voltage to a control terminal said BJT or IGBT transistor such that a total quantity of charge delivered to a base of said BJT or to an internal base of said IGBT in said pulse of base or gate current or voltage is sufficient to maintain said collector current for said time and to sustain said transistor in saturation or quasi-saturation up to or after the end of said base current or gate voltage pulse until the end of said time.

The determining of a quantity of charge may comprise sensing a collector voltage of the transistor, for example in a previous switching cycle in a cyclical system, and then the parameters, for example duration (and/or current and/or voltage), of a drive pulse may be adjusted in response to this such that the transistor is maintained in saturation or quasi-saturation after the end of the control terminal drive pulse (or up to the end of the drive pulse in the case of a pulse with a drive level which decays towards the end of the on-period).

The invention also provides a method of turning off a bipolar junction transistor during cyclic operation, the method comprising measuring a charge storage time of said transistor, said charge storage time comprising a time for a collector current of said transistor to fall to substantially zero, and adjusting a control drive to said transistor to control said charge storage time.

The charge storage time may either be defined as a time for a collector current of the transistor to fall to substantially zero or as a time for a significant rise in sense collector voltage to occur. Thus the measuring of the charge storage time may comprise measuring one or both of a fall in collector current and a rise in collector voltage of the transistor (the latter being preferable under light or no load conditions). The measuring may be performed whilst applying a negative base current to the transistor.

Adjusting the control drive to the transistor enables the transistor to be turned off faster; in embodiments the charge storage time may be controlled to substantially achieve a set or desired duration.

In still other aspects a technique similar to that described in U.S. Pat. No. 5,017,802 may be employed to determine the excess charge pulled out of the base of a transistor needed to transistor off, and then this charge-based sensing may be employed with a controller and/or base drive modulation system as described above.

As previously mentioned the skilled person will understand that although in the main in the later described embodiments analogue control techniques are employed, digital control techniques implemented in a similar manner may also be used, for example by digitally processing digital representations of the analogue signal values mentioned.

According to a still further aspect of the invention there is provided a protection system for a power converter including a bipolar switching device and a switching control system to control switching on of said bipolar switching device for an on-period, the protection system comprising: a voltage sensing system to sense a voltage on a collector terminal of said device; a comparator coupled to said voltage sensing system to compare said sensed voltage to a threshold; and a protection mechanism coupled to said comparator and responsive to said sensed voltage exceeding said threshold to terminate said on-period early.

Since the controller is sensing the change in collector voltage, there is an opportunity to take action if it rises despite applying more turn-on drive.

Thus a further aspect of the invention provides a protection system that compares the sensed collector voltage and compares it to a (preferably fixed) threshold and if the threshold is exceeded during the on-period then a protection mechanism is triggered where the on-period is terminated early.

The intention is to limit dissipation in the switching device and/or limit output power delivered in those circumstances.

Thus further aspects and embodiments of the invention provide a system that senses the collector voltage during the on-period and uses this to modify behaviour of an overall circuit or system such as a power converter.

In embodiments an increase in collector voltage (progressive, or above a threshold) triggers protection behaviour.

In embodiments the protection behaviour may vary depending on the duration over a converter cycle or number of cycles) for which the collector voltage is increase.

In embodiments the protection behaviour may be: increase of drive to the switching device, shortening of the on-period, cessation of converter operation.

In embodiments the protection behaviour persists only for as long as the collector voltage is increased (within a cycle, or is increased for a period within the on-period of successive cycles), or for a period (fixed time, number of converter cycles etc.), or until reset by some other signal (e.g. restart or user intervention).

BRIEF DESCRIPTION OF THE DRAWINGS

These and other aspects of the invention will now be further described, by way of example only, with reference to the accompanying figures in which:

FIG. 1a shows a typical high voltage NPN transistor and FIG. 1b shows a characteristic curve of the high voltage NPN transistor of FIG. 1a;

FIG. 28 shows a timing diagram illustrating a negative magnetizing current at turn-on;

DETAILED DESCRIPTION OF PREFERRED EMBODIMENTS

Figure 1A:
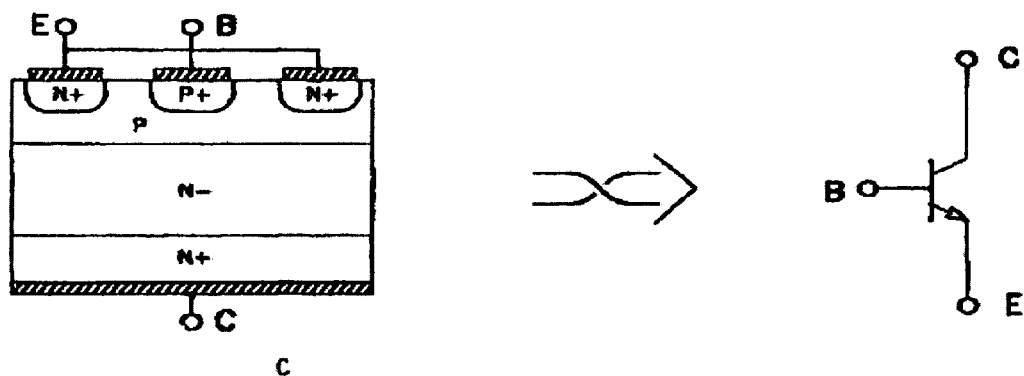
Figure 1B:
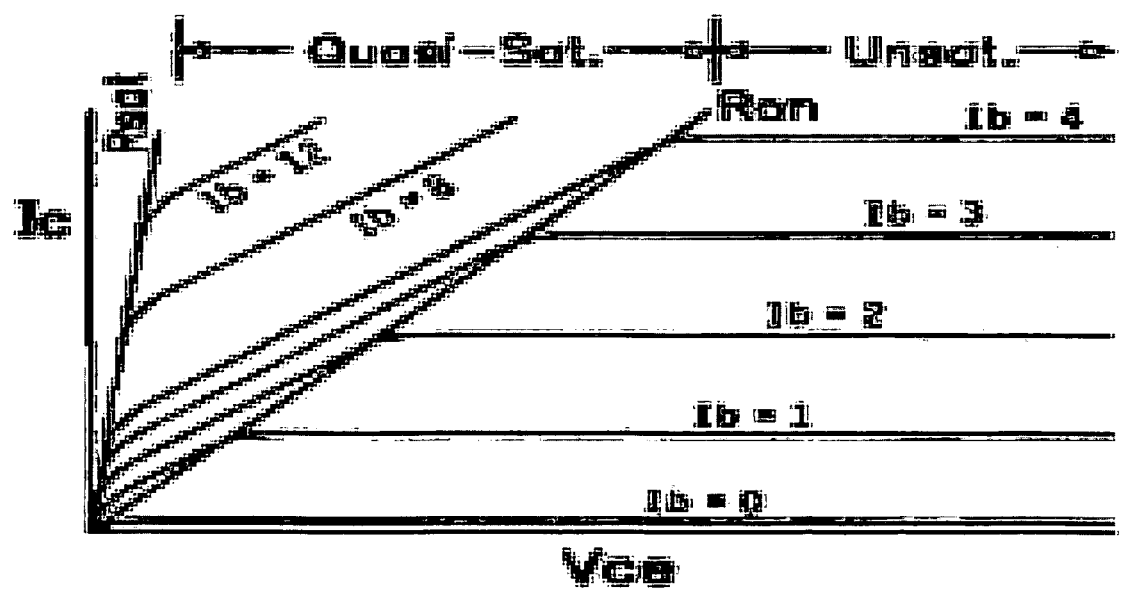

Broadly speaking we will describe an apparatus and related method for controlling the level of base current to minimise the total losses in the primary switching transistor. In embodiments we control the base drive current to avoid excess stored charge at a desired instant of turn-off, in order to minimise turn-off time. This is done by measuring the collector voltage. Although preferred applications of the techniques we describe are in the field of power converters, the techniques may be used more generally where bipolar transistors are employed for cyclic switching, in particular where it is desired to achieve both a low on-state voltage (collector to emitter) and a fast turn-off. However such a combination is particularly desirable in power converters, to minimise power losses and to optimise control, for example to limit output current in overload conditions. Use of a bipolar switching resistor in a power converter can provide a significant cost saving as compared with, say, a power MOSFET, but with a bipolar transistor there is a need to manage carefully the on-state conditions.

When using bipolar transistors in switching applications, an important parameter is the quantity of charge in the transistor immediately prior to the intended instant of turn-off. Excess charge should be cleared from the device before turn-off is completed and if there is a large amount of excess charge this can take a long time and cause additional stresses in the device and in the system. However, if the base current is reduced during the on-period, the on-state voltage increases, causing unwanted power dissipation in the transistor. Insulated-gate bipolar transistors (IGBT) are a variety of bipolar transistor which may be used for power switching applications and also exhibit charge storage. The techniques we describe are applicable to these as well as NPN and PNP junction bipolar transistors. IGBTs may be controlled using a voltage applied to their gate terminal, as opposed to a current applied to the base terminal of a junction bipolar transistor. The following description refers to the use of a junction bipolar transistor, but the same techniques are applicable to IGBTs; for base drive read gate drive and so forth.

A particular difficulty arises in switching when there is a range of current that has to be sustained by the transistor in the on-state (collector current). At high levels of on-state current it is desirable to provide sufficient base current to keep the on-state voltage low enough—particularly when the current gain of the transistor may be low. If this level of base current is maintained when the on-state current is low, there will be a large amount of excess charge in the transistor which will degrade the turn-off behaviour.

A solution to this problem is to vary the on-state base current in response to the on-state current and/or transistor gain so that the delivered base current is sufficient to support the on-state conditions at low on-state voltage but is not excessive. FIG. 2 shows an outline block diagram of a control system with the ability to turn off the bipolar switch quickly at the required time. Charge storage in the transistor makes this difficult. If there is excessive charge in the base, then turn-off time can be very long (many microseconds), especially at low collector currents. To provide fast turn off we therefore aim to:

Minimise the excess charge in the transistor i.e. during the on-period apply base current sufficient only to just hold the collector voltage low enough.

At turn-off, withdraw maximum current out of the base.

If the base drive is varied only according to the on-state collector current, sufficient current should be provided to give satisfactory operation (low on-state voltage) when the transistor has low gain. Variation of gain may result from manufacturing tolerance and/or temperature variation. In practice this is typically a wide range so there is likelihood that there will be significant excess charge at turn-off. Since it is difficult to determine the gain of a transistor in such a circuit, a preferable method of controlling the base current is in response to the on-state voltage across the transistor (e.g. collector to emitter). If the transistor is provided with a high level of base current then the voltage will be low, conversely, low base current will give a higher on-state voltage. A more detailed description is given later.

We will describe some preferred embodiments of the invention with particular reference to a common-emitter configuration but the skilled person will understand that corresponding principles can also be applied to common-base operation, by configuring the circuits with base bias, emitter switching and base current (or gate voltage) control.

Figure 2A:
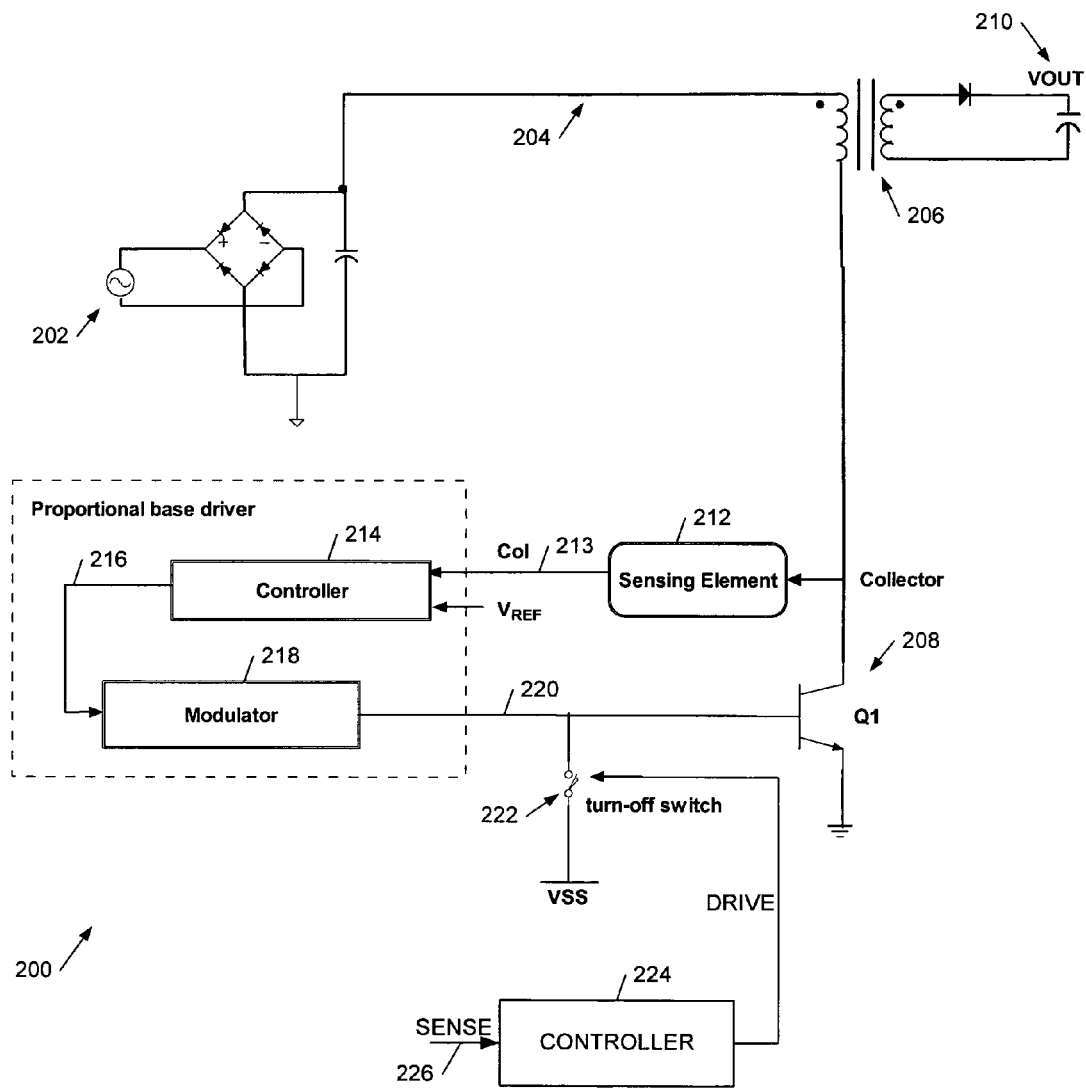
FIGS. 2a and 2b show, respectively, a circuit for a power converter and an example of a discontinuous resonant forward converter.

Referring to FIG. 2a, this shows a circuit for a power converter 200 according to an embodiment of the invention, the power converter having (in this instance) an AC input from a grid mains supply 202 which is rectified and smoothed to provide DC power on line 204 to the primary winding of a transformer 206, switched by bipolar transistor 208, Q1. The secondary winding of transformer 206 is rectified and smoothed to provide a DC voltage output 210.

A sensing element 212 senses the collector voltage of transistor 208 (Q1) and provides a sensed voltage signal output (Col) on line 213 to a controller 214 which has, as a second input, a reference level, as illustrated a reference voltage $V_{REF}$. The signal on the Col line has a value which is dependent on the sensed collector voltage and, in embodiments in which the system is implemented on an integrated circuit, may be brought out on a pin of the IC. The controller has an output 216 to a modulator 218 which provides a base drive signal 220 to the base (or gate) of transistor 208 modulated by switch 222, which may for example be implemented using a MOSFET. Switch 222 is controlled by a DRIVE signal from controller 224 which, in the illustrated example, has a sense input 226 also from the collector of transistor 208 but which, in other arrangements, may have a different sensing arrangement, for example sensing DC output 210.

As shown in FIG. 2a the base current is controlled by monitoring the voltage at the collector of the BJT (bipolar junction transistor) during the on-time of the primary switch (BJT). The aim of the Proportional Base Driver (PBD) is to control the amount of base current so that the voltage at the collector pin is set equal to the threshold voltage ($V_{REF}$) just before turn-off. It is possible to set the collector "set point" above or below the quasi-saturation limit (see later). If the transistor collector voltage is controlled to be within quasi-saturation then the on-state power dissipation is low but the charge storage can be significant. Conversely, if set above quasi-saturation, storage is low and turn-off is quick. Depending on the application, the threshold may be set to balance the acceptable on-state voltage against the excess stored charge, and, hence, turn-off characteristics.

In power converter applications the range within which it is desirable to maintain the base (or gate) drive depends on the transistor characteristics but is typically 0.3 to 2V for low voltage transistors (<100V) and increases with transistor voltage and capability to perhaps 8V in high voltage applications.

Since the proportional base driver (PBD) system comprises a feedback loop it can suffer from instability. There are several source of gain and phase shift that can contribute to this: transistor gain and ft; transistor base-collector capacitance; transistor collector load impedance; controller input impedance; and controller circuit's gain and phase. Nominally the transistor is in an inverting configuration; however substantial phase shifts can occur at relatively low frequencies. Hence care is preferably taken in the design of this feedback loop (and some particularly preferred arrangements are described later).

Figure 2B:
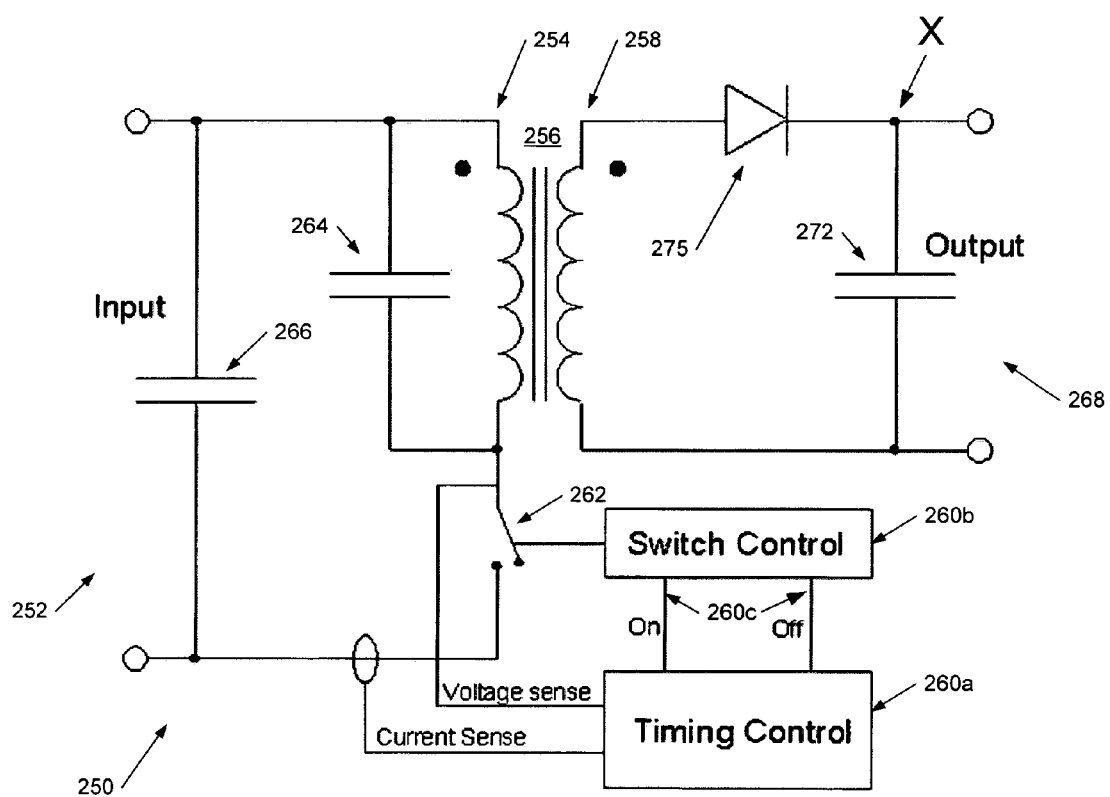

Referring now to FIG. 2b, this shows an example of a discontinuous resonant forward converter 250 in the context of which embodiments of the techniques we describe may be employed.

Referring to FIG. 2b, the converter 250 has a dc input 252 coupled to the primary winding 254 of a transformer 256, connected in series with a power switch 262. A resonant capacitor 264 is connected across the primary winding of the transformer and the dc input 252 is provided with a smoothing capacitor 266. On the output side of the forward converter a secondary winding 258 of the transformer provides power to a pair of dc output terminals 268 via a rectifier 275. A smoothing capacitor 272 is connected across the dc output terminals 268 and an output node at the junction of rectifier 275, smoothing capacitor 272 and a connection to one of the dc output terminals 268 is denoted "X". The current into node X, which flows to either or both of the smoothing capacitor 272 and output 268, is discontinuous.

In general the switch 262 may comprise a bipolar or MOS transistor such as a MOSFET, or IGBT, or some other device. However in the context of FIG. 2a the switch is implemented using bipolar transistor 208 (Q1) in conjunction with turn-off switch 222 (which is preferably a MOS transistor, but may be a bipolar transistor).

The rectifier 275 may be implemented as a diode or by means of a MOS transistor. The resonant capacitor 264 may either comprise a discrete component, or may be entirely provided by parasitic capacitance, or may comprise a combination of the two.

The switch 262 is controlled by a controller 260 comprising a timing control module 260a and a switch control module 260b, the timing control module providing switch on and switch off signals 260c to the switch control module 260b. The timing control module may have one or more sense inputs, such as a voltage sense input and a current sense input as illustrated, or such sensing may be omitted and the timing control module 260a may operate substantially independently of any sensed condition of the forward converter circuit.

Where voltage sensing is employed the voltage on the primary winding of the transformer may be sensed, either directly or indirectly; for example, a sensing voltage may be derived from an auxiliary winding of the transformer (not shown). Where current sensing is employed this may be conveniently implemented by sensing the voltage across a current sense resistor.

In operation the circuit of FIG. 2b converts the input dc voltage, typically relatively high, to an output dc voltage, typically in a range suitable for consumer electronic devices, for example between around 5V and 25V. In some preferred implementations, the dc output is isolated from the dc input as shown; in other implementations secondary side feedback may be employed, in which case an opto-isolator may be included to provide isolation between the primary and secondary sides of the forward converter.

In operation, after an energy transfer cycle the transformer is reset (so that it is not magnetised or magnetisation is reversed), during the reset phase current flowing in the transformer primary winding in an opposite direction to that in which it flows when switch 262, generally a power transistor, is turned on. The resonant action of the inductance of the transformer primary and capacitor 264 is employed to perform this reset—once switch 262 is turned off there is a half cycle sine wave on the bottom plate of capacitor 264 (waveform 304). The voltage on this bottom plate is driven above the power supply voltage by the action of the inductor so that at the top of the sine wave the voltage across the transformer primary is in the opposite direction to that during forward energy transfer. (At this point there is a relatively high voltage across switch 262, significantly higher than the input voltage, and the switch should therefore be able to sustain such a voltage without breakdown). As the capacitor discharges and the voltage across the switch 262 falls back to 0 the current flowing in the transformer primary is in the opposite direction to the direction of current flow during a forward energy transfer portion of the power supply cycle and thus the transformer is reset. If the switch is not switched on at this time the resonance continues with a gradually diminishing series of resonant peaks. Preferably the switch 262 is turned on when the voltage across the switch is substantially at a minimum, that is close to 0V.

More details of suitable controllers are described in the applicant's co-pending applications U.S. Ser. No. 11/449,486, U.S. Ser. No. 11/639,827, GB0706132.8, GB0706249.0, GB0706246.6 and GB0706256.5 and U.S. Ser. No. 11/732,140, U.S. Ser. No. 11/732,108 and U.S. Ser. No. 11/732,107, all hereby incorporated by reference in their entirety.

Referring again to FIG. 2a, the sensing element measures the collector voltage. The sensing element may be (without limitation):
1. A diode (e.g. as used in a baker clamp)
2. A coupling capacitor and/or divider
3. A resistor and diode clamp The controller can be implemented as (without limitation):
1. Proportional controller (High bandwidth base driver circuit)
2. Integral controller (Low bandwidth base driver circuit with cycle to cycle memory)
3. Proportional integral controller
4. Leaky peak detector base driver circuit (preferred embodiment)

Methods for modulating the base current include (without limitation):
1. Pulse Amplitude Modulation (PAM)
2. Pulse Width Modulation (PWM)
3. Variable Slope Modulation (VSM)
4. Pulse Frequency Modulation (PFM)
5. Combinations of the above.

Modified Baker Clamp-Based Sensor

Figure 3A:
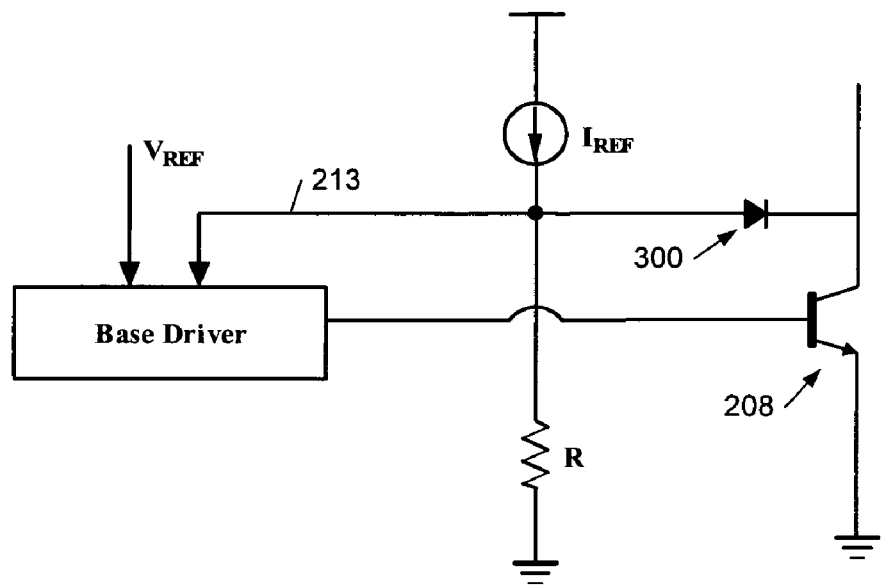
FIGS. 3a and 3b show, respectively, a diode used as a sensing element and a resistive divider sensing element.

FIG. 3a shows a diode used as a sensing element. The diode 300 will turn on when the collector voltage falls below a preset voltage ($I_{REF}*R>V_{REF}$). The base driver controls the base current to keep the collector voltage close to $V_{REF}$.

In operation, when transistor 208 is on the voltage on line 213 follows the collector voltage but when the transistor is off the sensed voltage signal is limited to $I_{REF}R$. However if the collector voltage is falling fast capacitive coupling through the diode can pull the voltage on line 213 down.

However this arrangement uses an expensive high voltage diode with a low reverse recovery time. Also the parasitic capacitance of the diode affects the operation at low duty cycles.

Resistor and Diode-Based Sensor

Figure 3B:
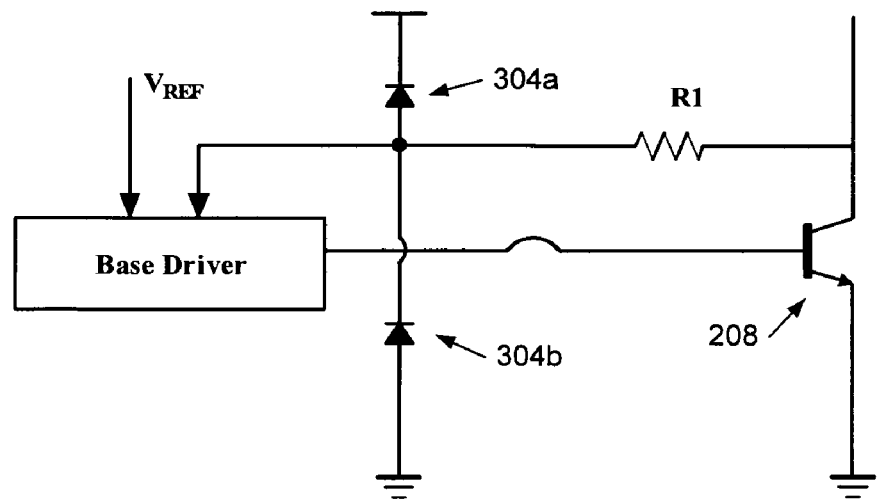

FIG. 3b shows a resistive divider sensing element. The resistive sensing element comprises a resistor R1 and clamping diodes 304a, b. However a high value of R1 could result in a high RC time constant; the delay introduced could detrimentally affect the operation of control loop. A low value of R1 could result in large power dissipation across it lowering the efficiency of the controller.

Coupling Capacitor and/or Divider-Based Sensor

Figure 4:
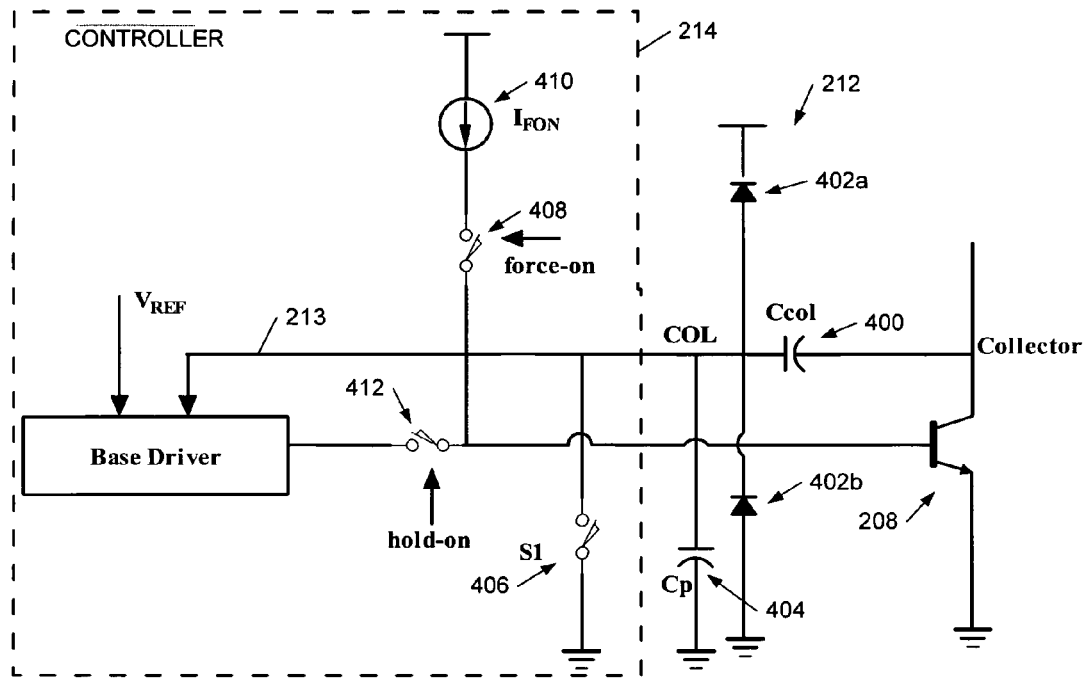
FIG. 4 shows a preferred capacitive divider based sensing element.

FIG. 4 shows a preferred capacitive divider based sensing element. Initially during the drive period the voltage at either side of the capacitor (Ccol) is reset to a known value. Subsequently the voltage at the feedback pin (COL) will follow the collector voltage.

In the sensing circuit of FIG. 4, capacitor 400 (Ccol) is used to sense the voltage on the collector of transistor 208 to provide a voltage sense signal on line 213 which is preferably limited to between the supply rails by diodes 402a, b. A capacitor 404 (Cp) coupled to line 213 (and to ground) provides a capacitive divider which can dump some current to ground (when, for example, a high current flows through capacitor 400 in a resonant converter), which can provide scaling, and which can reduce the effects of stray capacitance. Capacitor 404 is optional and may comprise parasitic capacitance.

Switch 406 (S1) can be used to briefly connect the plate of capacitor 400 coupled to voltage sense line 213 to ground (or a voltage source) to reset the voltage on capacitor 400; when switch 406 is open voltage variations on line 213 then follow the collector voltage. Optional switch 408 can be used to apply an initial relatively high base drive (current or voltage) to transistor 208 to turn the transistor on (preferably irrespective of the collector load) and to place the transistor in saturation or quasi-saturation; subsequent variations in the collector voltage of the transistor can then be measured and used to control the base drive to control the degree of saturation of the transistor. Current source 410 provides an initial force-on current ($I_{FON}$). Preferably switch 406 is closed before the forcing current is applied to provide a current path to ground. A hold-on switch 412 allows a base drive (current or voltage) to be selectively applied to the base or gate of transistor 208, for example by a drive signal. In embodiments a switch (not shown in FIG. 4) may also be provided to isolate the controller from the sensing element 212 when the transistor is off; this is used when the controller 214 includes a memory element which would otherwise be affected when the transistor is off, for example a peak detector or integrator (described further later).

Figure 5:
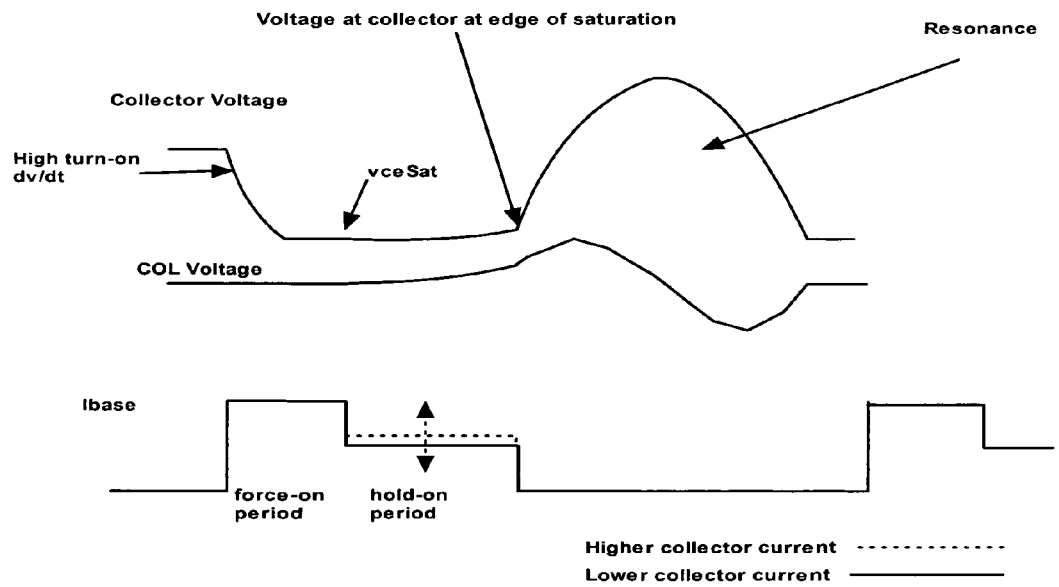
FIG. 5 shows waveforms for low/high on state currents for the circuit of FIG. 4.

FIG. 5 shows waveforms for low/high on state currents for the circuit of FIG. 4. At the start of each drive period a high base current ($I_{FON}$) is applied to the BJT during the force-on period. During this time the COL pin is clamped to ground using a switch (S1). By the end of the force-on period the collector has fallen to a low voltage (~0V) and hence both sides of the capacitors are reset to a low voltage. At the end of the force-on period the switch S1 is opened and the COL pin is floating allowing it to follow the changes in collector voltage.

Subsequently, hold-on current is servo controlled to stabilise the collector at a higher voltage, set by the $C_{col}/C_{pot}$ ratio and $V_{REF}$. In this condition, base current is provided that is sufficient only just to hold the transistor collector at this voltage. $C_p$ is preferably included to allow adjustment of the preset collector voltage according to the requirements of particular transistors or applications.

Some particular advantages of this method include: low power loss, fast response to collector voltage changes; and the capacitor may also be used for resonance in resonant converter topologies.

Collector voltage is measured relative to the initial ("saturation") voltage present at the beginning of the on-period. Where the load is inductive (typical of power converters), it is possible to achieve saturation of the switch for a short period before switch current builds inductively, hence this gives an accurate measure of the achievable on-state voltage. Subsequently, the PBD responds according to the increase of the collector voltage. So, if the initial saturation voltage is higher for a particular transistor, this is taken into account when judging subsequently the degree of saturation. This is helpful when the initial saturation voltage may change as a result of transistor variation (type or individual device), temperature and the like. If the PBD did not take account of this initial saturation voltage, there is a risk that excess base drive may applied if the initial voltage was lower in some conditions. When there is a resistive component to the switch load current, the initial saturation voltage will be higher (see below). Controlling base drive from this reference can also be advantageous in a similar way.

Controllers

We now describe various types of controllers that can be used along with their merits and disadvantages. If a controller includes a "history" or memory element, as is the case for example with a peak detector or integrator, then their inputs should be disabled during the off period; optionally they may be enabled for only a part of the on-period.

Proportional Controller (High Bandwidth Base Drive Circuit)

Figure 6:
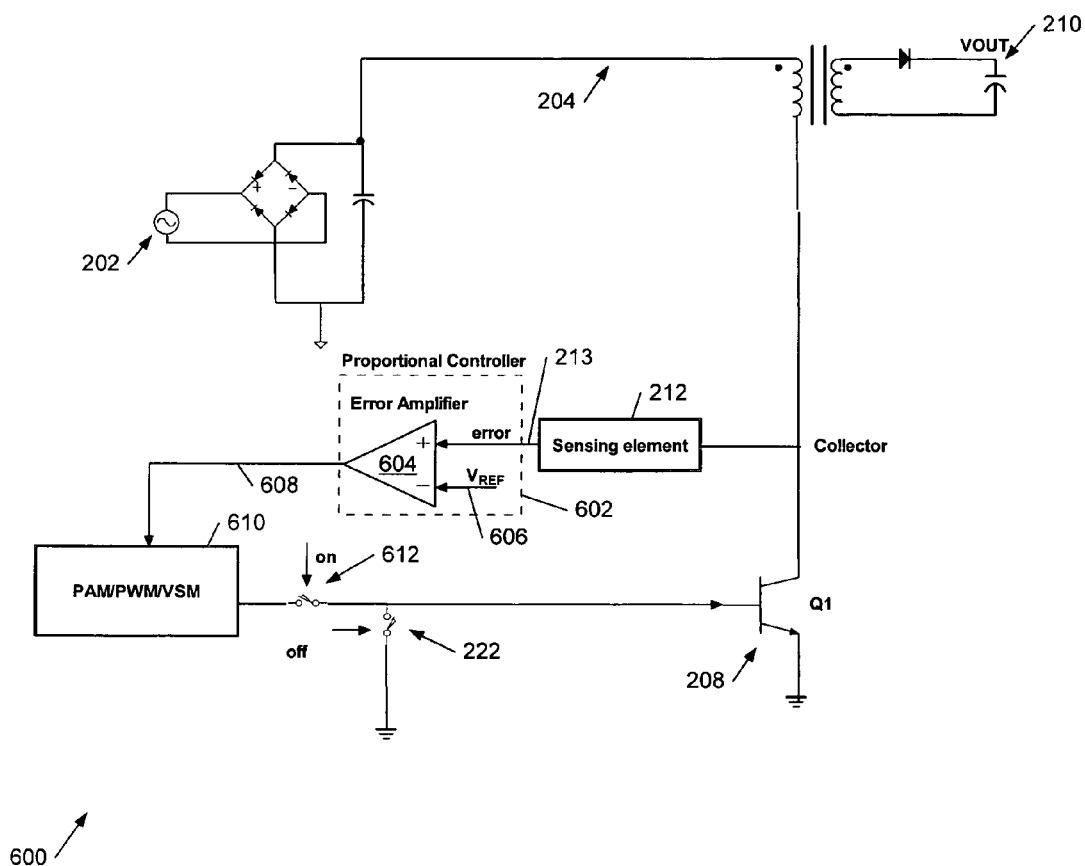
FIG. 6 shows a high bandwidth base drive circuit.

FIG. 6 shows a high bandwidth based drive circuit 600 including a proportional controller 602 comprising an error amplifier 604 responsive to a difference between a sensed voltage signal on line 213 and a reference (voltage) 606 to provide a control output 608 for controlling a base (current or voltage) drive system 610. The base drive system 610 may comprise, for example, a pulse amplitude modulation (PAM), pulse width modulation (PWM) or variable shape modulation (VSM) system. In the illustrated embodiment a first switch 612 is provided to switch on a drive to the base or gate of transistor 208 and a second switch 222 is provided to switch off or discharge the drive on the base or gate of transistor 208.

The circuit of FIG. 6 is responsive to the absolute collector voltage or to changes in the voltage since the transistor was first saturated or quasi-saturated; the circuit is relatively straightforward and responds quickly to changes in load current but can be difficult to make stable, in particular because of time delays in the transistor, sensing and control loop (and reducing the loop gain may be undesirable).

Figure 7:
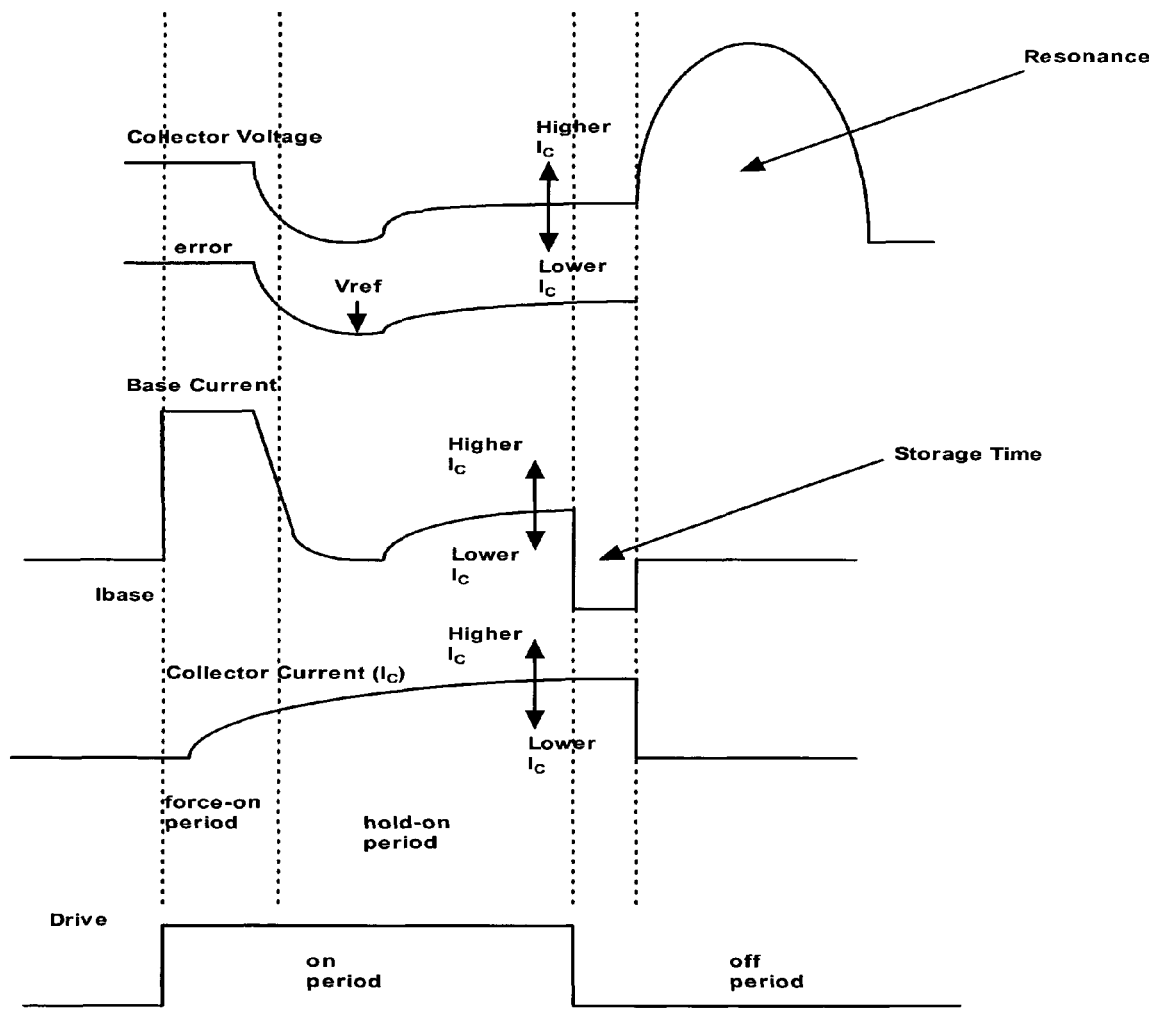
FIG. 7 shows a set of waveforms for the circuit of FIG. 6.

Referring now to FIG. 7, this shows a set of waveforms for the circuit of FIG. 6 for high/low on state current, in particular for a resonant converter.

The operating sequence of the circuit (see FIG. 6) is:
 1. Open discharge switch (222)
 2. Close the drive switch (612)
 3. Open drive switch (612
 4. Close discharge switch (222)

When the drive switch (612) is closed the collector falls to a low voltage. During the drive period the collector voltage is maintained close to $V_{REF}$ value by the error amplifier. It is difficult to assure stability of this feedback loop; even with a low gain.

For turn-off, it is desirable not only to remove the base current but also to withdraw maximum base current, via the turn-off switch.

Advantages of the circuit of FIG. 6 include: an optimum base drive within the on-period, and an optimum base drive on cycle-by-cycle basis. Disadvantages include: that it is difficult to make stable (against oscillation), or has low gain, which equates to excessive collector voltage at high load. It is difficult to make fast enough to provide sufficient base drive is applied early enough in high-load conditions. When high on-state current establishes quickly it is important to apply base current as soon as possible. Because of delays in the switching transistor it may be desirable to apply significant base current before the collector voltage rises significantly; otherwise the voltage may rise too far before the additional base current manifests as increased collector current.

Integral Controller (Low Bandwidth Base Drive Circuit with Cycle by Cycle Memory)

Figure 8:
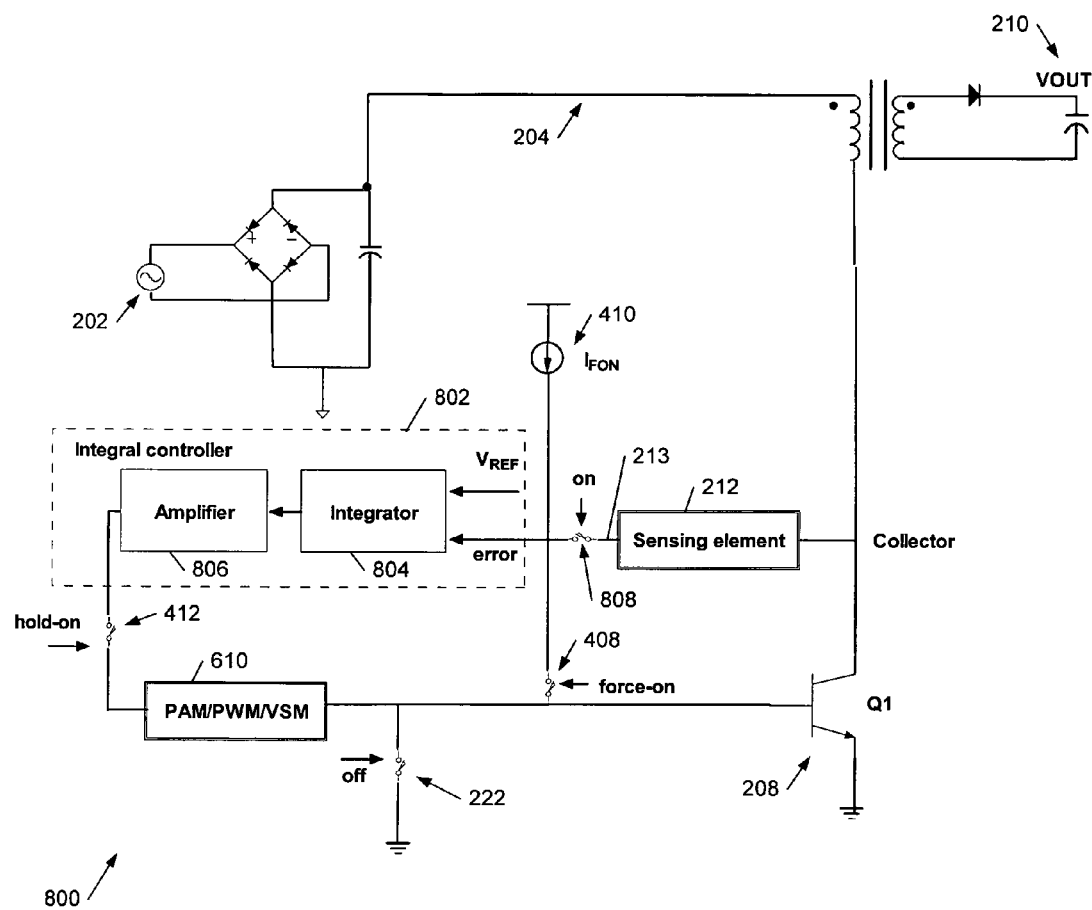
FIG. 8 shows an embodiment of a low bandwidth base drive circuit.

FIG. 8 shows an embodiment of a low bandwidth base drive circuit 800 with cycle-to-cycle memory. The circuit is similar to that of FIG. 6 but uses an integral controller 802 to integrate a difference between a voltage sense signal on line 213 and a (voltage) reference in integrator 804 to provide an integrated error signal which is amplified by (optional) error amplifier 806 before being provided to the base drive system 610. A switch 808 is provided to isolate integrator 804 from the sensed voltage when the transistor is off. Broadly the integrator 804 avoids major excursions in the base drive caused by small changes in the sensed voltage, thus facilitating more accurate control at the expense of speed. However by holding a value from a previous switching cycle (substantially isolated from changes in the collector voltage when the transistor is off) the effects of a slow start for the base drive and hence collector current, which is particularly important for inductive loads, can be mitigated.

Figure 9:
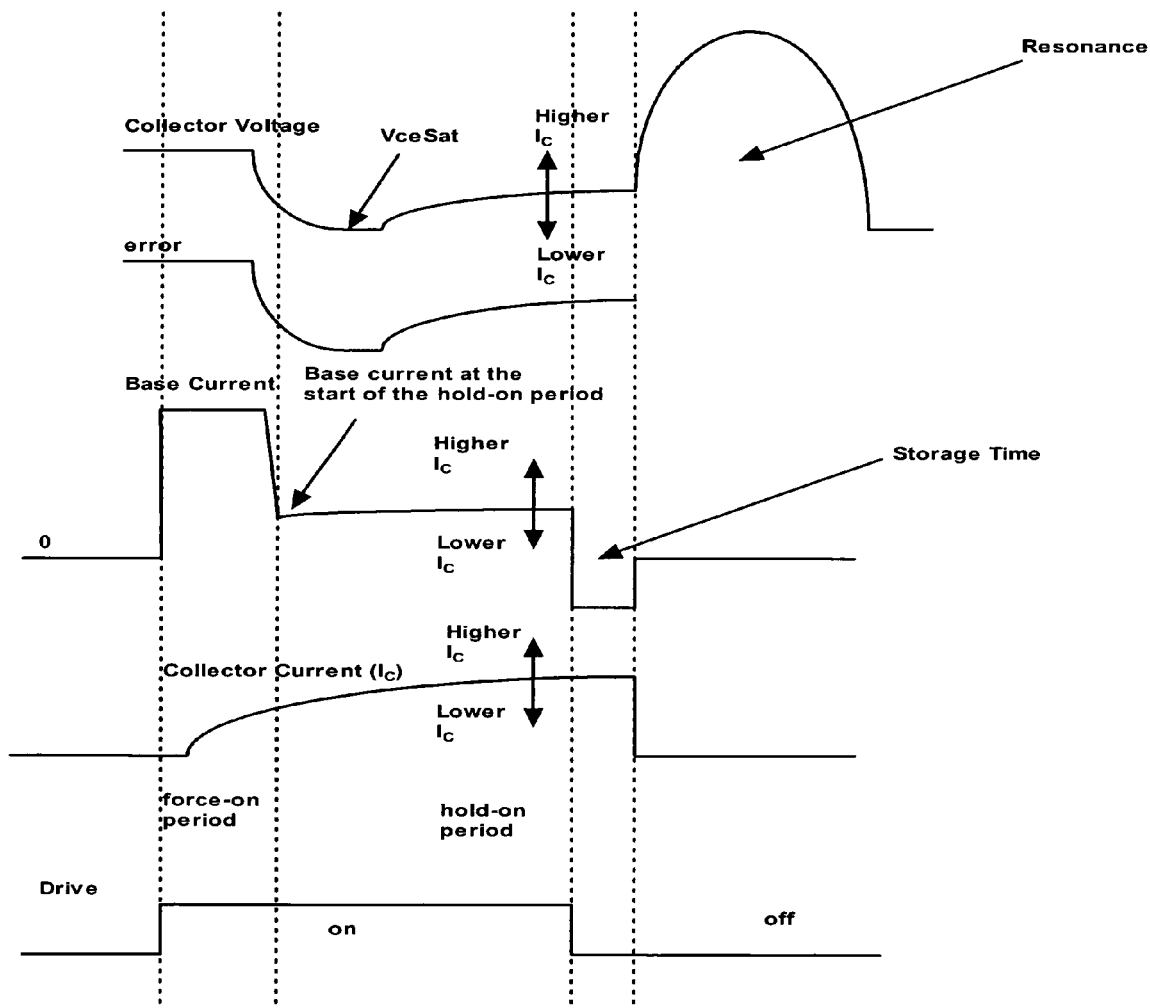
FIG. 9 shows waveforms illustrating the operation of the circuit of FIG. 8.

FIG. 9 shows waveforms illustrating the operation of the circuit of FIG. 8 for high/low on state current. The operating sequence is:
1. Open discharge switch
2. Apply $I_{FON}$ (force-on) current (optional)
3. Turn off $I_{FON}$
4. Close the hold-on switch
5. Open hold-on switch
6. Close discharge switch When $I_{FON}$ (410) current is applied the collector falls to a low voltage. It will be understood that the force-on current is not essential but in embodiments it is preferable, to turn the transistor on quickly. Cycle to cycle memory is provided by the integrator and it determines the amount of base drive during the drive period. During the hold-on period the collector voltage is maintained close to $V_{REF}$ value. The integrator has a response that is slow relative to the speed of the switching transistor so the base-drive current may not track fast load and/or supply variations sufficiently well. For turn-off, it is still desirable not only to remove the base current but also to withdraw maximum base current, via the discharge switch.

Advantages are that it is easy to make the circuit stable against oscillation, and that it provides hold-on base drive immediately after force-on, so that high loads can be supported well. However disadvantages are: a slow response to supply or load variations (causing increased power dissipation, or impaired control of timing of power switching). A slow response to change in load during on-state, so may allow excessive on-state voltage if the load current varies during the on-period.

Proportional Integral Controller

Figure 10:
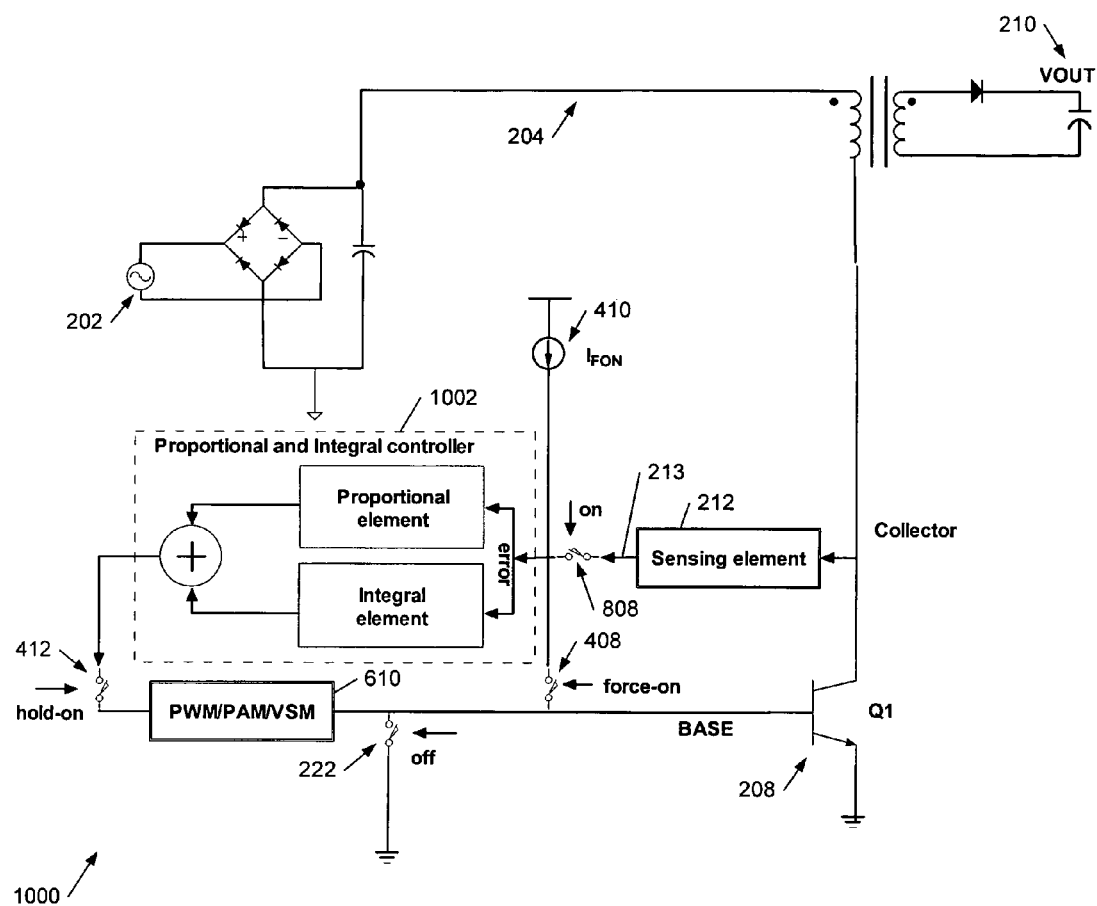
FIG. 10 shows a further example of a low bandwidth base driver circuit.
Figure 11:
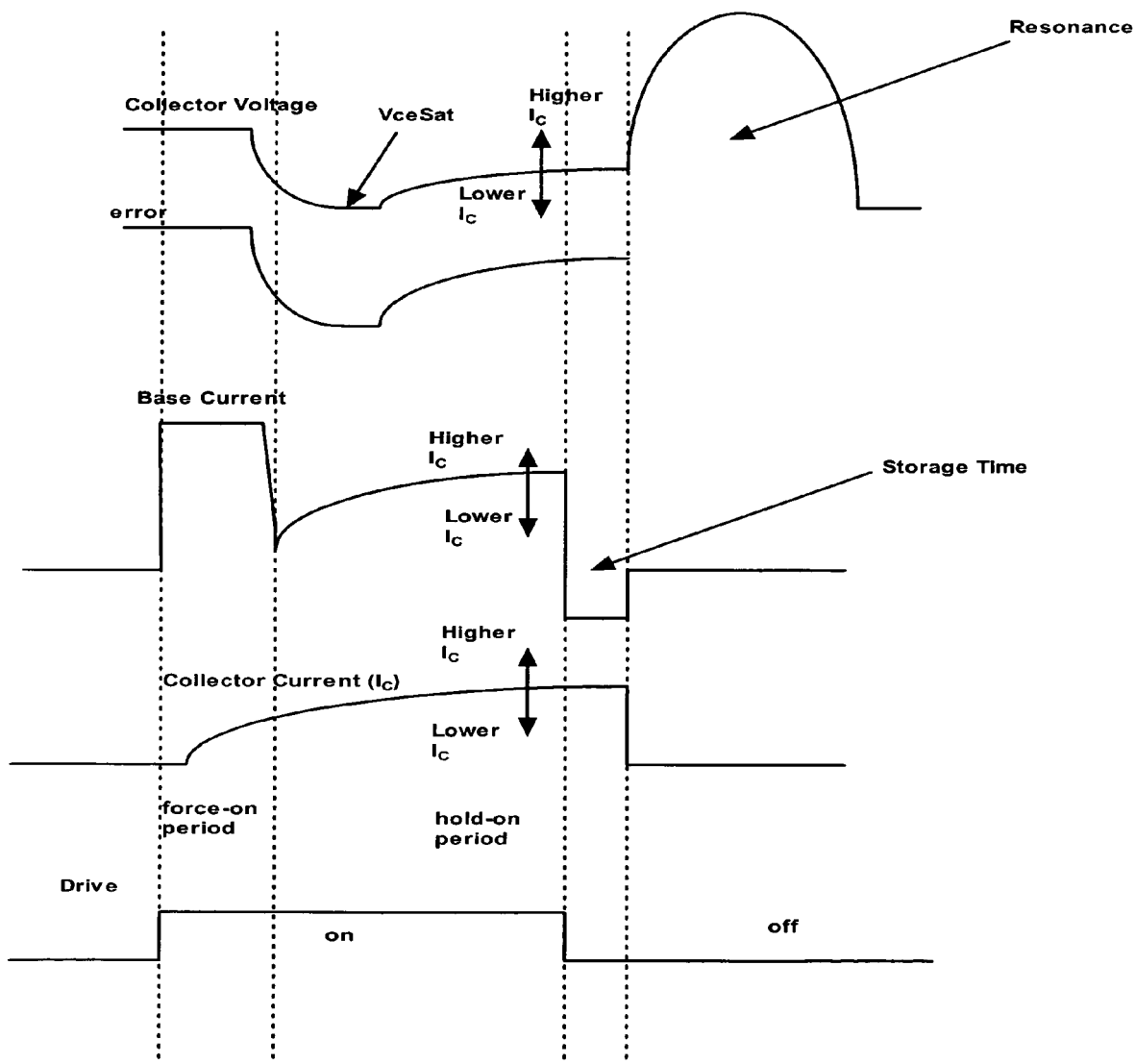
FIG. 11 shows waveforms for high/low on state current for the circuit.

FIG. 10 shows a further example of a low bandwidth base driver circuit 1000 with cycle-to-cycle memory, in this example using a proportional and integral controller 1002. This can respond quickly to changes when transistor 208 is on and also has the advantage of being able to store a base or gate drive from a previous cycle. FIG. 11 shows waveforms for high/low on state current for the circuit.

The operating sequence is:
1. Open discharge switch
2. Apply $I_{FON}$ (force-on) current (optional)
3. Turn off $I_{FON}$
4. Close the hold-on switch
5. Open hold-on switch
6. Close discharge switch When force-on (408) current is applied the collector falls to a low voltage. The skilled person will understand that the force-on current is not essential but in embodiments it is preferable, to turn the transistor on quickly. Cycle to cycle memory is provided by the integrator and it determines the amount of base drive during the drive period. During the drive period the collector voltage is maintained close to $V_{REF}$ value. Addition of the proportional element improves the response to changes in load or supply, both within an on-period and over a sequence of on-periods. For turn-off, it is still desirable not only to remove the base current but also to withdraw maximum base current, via the discharge switch.

Advantages are an improved response to load or supply changes; the circuit also provides a hold-on base drive immediately after force-on, so that high loads can be supported well. Disadvantages are that it can be difficult to ensure stability against oscillation.

Leaky Peak Detector Base Driver Circuit

Figure 12:
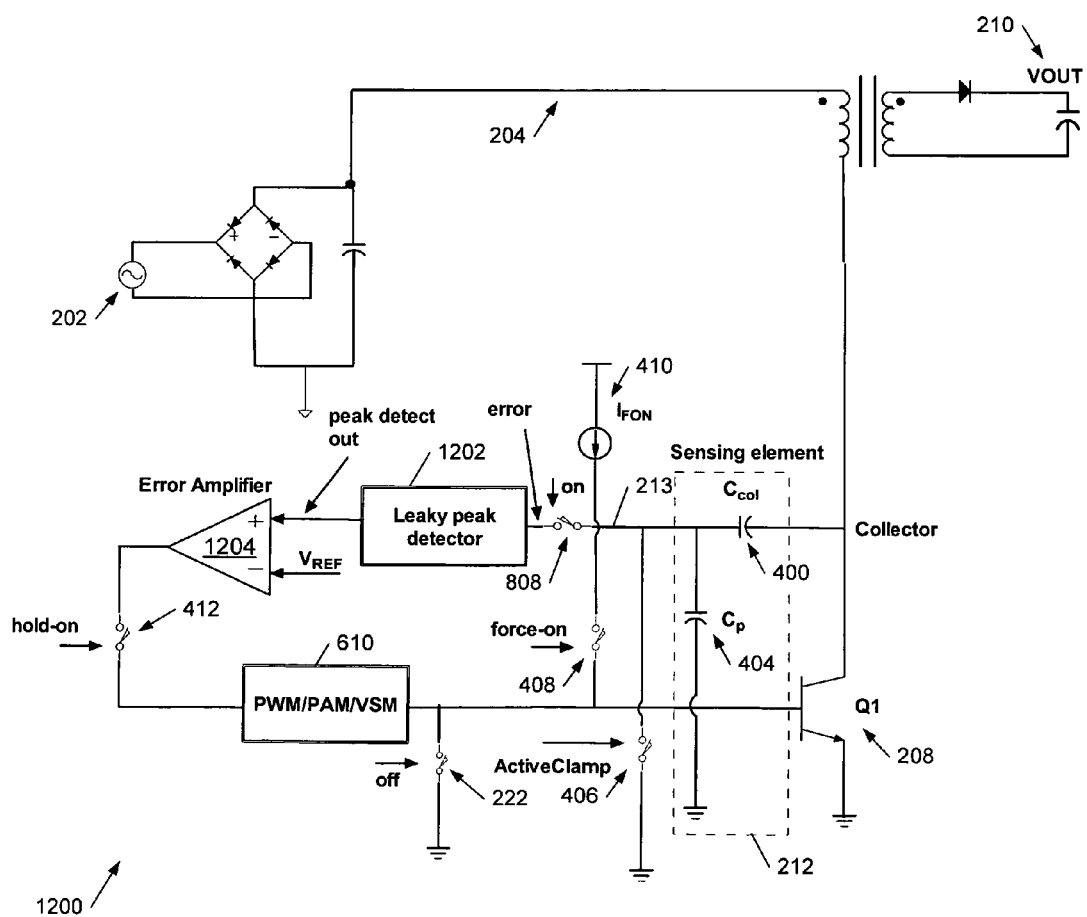
FIG. 12 shows an embodiment of a leaky peak detector base drive circuit.

FIG. 12 shows an embodiment of a leaky peak detector base drive circuit 1200 incorporating the preferred capacitive sensing embodiment of FIG. 4 as the sensing element 212. The circuit includes a leaky peak detector 1202 followed by an error amplifier 1204 (which may have a gain of less than or greater than unity) responsive to a difference between a peak detect output from leaky peak detector 1202 and a reference; this represents a preferred embodiment of controller 214 of FIG. 2 (the skilled person will understand that error amplifier 1204 may be positioned either before or after leaky peak detector 1202). The active clamp switch 406 provides the function of switch S1 in FIG. 4 and may comprise a MOSFET.

Details of an embodiment of leaky peak detector 1202 are given later but, broadly speaking, this system allows a component of the input signal to pass through but also functions as a peak detector. Either or both of these components may be employed to control the base or gate drive to transistor 208; the peak detector is leaky so that over time a detected peak value decays away. Broadly the peak detect function maintains a level of base drive so that in a subsequent cycle this base drive is applied soon enough in the on period to sustain heavy loads later. The circuit is particularly responsive to the peak load value, and thus particularly suitable for inductive loads (which tend to present a high load towards the end of the on period, which is where the greatest control is desirable for a rapid switch off of transistor 208. Preferably an element of proportional control is also employed to facilitate a rapid response to excursions in the load. Although we will describe embodiments of the arrangement with reference to cyclic operation, this drive configuration may also be employed in circuit with an acyclic operation.

Figure 13:
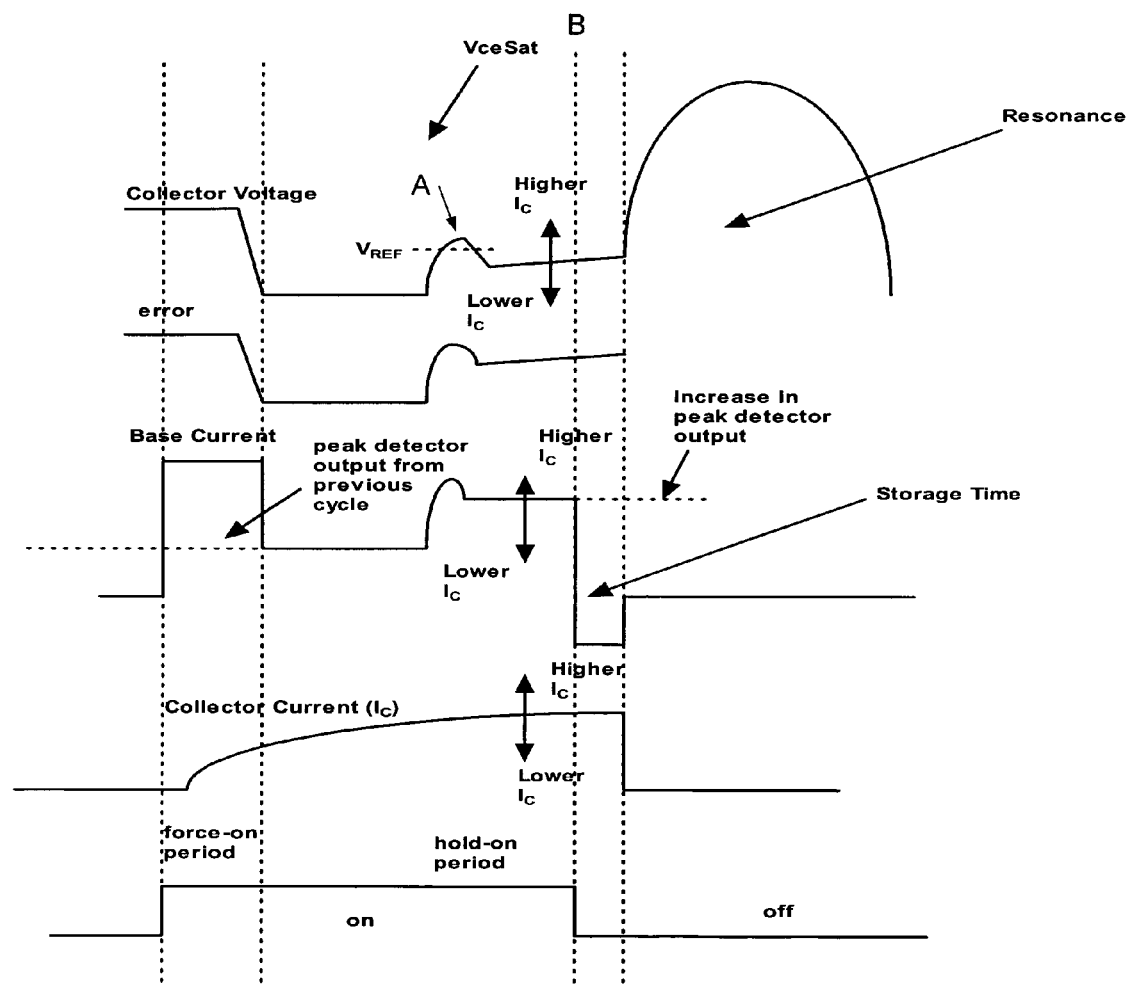
FIG. 13 shows waveforms illustrating the operation of the circuit of FIG. 12.

FIG. 13 shows waveforms illustrating the operation of the circuit of FIG. 12 for high/low on state current. The operating sequence is:

1. Close ActiveClamp switch
2. Open discharge switch
3. Apply $I_{FON}$ (force-on) current
4. turn-off ActiveClamp switch
5. Turn off $I_{FON}$
6. Close hold-on switch
7. Open hold-on switch
8. Turn on ActiveClamp switch
9. Close discharge switch Note that the operation of the circuit of FIG. 12 has been described using the preferred "coupling capacitor" sensing method, but could equally be accomplished using other sensing methods.

Continuing to refer to FIG. 13, this shows an example (at point A) of a load excursion which results in the collector voltage increasing as the transistor 208 comes out of a quasi-saturated state. As this happens proportional control increases the base drive (current) to respond substantially immediately to the excursion in collector voltage, bringing the collector voltage down and the base drive down again, but to a higher level (because of an increase in the peak detected level); thus the peak detector is also set up in this way for a subsequent cycle. At point B switch 808 is opened to isolate the leaky peak detector 1202 from the sensed collector voltage signal on line 213.

Figure 14:
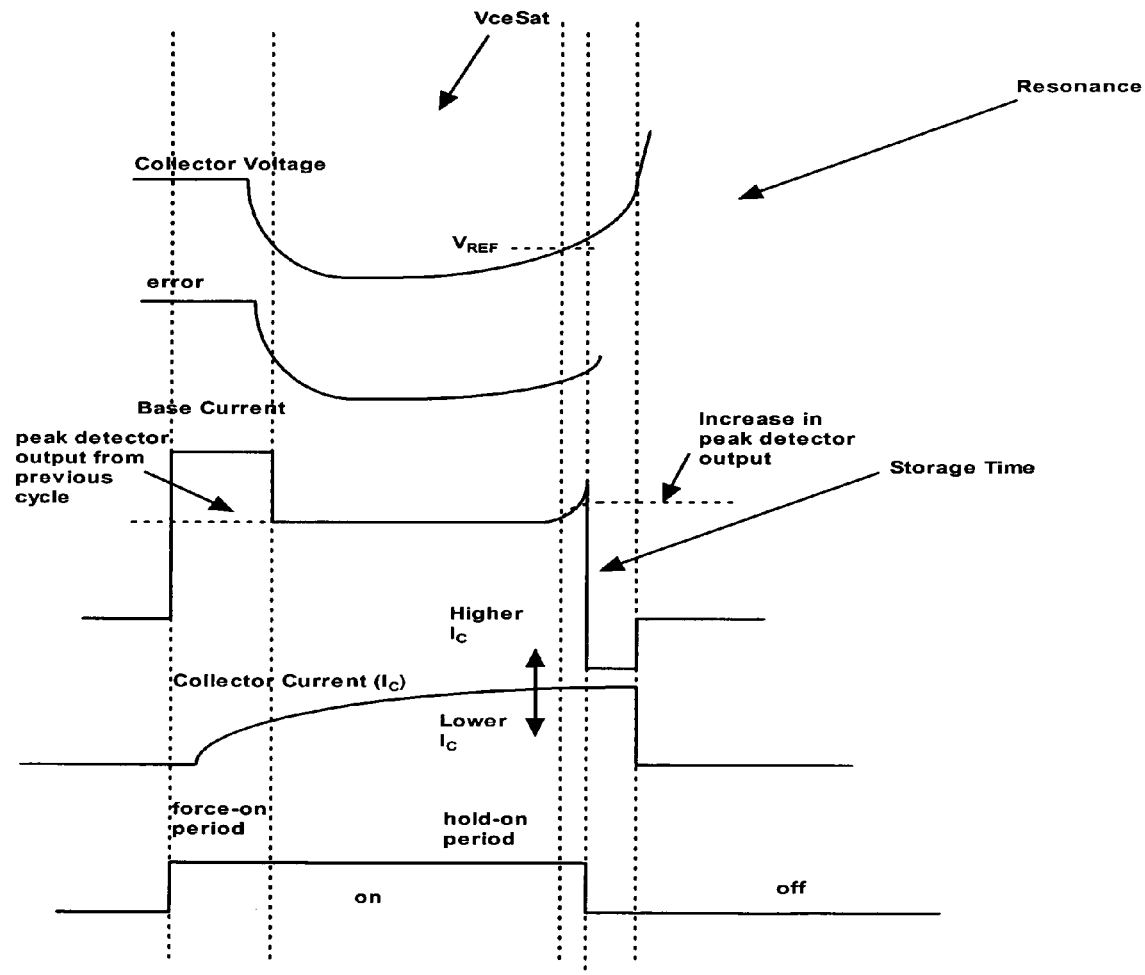
FIG. 14 shows a further set of waveforms for the circuit of FIG. 12.

FIG. 14 shows a further set of waveforms for the circuit of FIG. 12, again illustrating high/low on state current showing another example variation of collector voltage, without the load excursion shown in FIG. 13, but with a more realistic illustration of the transition of transistor 208 into saturation.

The description below is in the context of using a capacitively-coupled sensing method. Other embodiments are possible, for example using other coupling methods, and these may omit the Force-on feature.

When IFON current is applied the collector voltage falls to a low value. Subsequently, hold-on current is servo controlled to stabilise the collector at a higher voltage, set by the $C_{col}/C_p$ ratio and $V_{REF}$. In this condition, base current is provided that is sufficient only to just hold the transistor collector at this voltage. Preferably $C_p$ is included to allow adjustment of the preset collector voltage according to the requirements of particular transistors or applications. For turn-off, it is still desirable not only to remove the base current but also to withdraw maximum base current, via the turn-off switch. The hold-on current system is a feedback loop and thus may suffer from instability. Therefore a technique adopted in a preferred embodiment is to implement a slow control, but with features to make this handle load and line changes more successfully:

Base drive setting is held from one cycle to the next so that the loop need only track cycle-to-cycle changes If the collector voltage rises (during the hold-on period), the base drive is rapidly increased via peak-detect function In the absence of rising collector voltage, the base drive is progressively reduced on a cycle-to-cycle basis Thus the "leaky peak detector" refers to the controller function between the sensing element and the modulator. Broadly, its operational principle is:

A storage element holds a value of base drive

The stored value is arranged to decay away to a level corresponding to zero base drive This decay may be implemented in a variety of ways, as described in more detail below, including (but not limited to):

Constant linear rate against time

Constant exponential rate against time

Linear decay per converter cycle

Exponential decay per converter cycle

During the on-period, if the sensed collector voltage rises above the reference, the storage element value is increased (peak detector function). $V_{REF}$ error amplifier provides an error signal to the peak detector and the stored value is increased in response to this error signal. The rate of increase can be controlled in a variety of ways, including (but not limited to):

Fast: the stored value is increased to match the error signal.

Linear rise: increase the stored value at a predetermined rate

Proportional rate of rise: the stored value is increased at a rate proportional to the difference between the error signal and the present stored value.

Apart from the rise/fall characteristics of the storage element, a further consideration is the signal that is produced to control the immediate base drive. This signal may be produced by techniques which include (but are not limited to):

Use of the present stored value

Use of the stored value with an added contribution from the sensed collector voltage Use of the stored value or the sensed collector voltage, whichever is the higher The alternative methods have different benefits and drawbacks:

Decay Methods

| Item | Benefits | Drawbacks |
| --- | --- | --- |
| Constant linear rate against time | Simple Tracks small variations of switching conditions well | Poor response when there is a wide range of conditions (too fast at low levels or too slow at high levels of base drive) Response does not vary in accordance with off-period, e.g. may decay too fast if off-period is extended |
| Constant exponential rate against time | Simple Tracks well variations of switching conditions over a wider range | Response does not vary in accordance with off-period, e.g. may decay too fast if off-period is extended |
| Linear decay per converter cycle | Tracks small variations of switching conditions well Accommodates variation of switching rates, particularly where the off-period varies over a wide range | Poor response when there is a wide range of conditions (too fast at low levels or too slow at high levels of base drive) |
| Exponential decay per converter cycle | Tracks well variations of switching conditions over a wider range Accommodates variation of switching rates, particularly where the off-period varies over a wide range Easy to implement in an integrated circuit using switched-capacitor techniques | |

Peak Detector Methods

| Item | Benefits | Drawbacks |
| --- | --- | --- |
| Fast: | Responds quickly to increases of the collector voltage during each on-period | May increase the stored value too much (overshoot) |
| Linear rise: | Lower overshoot than "fast" method | May not respond quickly enough to larger increases of collector voltage |
| Proportional rate of rise: (preferred) | Lower overshoot than "fast" method In comparison to "linear rise", responds better to larger increases of collector voltage | |

Base Drive Control Signal

| Item | Benefits | Drawbacks |
| --- | --- | --- |
| Present stored value | Simple | Responds slowly to increasing collector voltage |
| Stored value with an added contribution from the sensed collector voltage | Responds quickly to increasing collector voltage | If the error signal is below the stored value, the base drive may be reduced which is undesirable in conditions where high on-state switch current establishes quickly |
| Stored value or the sensed collector voltage, whichever is the higher | Responds quickly to increasing collector voltage | |

The preferred embodiment is to use an "Exponential decay per converter cycle" for decay and "Proportional rate of rise" for peak detector. Optionally, the error amplifier may precede and/or follow the peak detector and, further, it may be integrated with other functional elements. Those skilled in the art will understand that other combinations of gain and offset functions may also be employed.

Figure 15:
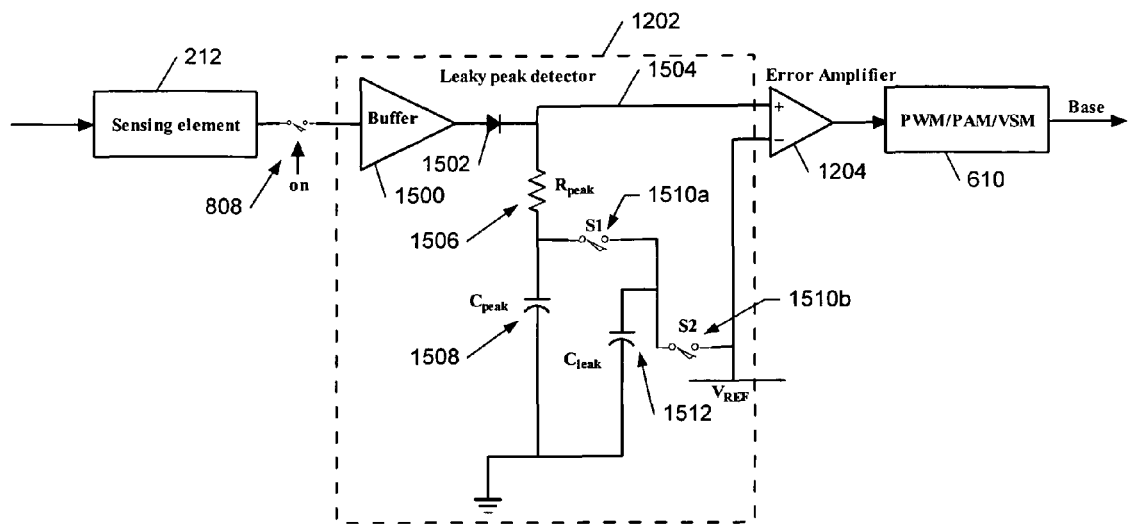
FIG. 15 shows an example embodiment of a circuit to implement a leaky peak detector.

The inventors have termed this a "leaky peak detector" technique: FIG. 15 shows an example embodiment of a circuit to implement such a leaky peak detector 1202.

Referring to FIG. 15 the leaky peak detector 1202 comprises a buffer 1500 followed by a rectifier 1502 coupled to an output 1504 of the leaky peak detector. A combination of a peak detect function and proportional control is provided by a resistor $R_{peak}$ 1506 coupled in series with a capacitor $C_{peak}$ 1508 to output line 1504. The signal on output line 1504 is the higher of either the sensed collector voltage (the output of diode 1502) or the peak detect function (the voltage on capacitor 1508). However if the sensed collector voltage, more particularly the voltage on line 1504, is greater than that on capacitor 1508 then the rate of rise of voltage on capacitor 1508 is proportional to the difference between the voltage on this capacitor (the previously detected peak voltage) and the voltage on line 1504 (the sensed collector voltage), the constant of proportionality being determined by the value of resistor 1506. In this way the circuit provides in an elegant fashion a combination of peak detect and proportional control. An exponential decay of the voltage on capacitor 1508 is provided by switches 1510a, b and leakage capacitor $C_{leak}$ 1512. In operation switches 1510a, b are operated to charge capacitor 1512 to a reference, for example $V_{REF}$, (which may be ground) and then to connect this capacitor across capacitor 1508 so that they share charge and hence so that the voltage on capacitor 1508, over time, decays to the reference voltage ($V_{REF}$). The speed of the decay depends upon the relative values of capacitors 1508 and 1512 (preferably capacitor 1512 is much smaller than capacitor 1508), and the rate of operation of switches 1510a, b. Preferably the voltage on capacitor 1508 is decayed during the off period of the transistor so as not to affect control during the on period.

Figure 16:
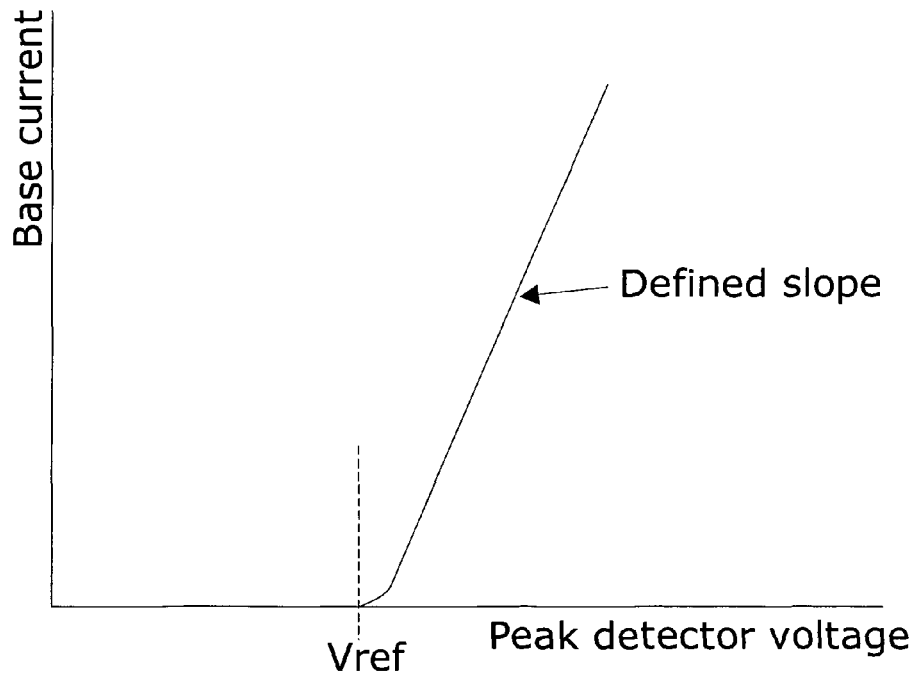
FIG. 16 shows a DC transfer function of the leaky peak detector of FIG. 15.

In embodiments $V_{REF}$ may be chosen so that the drive decays exponentially to zero, although $V_{REF}$ could be set lower for a faster return to zero, and hence faster turn-off. Preferably, however, $V_{REF}$ is chosen so that in the absence of a load the base drive decays to zero. Broadly $V_{REF}$ sets the collector voltage threshold which starts to produce a base drive. This is illustrated in FIG. 16 which shows a DC transfer function of the leaky peak detector of FIG. 15.

In the example of FIG. 15 the error amplifier follows the peak detector, but in other embodiments a leaky peak detect may be performed on the error signal.

Thus base current is applied according to the voltage on the holding capacitor Cpeak, compared to $V_{REF}$. In a leaky peaky (illustrated using a PAM system) the differential amplifier and PAM are arranged to have a controlled gain and intercept as shown in FIG. 16.

Figure 17:
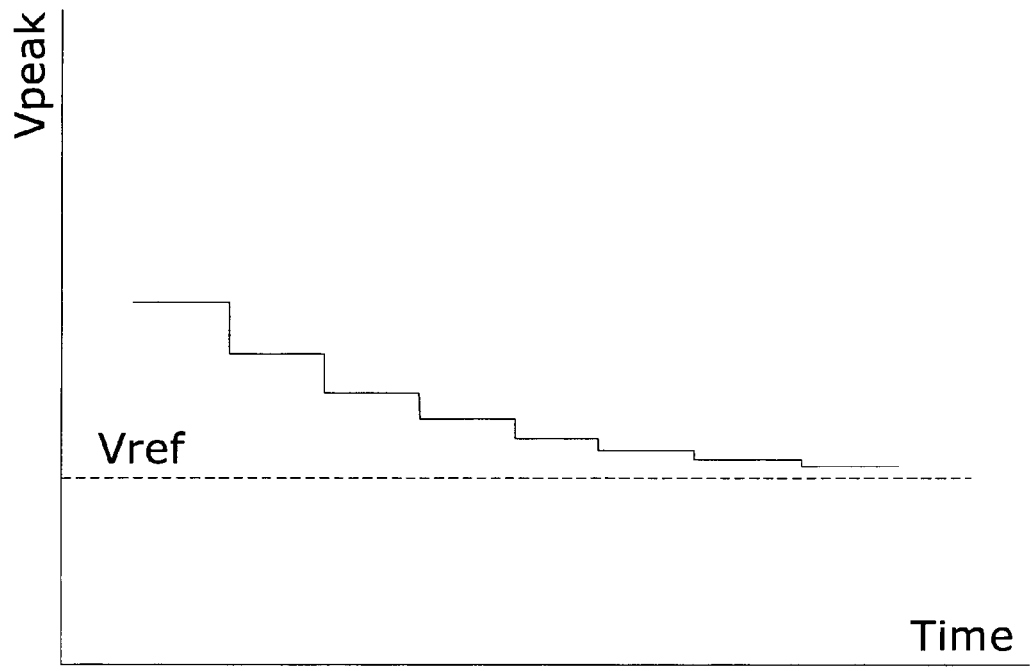
FIG. 17 shows the approximately exponential decay of a sensed peak detected voltage over time.

If the collector voltage rises above the holding capacitor voltage, the capacitor charges and increased base current is applied. S1 and S2 operate in opposition every converter cycle, S1 is closed during the off-period and S2 is closed during the on-period (but the inverse would also work). The effect of these is to drain charge away from Cpeak according to the voltage of Cpeak above $V_{REF}$. FIG. 17 shows the approximately exponential decay of the sensed peak detected voltage over time.

The decay approximates to an exponent, but with a rate that varies with the converter cycle rate. This is a significant advantage because it works consistently across a range of converter frequencies. In the case of resonant discontinuous converters this is a particular advantage because it caters for tolerance of resonant frequencies and when off-time is varied. Optionally, the reference voltage connected to S2 V(S2) may be different from $V_{REF}$. For example, if V(S2) is lower than $V_{REF}$, the decay aims to ensure that base current is removed when the collector voltage is low. This is advantageous to minimise turn-off time when the system is to operate with very low on-state currents.

It is important to limit the rate of rise of the peak detector voltage if the collector voltage rises. Typically, if the transistor has insufficient base current to support its increasing load current, the collector voltage rises in two stages as shown in FIG. 18.

Figure 18:
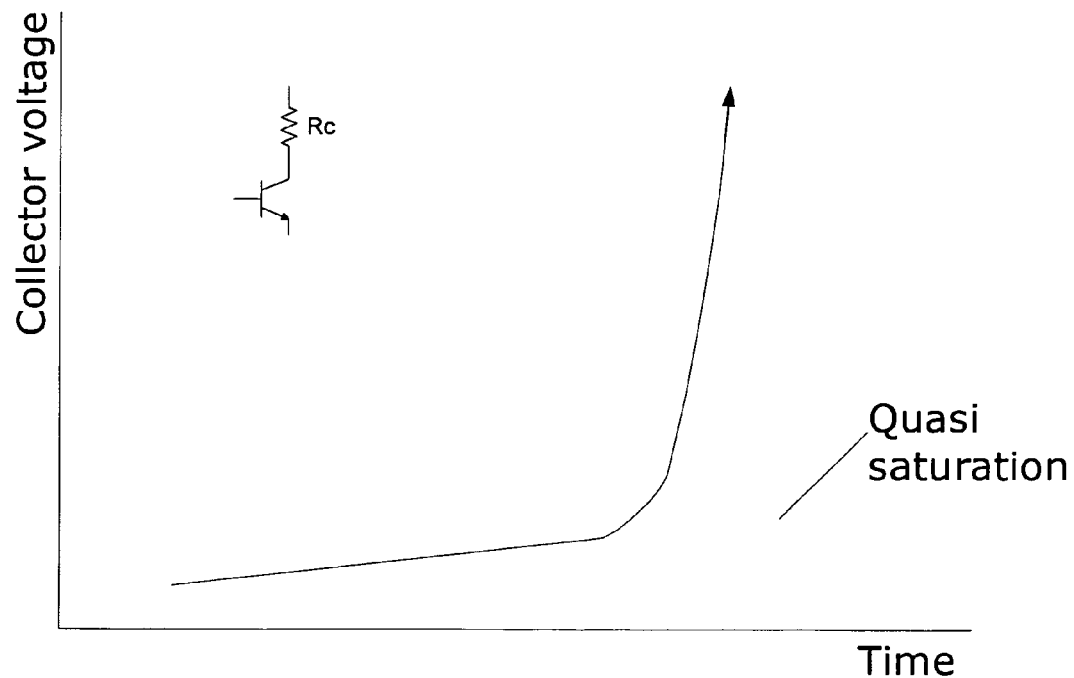
FIG. 18 shows a graph of collector voltage against time.

FIG. 18 shows a graph of collector voltage against time (assuming an inductive load so that the collector current increases with time), or equivalently against collector load or current ($I_c$). In the direction indicated by the arrow the voltage across the internal collector resistance ($R_c$) is increasing whilst the transistor is in the quasi-saturation region indicated (the "internal" transistor remains in saturation). At the knee in the curve the "internal" transistor can no longer sustain the collector current for the given base drive and thus begins to turn off, coming out of saturation (quasi-saturation).

It is possible to set the collector "set point" above or below the quasi-saturation limit. If the transistor collector voltage is controlled to be within quasi-saturation then the on-state power dissipation is low but the charge storage can be significant. Conversely, if set above quasi-saturation, storage is low and turn off is quick. In either case, however, the collector may rise up the steep part of the de-saturation curve. If the peak detector tracks this, base current can be applied quickly but the transistor delay characteristics may be such that the collector voltage has already risen to a high value and the peak detector has risen correspondingly. Consequently it is possible for the peak detector voltage to rise too high, leading to excessive base current (and consequent charge storage) on subsequent cycle(s). By including a limit to the rate of rise (Rpeak), this effect can be reduced to acceptable levels.

High collector voltage excursions during the on-period, apart from pumping the holding capacitor voltage too high, can also cause problems with the collector coupling capacitor. In the case where the controller is implemented as a CMOS integrated circuit then if the excursion is large then the positive ESD protection diode of the controller input pin may come into conduction. Though this need not cause immediate problems (the ESD diode is normally robust and may be protected by additional external diodes), it causes a change of charge in the collector coupling capacitor. The effect is that subsequently the voltage at the controller may indicate adequate collector voltage saturation whereas the collector voltage is actually high. To avoid this in normal operation, it is desirable to apply extra base current as fast as possible when there is a collector voltage excursion. For this reason the error amplifier takes its signal from before Rpeak, rather than after.

It is desirable to be careful about the timing and magnitude of the force-on pulse; there are several considerations:
  Current should be sufficiently high to provide saturation under all expected collector load conditions
  Current should be high enough to provide fast turn-on, even if the collector (on-period) load is very light
  Charge in the pulse should not be excessive as this can give unacceptable charge storage in conditions of light on-period load, even if the hold-on current is zero.

A particular issue results from the bipolar turn-on characteristic in relation to quasi-saturation. When force-on current is applied, the transistor conducts very quickly, but the lightly-doped extended collector region presents a high resistance until it fills with charge by diffusion from the base. This means that the collector voltage is low only if the collector current is low. As charge fills the extended region, the transistor can support higher currents at low collector voltages. For the proportional base drive to operate effectively the Ccol capacitor should be discharged "correctly" i.e. The collector voltage is representative of "saturation" at the time when the ActiveClamp switch is turned off. If the force-on pulse is short (desirable for minimising excess charge when the load is light); typical HV transistors can support only low currents at low Vce in this time (few 100s of ns). In power converters, within this timescale the collector load is predominantly inductive. When force-on current is applied, there is a capacitive current pulse through Ccol and other parasitic circuit capacitance but this lasts only a few 10s of ns. After this, the transformer inductance dominates. It is not a pure inductance, having appreciable loss, but is predominantly inductive. Provided the ActiveClamp switch is turned off before inductive current rises to far/fast, Ccol can be discharged to an appropriate voltage. The important case is when there is heavy load/overload on the converter; Collector current can rise very quickly and there is a narrow time window to turn off ActiveClamp after the collector has fallen (limited by capacitances), but then rises again (as inductive current builds).

Modulators

The modulator module 218 of FIG. 2 delivers base drive to the power switching transistor in response to the signal provided by the controller. Depending on the sensing method either one or two phases are needed in the application of the base current.

With a "coupling capacitor" sense method: Preferably, so that the capacitor is reset to represent the initial saturation voltage of the power switch transistor, it is desirable to "force on" the transistor with an initial high current ("force-on" or "FON" phase) Once the voltage of the coupling capacitor has been preset, a "hold-on" phase is entered subsequently where the base drive is varied in response to collector voltage. Preferably, the duration of the FON phase is minimised to prevent excess charge being applied to the base.

With a "diode" or "resistor" sensing method: Only the hold-on phase (as above) need be employed. However it may be an advantage to have a short prior FON phase to provide fast turn-on, minimising power dissipation as the collector voltage falls. In the context of using the "coupling capacitor" sensing method, during the force-on period a large current is applied to the base. During this period the collector voltage falls to a low value. Following this during the hold-on period the base current is modulated so that the collector voltage is held at a value so that during turn-off the storage time is minimised. Various modulation techniques can be used and are described in this section.

Pulse Amplitude Modulation (PAM) the Preferred Embodiment

Figure 19A:
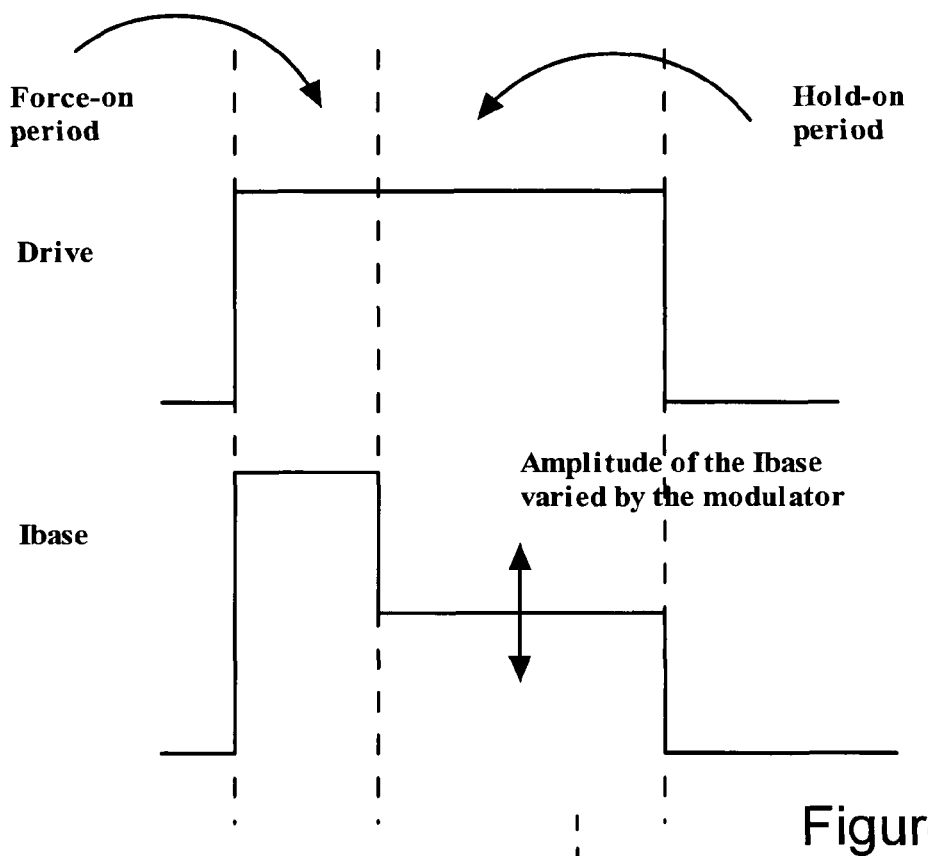
FIG. 19a and 19b show, respectively, show an example of pulse amplitude modulation and pulse amplitude modulation illustrating an example of undesired oscillation.
Figure 19B:
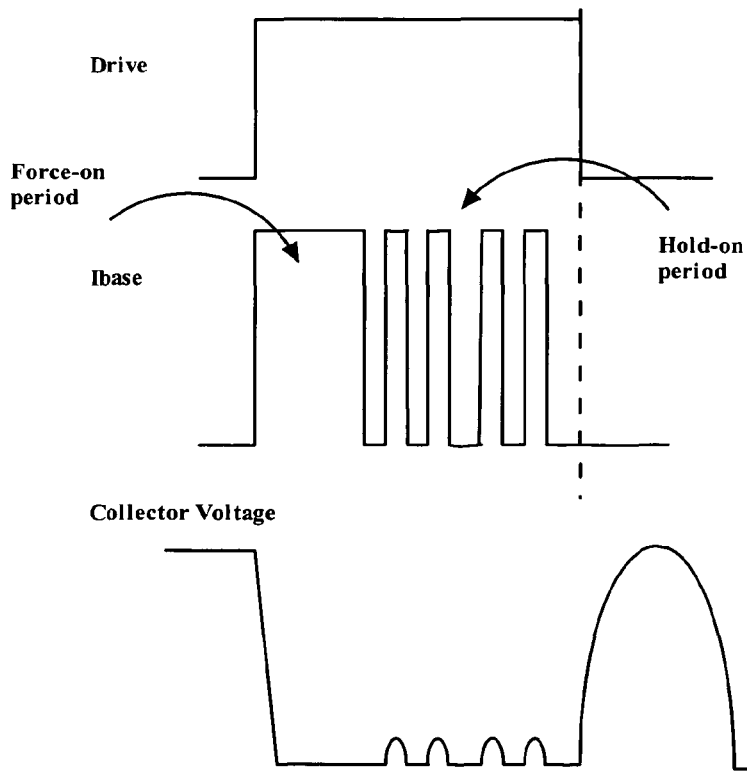

FIG. 19*a* shows an example of pulse amplitude modulation, implemented for example by PAM system 610, a preferred embodiment of modulator 218. In this pulse amplitude modulation scheme the amplitude of the base current is varied in response to the output of the controller. If the gain of the controller is high then a response similar to the one as shown in FIG. 19*b* is obtained showing (undesired) oscillation of the base (or gate) drive.

Pulse Width Modulation (PWM)

Figure 20:
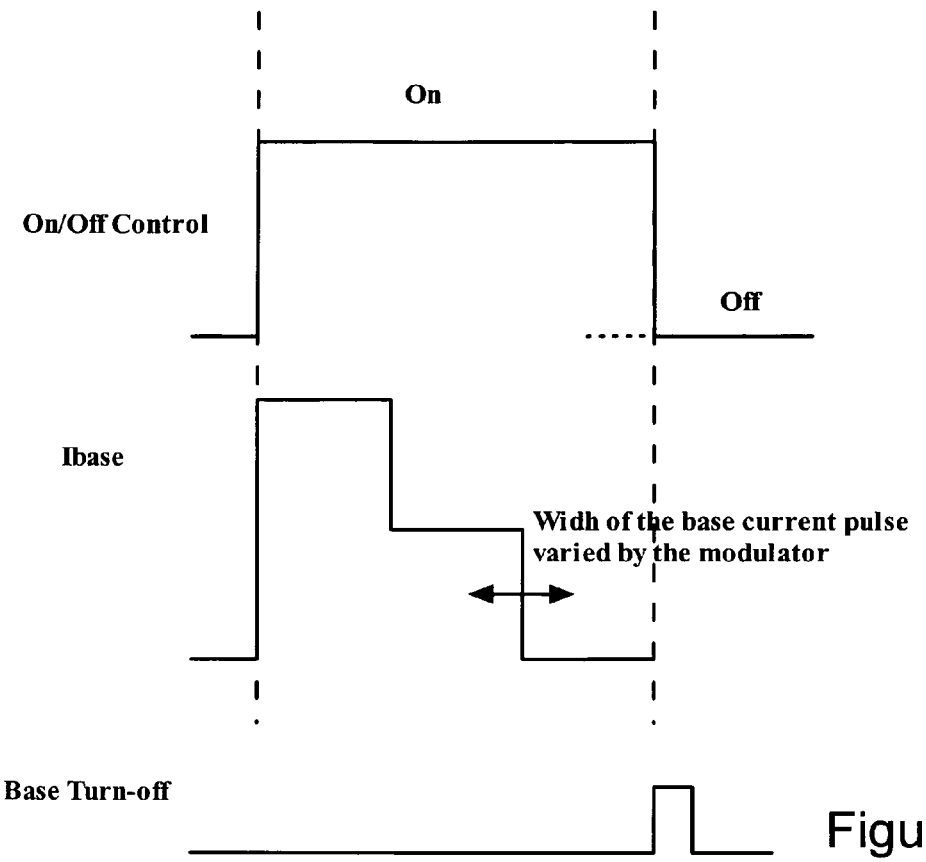
FIG. 20 shows a PWM base drive scheme.

FIG. 20 illustrates a PWM base drive scheme. In this pulse width modulation scheme the width of the base current is varied in response to the output of the controller.

Optionally, a different current level may be used for the force-on period and the variable-width period.

In this method, a variable charge is sent to the base by varying the time for which a (substantially) fixed base current is applied. Once the base current is stopped, the transistor is maintained in the on state by its stored charge. Generally this is effective provided the transistor is to be maintained in the on state only for a short time (typically less than approximately 20 microseconds), Charge is lost via a number of mechanisms, including:
  To support base current needed as a result of the finite current gain of the transistor
  Recombination of charges
  Leakage As the time interval between turn-off of the base current and termination of the on-period increases, charge is lost to mechanisms other than collector current/gain. Hence the "efficiency" of base drive reduces, since an increased average base drive is used to support a given on-state current. The loss of efficiency depends on transistor construction, temperature, on-state current and the like.

At the end of the desired on period, the transistor may turn off as a result of decay of stored charge. However this is typically slow and causes power loss. Preferably, faster turn-off is achieved by taking current from the base, under control of a base turn-off pulse.

This method also applies to IGBTs but there is no method to withdraw charge at the end of the on-period.

The advantage of this technique is that it is simple to implement as an integrated circuit, particularly when using digital techniques to control timing. Apart from the efficiency of base drive noted above another shortcoming is in situations where the on-state current increases during the on-period (e.g. inductive load). In such cases, the base drive and stored charge is minimum at the end of the desired on-period, when the on-state current is highest. This may give rise to unacceptably high on-state voltage.

Variable Slope Modulation (VSM)

Figure 21:
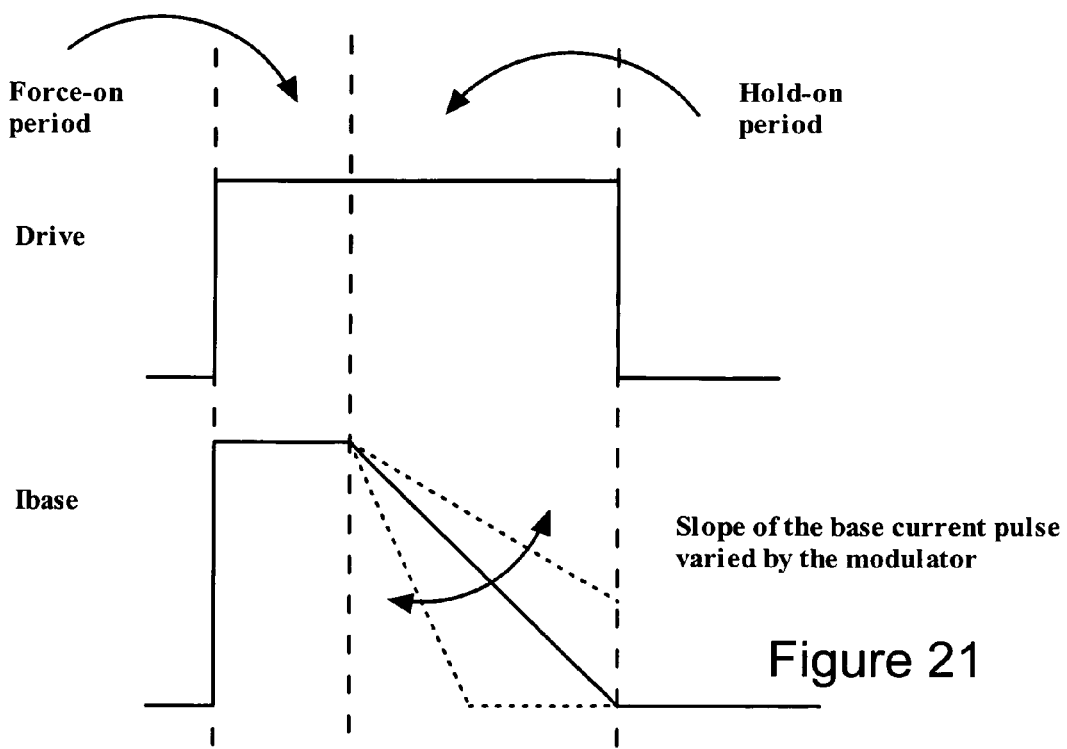
FIG. 21 shows a variable slope modulation scheme.

FIG. 21 illustrates a variable slope modulation scheme. In this variable slope modulation scheme the fall time of the base current is varied in response to the output of the controller. Optionally, the fall time of current may be kept constant but the variable quantity is the trigger time at which the fall commences. In comparison to "pulse width modulation" this technique improves the drive efficiency and performance with inductive loads, but is not as effective as pulse amplitude modulation. It can help sustain a high collector current towards the end of the on period as a base (or gate) drive is still present (contrast PWM). The slope and slope commencement point of the waveform may be varied as control parameters.

Pulse Frequency Modulation (PFM)

Figure 22:
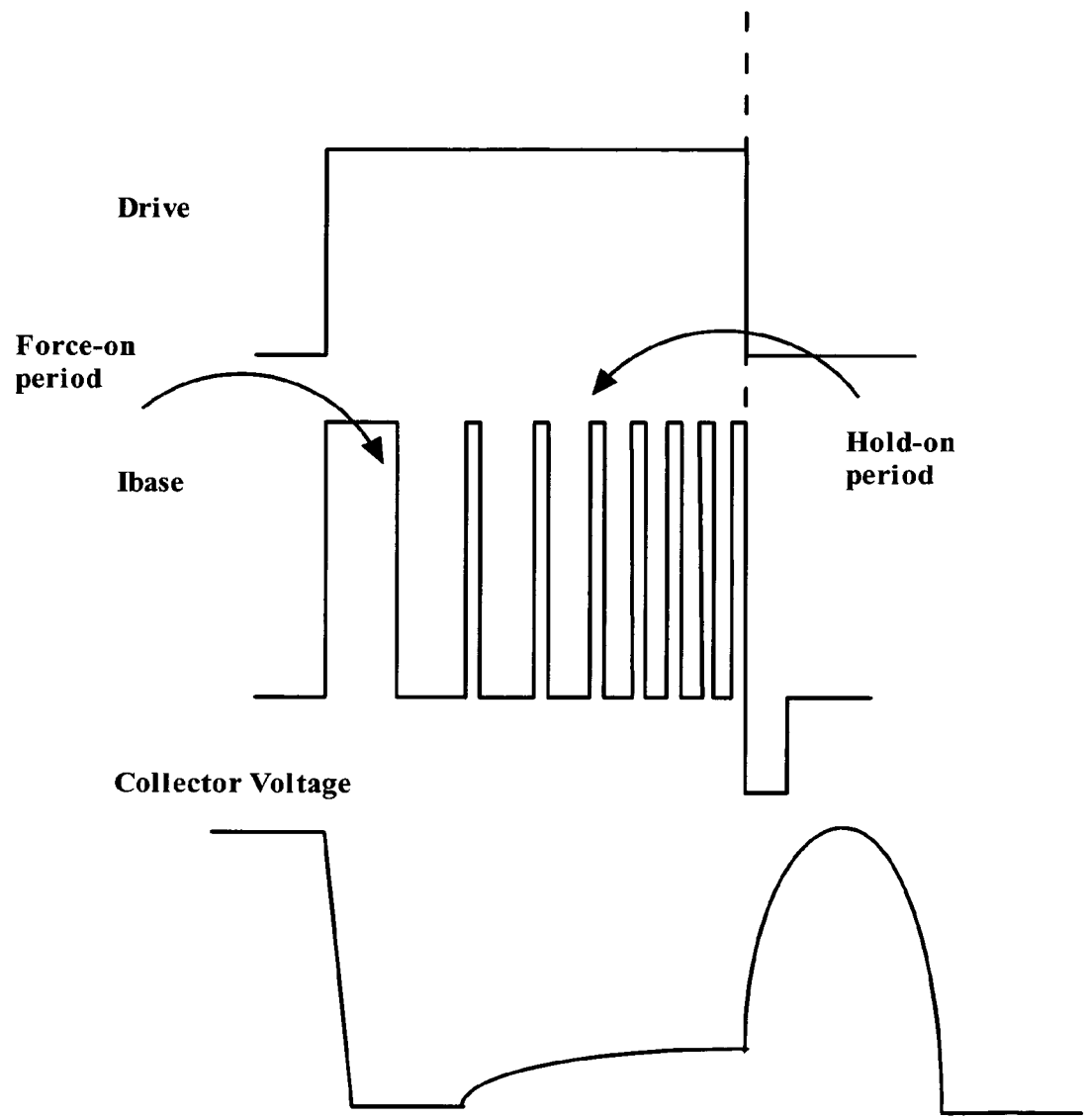
FIG. 22 shows an example of PFM modulation.

FIG. 22 shows an example of PFM modulation. As illustrated, the frequency of the pulses is varied in accordance with variation in the control voltage. The amplitude of the pulses in the hold-on period need not be the same as the amplitude of pulses in the force-on period.

As illustrated in FIG. 22, if the pulses are relatively narrow only a relatively small quantity of charge is delivered to the base (or gate) of the bipolar transistor in each pulse which facilitates a rapid turn off. Preferably the pulses are fixed width, although a pulse width may be varied. The rate of pulses may be proportional to an error signal as previously described.

Combinations of Methods

Combinations of the above methods may also be employed. For example PAM and PWM and slope modulation could be combined, say, for increased dynamic range. In general a potential advantage of combination of techniques is to provide a wider range of control and to reduce the problems associated with inductive loads.

Leaky Peak Detector with PAM Modulation

Figure 23:
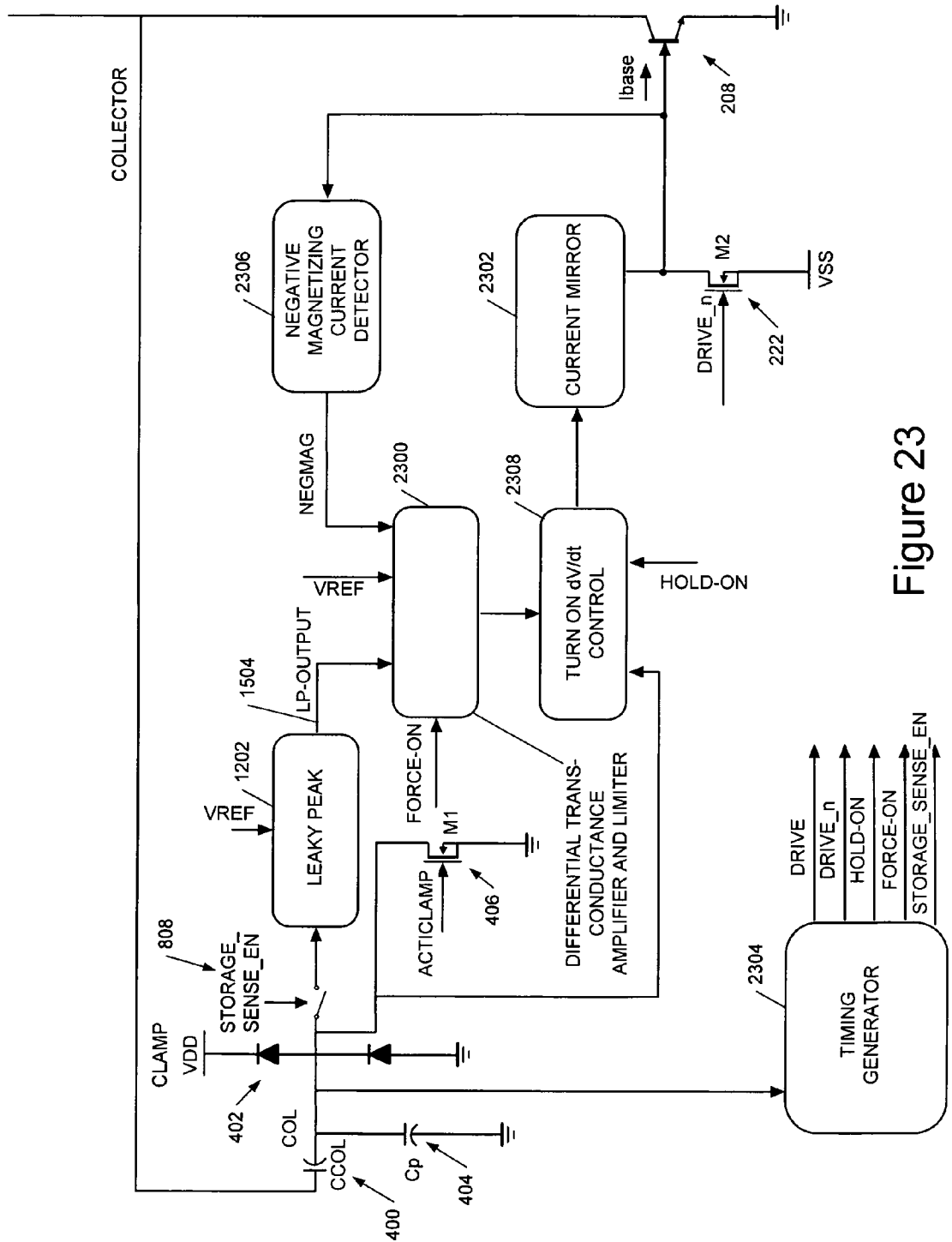
FIG. 23 shows a preferred embodiment of a control system.

FIG. 23 shows a preferred embodiment of a control system including preferred embodiments of sensing element 212, controller 214 and modulator 218 of FIG. 2. In particular capacitor-coupled based sensing is shown in FIG. 4, a leaky peak detector controller as shown in FIGS. 12 and 15, and pulse amplitude modulation as shown in FIG. 19a. Like elements to those shown in these figures are indicated by like reference numerals.

Figure 24:
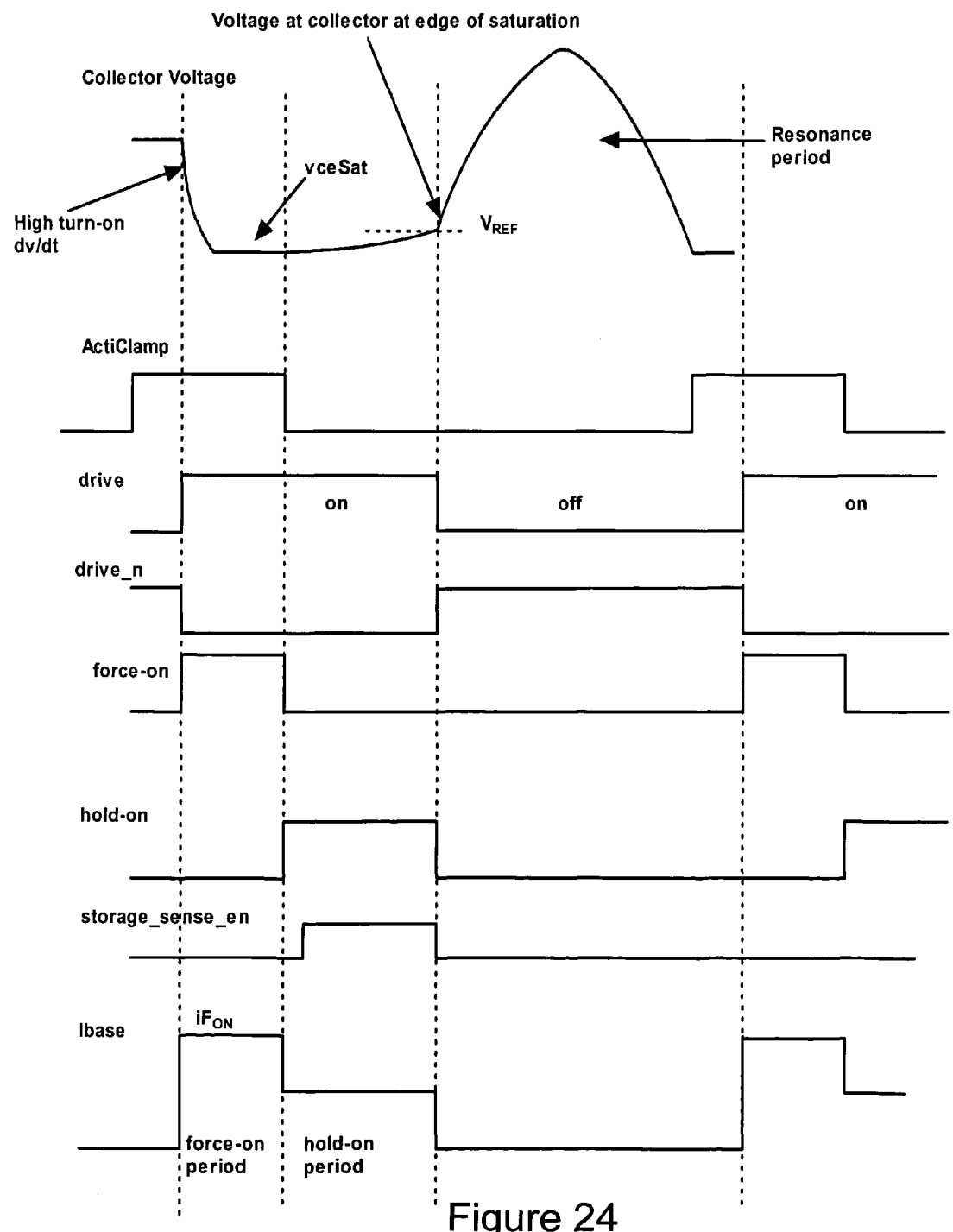
FIG. 24 shows the trailing edge of the force-on signal synchronised with the active clamp signal.

In the illustrated preferred embodiment the error amplifier is implemented using a (differential) transconductance amplifier, preferably with a limiter, and this drives a current mirror 2302 providing a current drive to the base of transistor 208 (in an IGBT-based embodiment a voltage drive is employed). A timing generator 2304 is used to generate a set of drive circuit control systems as shown in FIG. 24 including, in particular, drive and negated drive (drive_n) signals, a hold-on signal to operate switch 412 (see FIG. 12), a force-on signal to operate switch 408 (again see FIG. 12) and a storage sense enable signal to operate switch 808. As can be seen from the base current drive signal illustrated in FIG. 24, the control system implements a pulse amplitude modulation control scheme as previously described.

Also included in the control system of FIG. 23 is a base clamp circuit 2306 (system 2900 of FIG. 29) that detects a negative magnetising current and provides enough base current to support this magnetising current. Also included is a turn-on dv/dt control block 2308 (system 3100 of FIG. 31) which can control the dv/dt of the collector voltage. Controlling the dv/dt can limit the amount of current that flows through the CCOL capacitor and, potentially, out of the Col pin (line 213).

Referring to FIGS. 23 and 24, just before drive turns on the ActiveClamp signal goes high. This signal pulls the "COL" pin to ground resetting one end of the capacitor "Ccol". The drive is now turned on. During the initial part of the drive signal (force-on period as indicated by the force-on signal) a force-on current ($IF_{ON}$) is applied to the power switching transistor. Even though a force-on current is optional, the force-on current quickly brings the collector voltage down to a low value and hence reducing turn-on losses. FIG. 24 shows the trailing edge of the force-on signal synchronised with the active clamp signal, but this is not essential. Before the end of the ActiveClamp period the collector voltage falls from a high voltage to a low voltage (close to the saturation voltage). Since both ends of the capacitance are close to ground effectively the capacitor voltage is reset and represents the saturation voltage of the transistor. Also, the ActiveClamp transistor M1 conducts any large current flowing in/out of the "COL" pin during this period, so that the ESD transistors do not come on during turn-on. The hold-on period follows the force-on period. During the hold-on period the amount of base current is adjusted so that at the end of the drive period the transistor is just at the edge of saturation under steady state conditions. This is achieved by aiming to keep the collector voltage equal to an internal reference voltage (typically around 1.2V) scaled by Ccol and Cp during hold-on period. This reduces the excess charge in the base and the transistor turns off quickly. Optionally, the "aiming voltage" of the collector may be adjusted by the value of capacitor Cp connected between COL and GND. The amount of base drive during the hold-on period is determined by the leaky peak controller and depends not only on the current value of the collector voltage but also on the previous values. The leaky peak detector is updated only during the time when the storage_sense_en signal is active. This signal can be made active either when the drive is active or after a delay from the rising edge of the drive signal.

Figure 25:
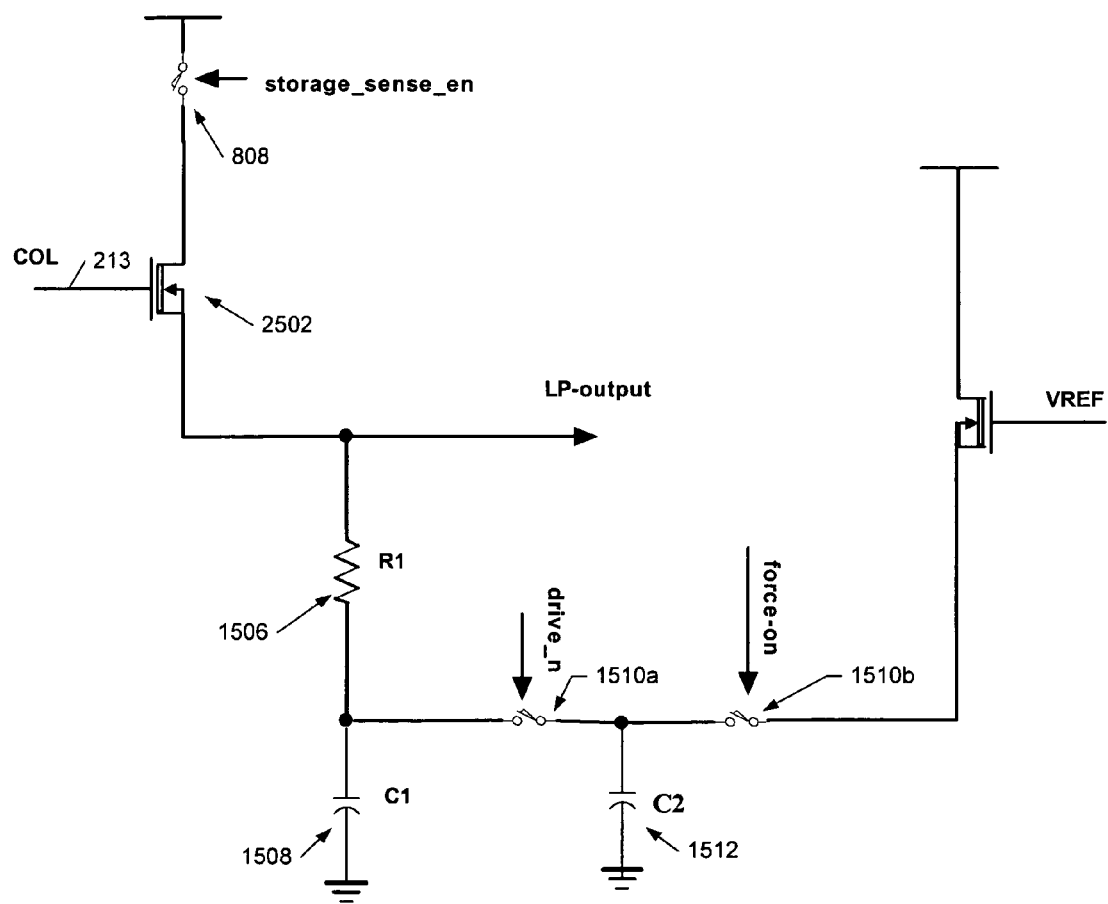
FIG. 25 shows an implementation of the Leaky Peak controller of FIG. 23

An implementation of the Leaky Peak controller 1202 of FIG. 23 is shown in FIG. 25, in which the element to those previously described are indicated by the reference numerals. Transistor 2502 both buffers the sensed collector voltage and acts as unidirectional source of current for a leaky peak detector circuit which determines the amount of base drive during the hold-on period.

Figure 26:
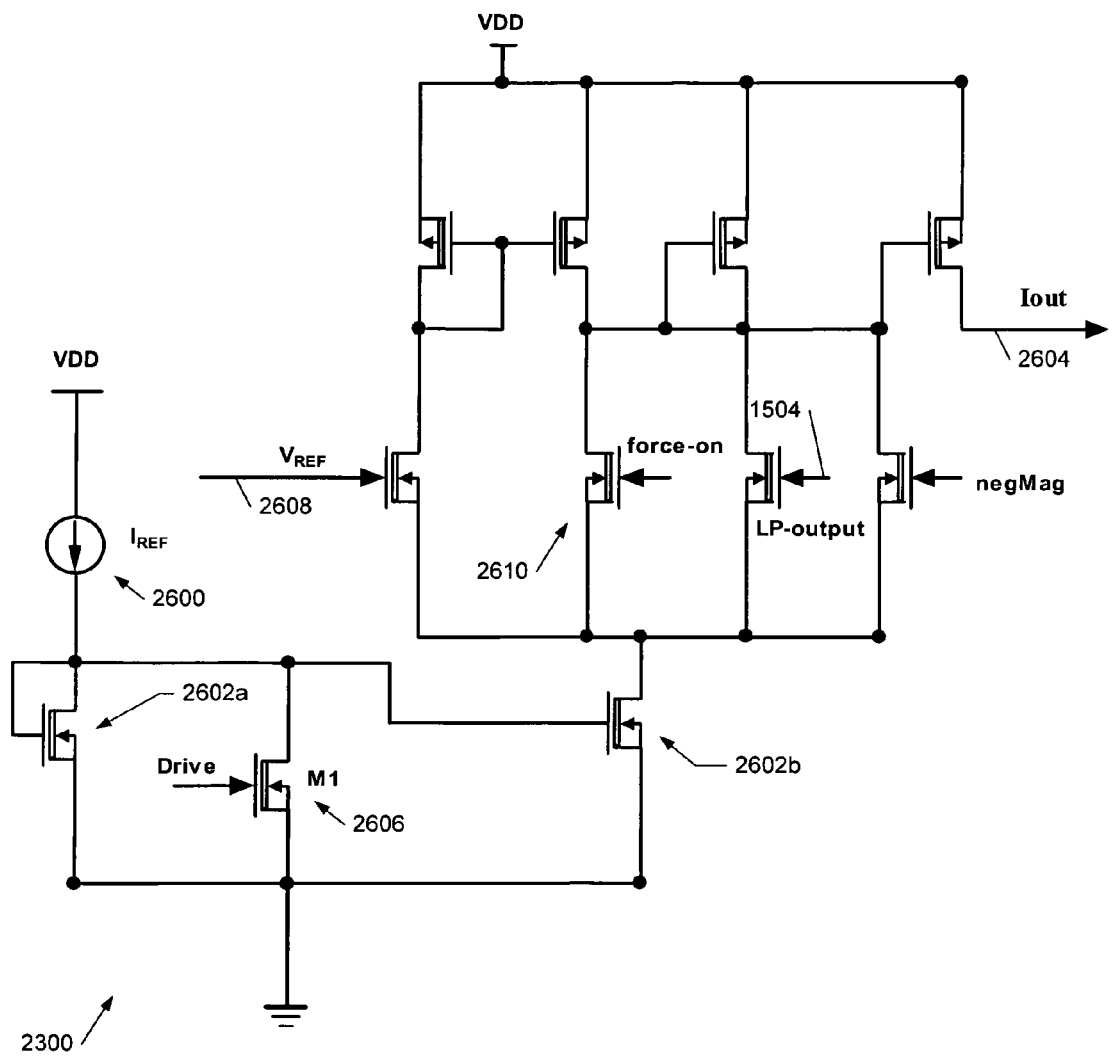
FIG. 26 shows an embodiment of the differential transconductance amplifier/with limiter (error amplifier)

FIG. 26 shows an embodiment of the differential transconductance amplifier/with limiter (error amplifier) 2300. The circuit includes a reference current generator 2600 mirrored by transistors 2602a, b, which limits the maximum current from output 2604 to the reference current from generator 2600 ($I_{REF}$), which limits the base current if the collector voltage is high. Further this reference current may be switched off by transistor 2606 (M1) in the off period of transistor 208, that is when Drive is off and there is no base current. The differential voltage input to the transconductance amplifier is provided by lines 1504 (the output from the leaky peak detector) and a reference voltage line 2608. Transistor 2610 enables the reference current from generator 2600 to be forced from the output 2604 when transistor 2610 is on.

In operation, during the force-on period a maximum base current (limited to $I_{FON}=K*I_{REF}$ where K is a constant) is provided. This allows the collector to fall rapidly and thereby reducing the turn-on losses. During the hold-on period this circuits implements the transfer function shown in FIG. 16. This circuit also acts as a limiter, limiting the maximum base current during the on time to a maximum value of $I_{FON}=K*I_{REF}$. Also this circuit provides the current used for clamping the base in response to the "negMag" signal coming from the negMag detector. The transistor M1 aims to ensure that the base current is only provided during the on period of the drive.

Base Voltage Clamping

This applies particularly to the field of resonant discontinuous converters (both forward and flyback) operating with or without proportional base drive and using junction bipolar transistors.

Figure 27:
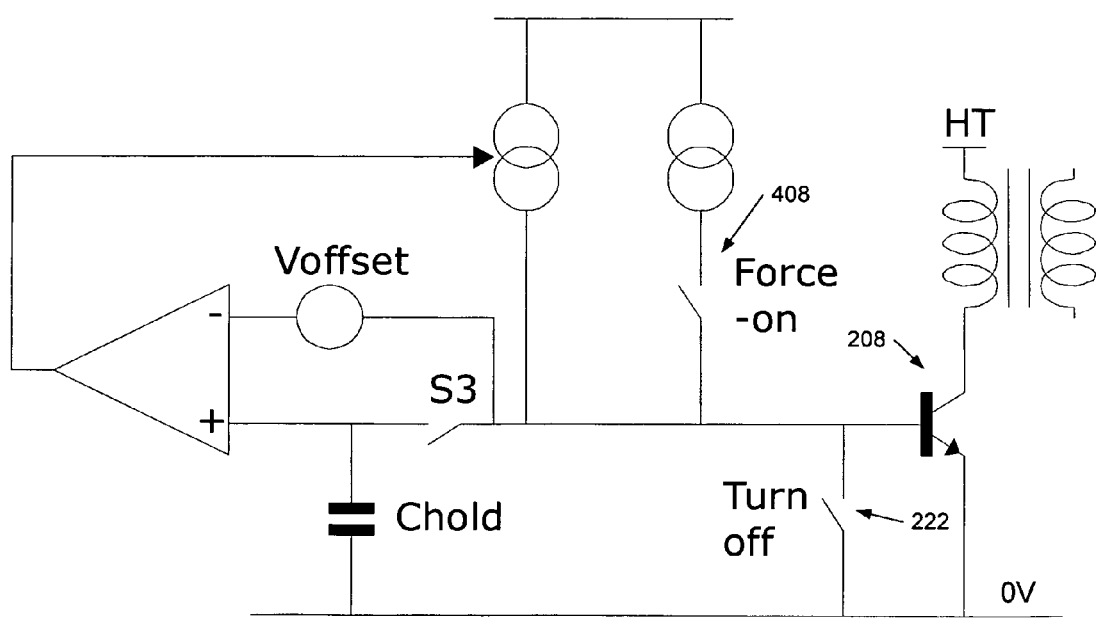
FIG. 27 shows a base voltage clamping circuit.

A typical topology is illustrated in FIG. 27, which shows a base voltage clamping circuit. In the off-period, energy in the system causes resonance of the BJT collector voltage. When the off-time is larger and the load is light, the collector voltage typically resonates back down to, and below, zero volts. This causes the transistor c-b junction to become forward biased, taking the base voltage below zero. This can have unfortunate consequences: damage (particularly latch-up) of a controller connected to the base and/or failure of the b-e junctions. To inhibit this, a clamp arrangement is included in the controller as shown in the circuit of FIG. 27.

During resonance, the turn-off switch is kept closed; this holds the base close to 0V so that when the resonance brings the collector voltage below 0V, any negative collector current returns via this switch to 0V. The controller initiates the next on-period (though collector current may still be negative), the turn-off switch is opened and the force-on current is connected. At the same time, S3 is closed so the prevailing (positive) base voltage is sampled on Chold; provided the negative Imag is less than the force-on current—this is a limitation on maximum Imag. At the end of the force-on period, both the force-on current is switched off and S3 is opened. If the collector current is still negative, the base voltage will fall but this is detected by the differential amplifier and, if it falls far enough, base current is re-applied to limit the excursion.

Figure 28:
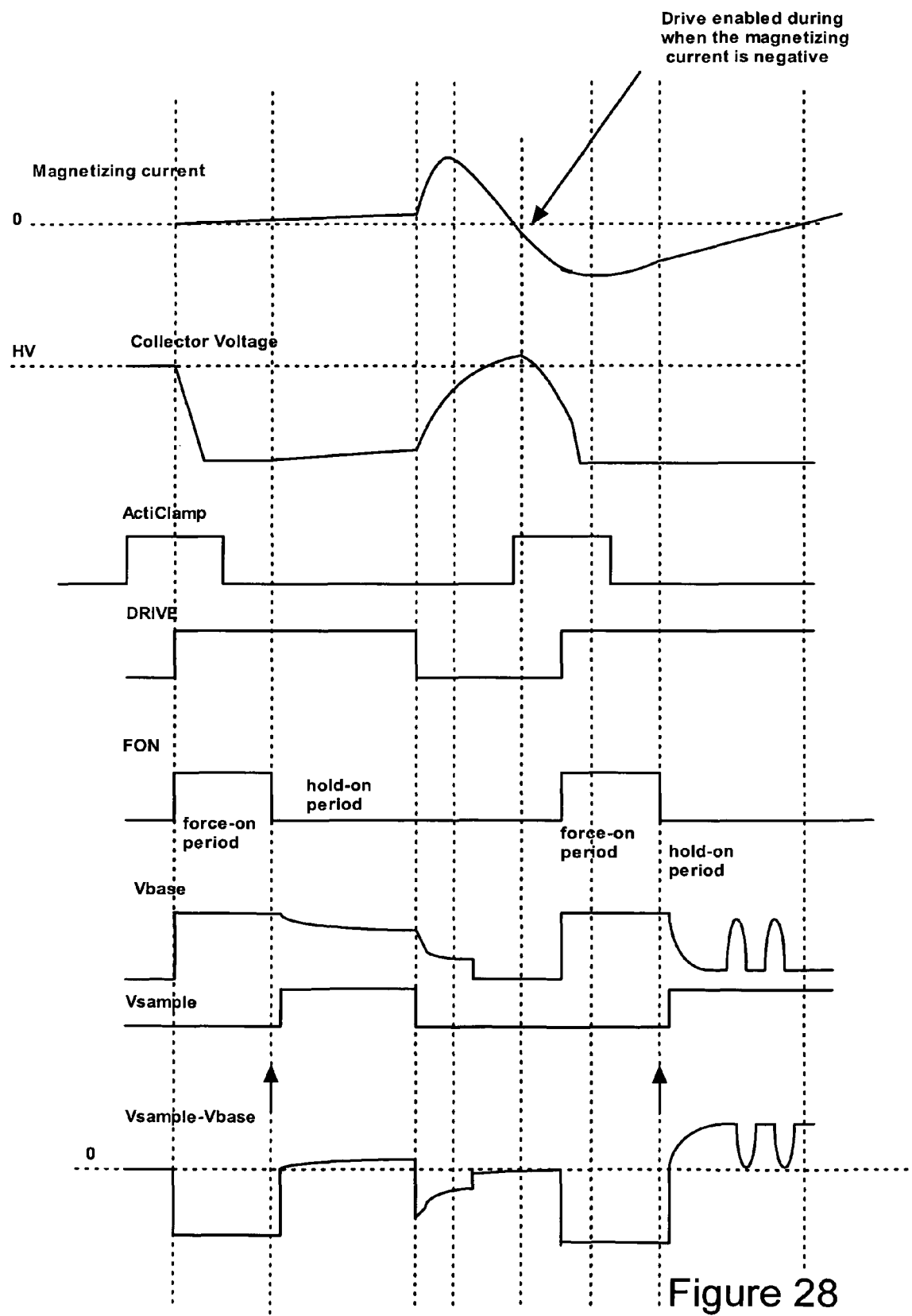

FIG. 28 shows a timing diagram illustrating a negative magnetizing current at turn-on, where the drive turns on when the magnetising current is negative during the drive disable period when the transistor is off the magnetising current will be flowing through the transistor M2 (FIG. 23). When the power switch transistor 208 is turned on, especially at light loads, and if the magnetising current is negative then the base driver will have to provide this current.

Figure 29:
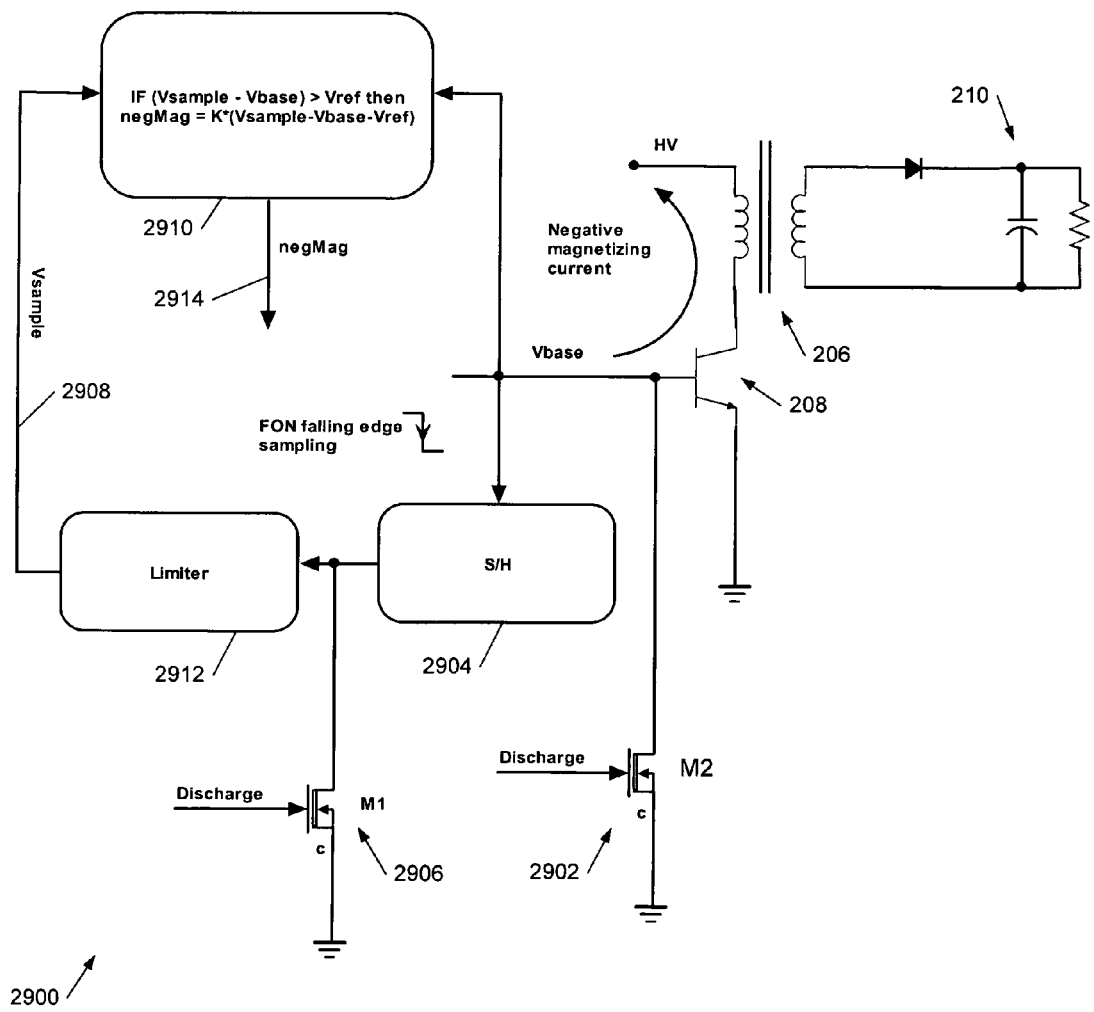
FIG. 29 shows an embodiment of a negative magnetising current detector.
Figure 30:
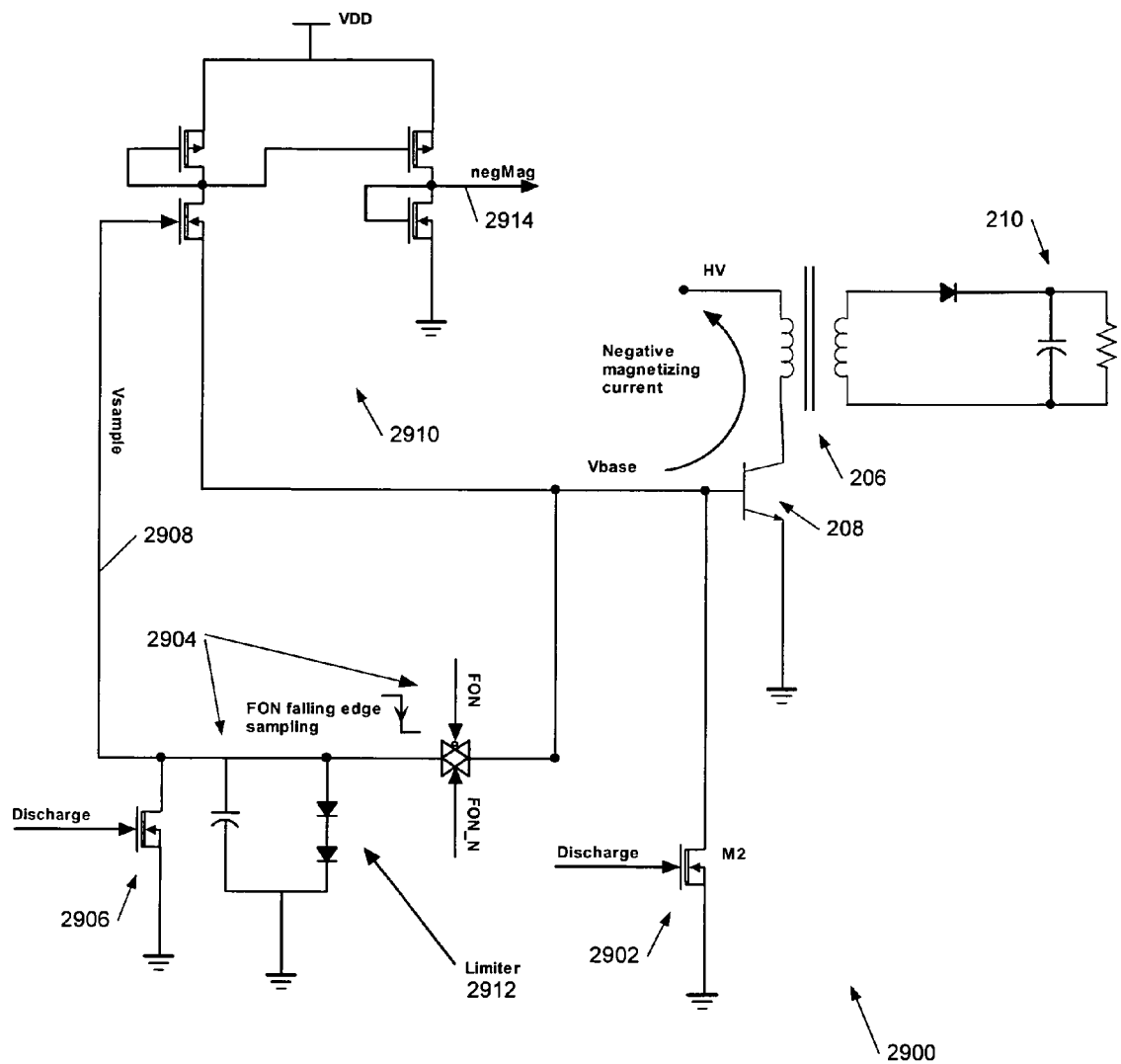
FIG. 30 shows an example implementation of the detector of FIG. 29.

FIG. 29 shows an embodiment of a negative magnetising current detector 2900 including a base clamping circuit to address this problem; FIG. 30 shows an example implementation of the detector of FIG. 29 (in which like elements of those of FIG. 29 are indicated by like reference numerals). The detector includes a discharge transistor 2902 (M2) to hold the base of transistor 208 close to zero volts when transistor M2 is on. The detector also includes a sample/hold circuit 2904 coupled to the base of transistor 208, again with a discharge transistor 2906 (M1), the sample/hold circuit providing a sampled voltage signal (Vsample) on line 2908 to a control circuit 2910 via a limiter 2912. The control circuit also receives a signal (Vbase) from the base of transistor 208 and compares this with the signal level on line 2908 and provides an output signal negMag on line 2914. The output signal is related to the two input signals as follows:

IF($V$sample−$V$base)>$V$ref then negMag=$K*$($V$sample−$V$base−$V$ref)

where K is a constant proportionality. The signal negMag on line 2914 is used to control the base drive current to transistor 208, in general as shown in FIG. 27 and in some preferred embodiments of FIG. 25. FIG. 30, as previously mentioned, shows a more detailed circuit implementation of the detector 2900 of FIG. 29.

The following discussion assumes that, as in some preferred embodiments, this system is implemented in an integrated controller fabricated from CMOS technology. During the initial part of the drive cycle, i.e. during the FON period (refer to FIG. 28), since maximum base current is provided, the base driver can support this negative magnetising current. During the switch over to the hold-on period, if there is a reverse magnetising current, the proportional part of the base driver will not provide any current. If there were no clamping function this negative magnetising current would cause conduction in the body diode of transistor M2 (FIG. 30) as well as ESD (electrostatic discharge) diodes connected to the base pin. Also if we do not detect this and allow the ESD transistors to come on then the feedback capacitor may not be reset properly to represent the saturation voltage of the power switch transistor.

The circuits shown in FIG. 29 and FIG. 30 detect such a condition and during the hold-on period turn base drive on to support this negative magnetising current. The voltage at the base is sampled and held by the falling edge of the FON signal.

Subsequently, in the hold-on period this voltage is compared against the voltage on the base and if the difference between the sampled voltage and the base voltage falls below a threshold (offset) level the negMag signal is turned on. The negMag signal is applied to the differential transconductance amplifier (FIG. 26) which generates the required base current. The limiter helps to ensure that the base spreading resistance of the BJT does not affect the operation of this circuit. If the base spreading resistance of the BJT is high, during the force-on period a large current, if forced-on to the base, also flows through the base spreading resistance creating a significant voltage drop across it. As the force-on current is removed at the end of the force-on period the voltage at the base pin falls by an amount equal to the voltage across the spreading resistor. This could potentially lead to false triggering of the negMag circuit. A limiter, if included, can avoid this problem.

Collector dv/dt Limiting at Turn-on

This applies particularly in the field of switching power converters, including forward and flyback, resonant/not resonant and using a variety of power switching device technologies (BJT, IGBT, MOSFET). The technique addresses two potential problems:

Where the primary winding has a significant self capacitance, or has an additional capacitance in parallel, at turn-on of the switch the voltage across these capacitances may change rapidly and by a large amount. Correspondingly, there will be a significant capacitive current which will flow around the circuit: switch, capacitor, power source. In this circuit current sensing may be employed for over-current protection. The capacitive current may be larger than the threshold setting of this protection needed for other purposes so could trigger the protection falsely. One method to avoid this problem is to blank (ignore) the over-current protection for a short period around the turn-on of the switch. However, this gives rise to a potential hazard that there is then no protection during this period. A further complication arises in designing controllers for switching systems; it is desirable to have a controller that can be used in a wide range of applications. However, there will be a correspondingly wide range of turn-on behaviours (duration, capacitive current amplitude and so forth) and overload protection current thresholds. Setting a particular blanking time will limit the range of application.

Control of dV/dt can also be useful at the instant of turnoff of the switch. At turnoff there is typically a fast rise of switch voltage caused by current flow in circuit inductance and transformer leakage inductance. In some configurations this fast rise of voltage can be troublesome particularly where it causes a large rise of voltage. A fast rise of voltage can cause unwanted radio frequency interference and a large rise of voltage can be destructive to the switch or other components of the circuit. If the rate of rise of switch voltage is limited then the energy dissipated from the circuit and leakage inductance does not manifest as a high switch voltage but is instead dissipated in the switch itself.

In embodiments of the converters we describe which use a coupling capacitor to monitor voltage across the switching device, there may be a large pulse of capacitive current through the capacitor at turn-on. If not limited, this current can be damaging to circuits connected to the coupling capacitor, particularly if they are fabricated as integrated circuits using CMOS technology. During the force-on period the ActiveClamp switch is turned on. If the $I_{FON}$ current is not limited, the collector falls rapidly. A large dv/dt at the collector translates to a large current through the COL pin of the IC. The ActiClamp switch 406 within the IC should be sized to handle this dv/dt current. The higher the dv/dt bigger is the switch and larger the die area employed. As shown in FIG. 23, the Ccol discharge current flows through the ground pin of the IC which if not limited could result in substantial ground bounce and could affect the operation of the IC.

At turn off of the power switch 208 the Acticlamp switch coupling capacitance to ground. Thus the rate of change of voltage at turn off can be controlled in a similar way to that used at turn on. If a high current is detected in the coupling capacitance then the drive to the switch 208 may be modified to limit the level of current through the capacitor. Normally at this time there is no drive to the switch, but if the rate of change of voltage is detected to be too high (for example, above a threshold) then drive may be reapplied to the switch to limit the rate of turnoff.

Figure 31:
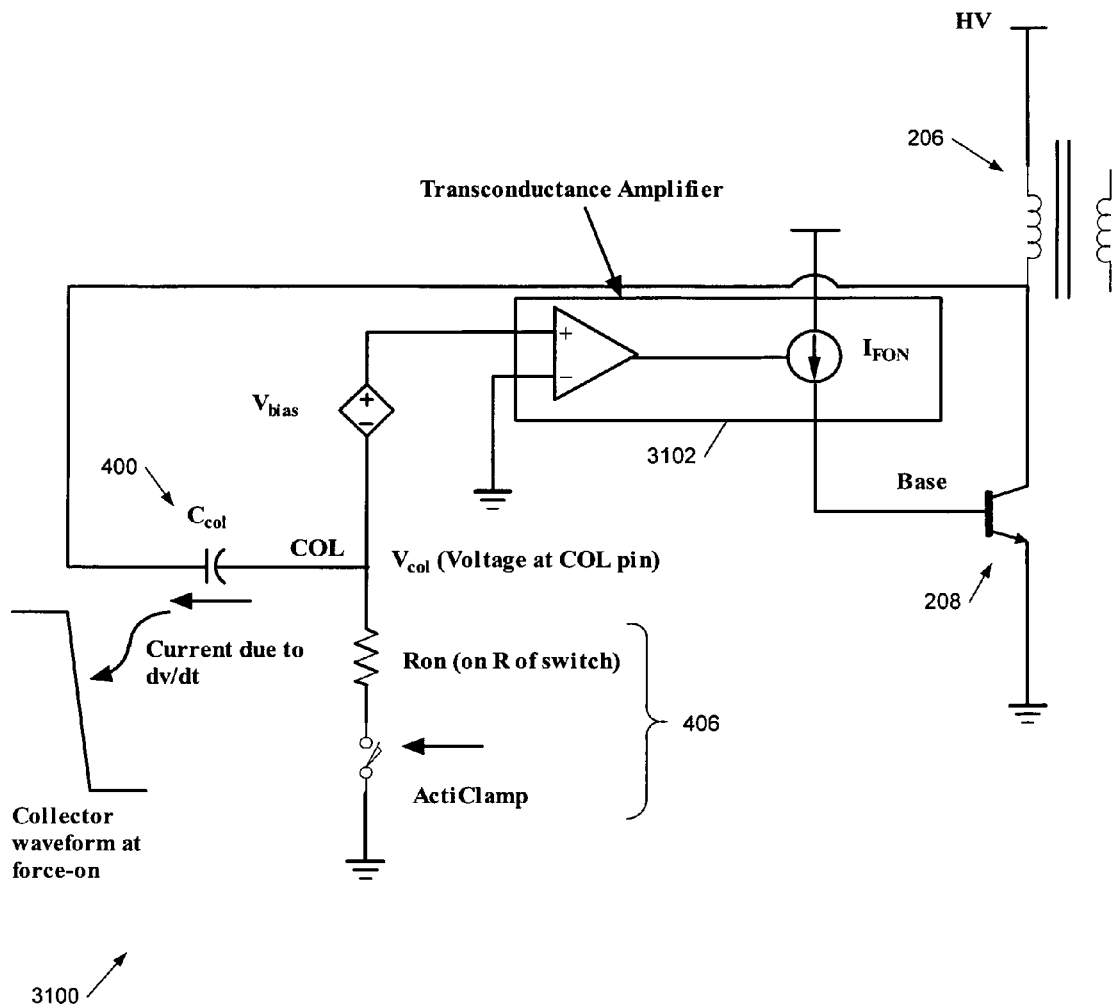
FIG. 31 shows a preferred embodiment of a system to control the dv/dt of the collector during the force-on period.

A preferred embodiment of a system 3100 to control the dv/dt of the collector during the force-on period is shown in FIG. 31. It uses a transconductance amplifier 3102 biased by a voltage $V_{bias}+V_{col}$. A high rate of fall of collector voltage will cause current through Ccol, leading to a negative voltage across Ron (of the ActiClamp switch). If greater than Vbias, this will cause a reduction of base drive, hence limiting the rate of fall of the collector and current into the COL connection. By selecting the value of the on resistance of the switch and the bias voltage $V_{bias}$ one can control the dv/dt of the collector during the force-on period.

Figure 32:
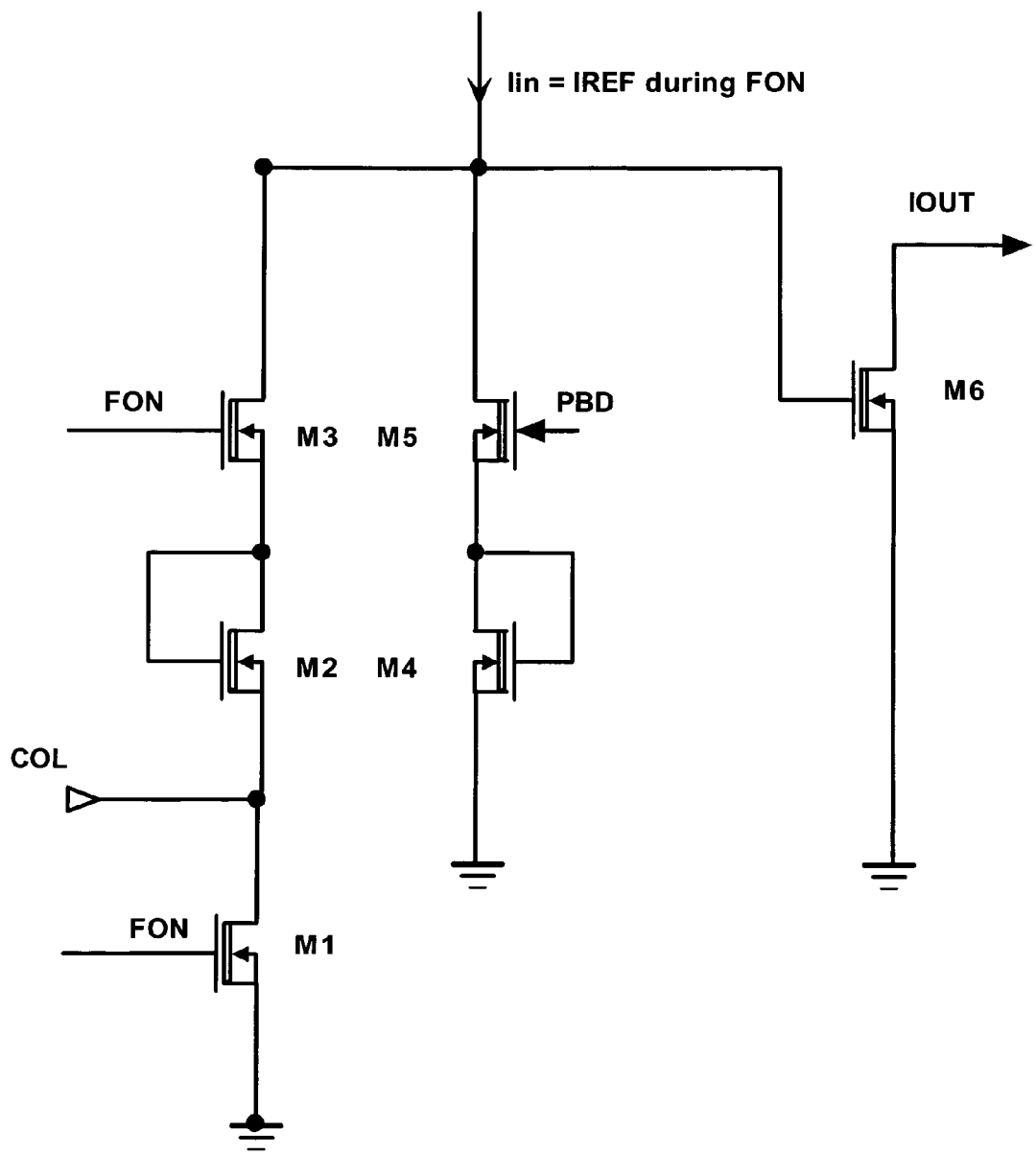
FIG. 32 shows a circuit described below which can be used to limit the maximum turn on dv/dt by controlling the amount of base current flowing into the BJT.

FIG. 32 shows a circuit described below which can be used to limit the maximum turn on dv/dt by controlling the amount of base current flowing into the BJT. As shown in the figure during FON period the switch M3 is on. During the FON period the COL pin is held quite close to ground by the transistor M1 which is kept in its linear region. A current pulled out through the COL pin during turn on also flows through the transistor M1. The voltage on the COL pin is given by $$V_{col} = -I_{col} \times R_{on} \quad \text{Equation 1}$$

Where $R_{on}$ is the on-resistance of the MOSFET M1. The output current of this block is given by $$I_{out} = K \cdot (V_{gsM6} - V_{in})^2 \text{ where } K = \frac{\mu_n \cdot C_{ox} \cdot W_6}{2L_6} \quad \text{Equation 2}$$

The base current is a scaled value of this $I_{out}$. $V_{gsM6}$ during the FON period is given by $$V_{gsM6} = V_{gsM2} + V_{col} \quad \text{Equation 3}$$

Substituting Equation 3 to Equation 2 we get $$I_{out} = K \cdot (V_{gsM2} + Vcol - V_{in})^2 \quad \text{Equation 4}$$

During FON the current flowing through the transistor M2 is the reference current $I_{REF}$. Therefore $$V_{gsM2} = V_{in} + \sqrt{\frac{I_{ref}}{K_1}} \text{ where } K_1 = \frac{\mu_n \cdot C_{ox} \cdot W_2}{2L_2} \quad \text{Equation 5}$$

Substituting Equation 5 and Equation 1 in Equation 4 we get $$I_{out} = K \cdot \left( \sqrt{\frac{I_{ref}}{K_1}} - (I_{col} \times R_{on}) \right)^2 \quad \text{Equation 6}$$

The COL current during turn on depends on the rate at which the collector voltage falls and is given by $$I_{col} = C_g \times \frac{dv}{dt} \quad \text{Equation 7}$$

Substituting Equation 7 in Equation 6 and since the base current is proportional to $I_{out}$ $$I_{base} = \quad \text{Equation 8}$$

$$K_2 \cdot \left( \sqrt{\frac{I_{ref}}{K_1}} - (C_g \times dv/dt \times R_{on}) \right)^2 \text{ where } K_2 \text{ is a constant}$$

Hence higher the dv/dt, lesser the base current, which in turn reduces the dv/dt. Also the maximum dv/dt can be controlled by changing the on-resistance of the MOSFET M1 (by changing the dimensions and/or bias).

Figure 33:
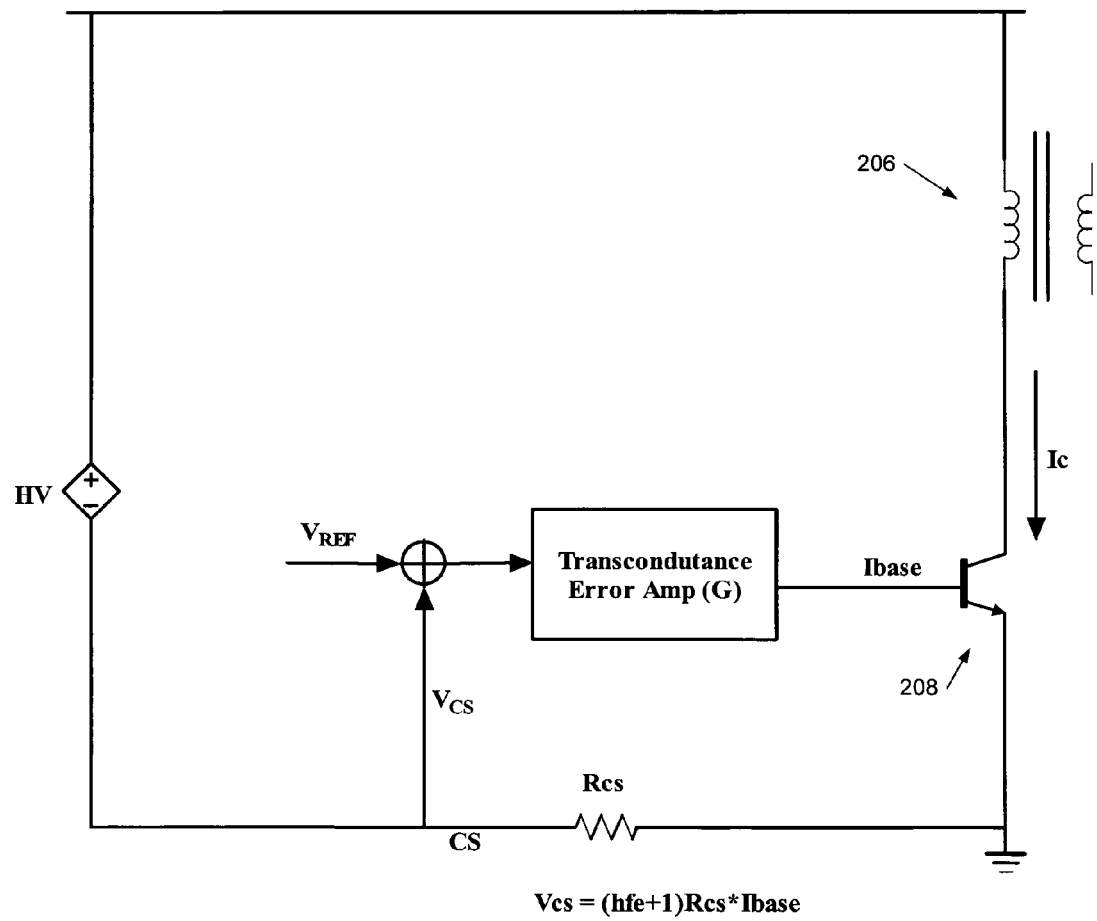
FIG. 33 shows a circuit with collector current feedback which can be used to limit the maximum turn on dV/dt.

Another method to control the dv/dt is shown in FIG. 33 which illustrates a circuit with collector current feedback. The voltage on the current sense pin Vcs can be use to control the dv/dt. The maximum base current during the turn-on period can be limited to $$I_b = \frac{V_{REF}}{1/G + h_{fe} \times Rcs}$$

Where $I_b$ is the base current, G is the transconductance of the amplifier, hfe is the current gain of the BJT and $R_{CS}$ is the current sense resistor. Choosing $V_{REF}$ and/or $R_{CS}$ can limit the dv/dt during turn-on.

Limiting the base current during turn-on limits the collector current and hence limits the turn-on dv/dt at the collector.

Charge Storage Time Measurement

We now describe a method of deducing the presence of excess stored charge by monitoring base current during turn-off, to enable a bipolar switching device to be turned off faster.

The techniques described here apply to managing the on-state drive of bipolar transistors (BJT and IGBT) used in cyclic switching applications. As described previously, there is a balance to be struck between high drive level to minimise voltage drop in the switching device during the on-period and the increased time it takes for the device to turn off at the beginning of the desired off-period. Low levels of drive reduce the turn-off time, but increase the on-state voltage. Both parameters are important in maximising power efficiency and control in response to load conditions.

We described above techniques that monitor the collector voltage during on period and adjust the base/gate drive to maintain in a desired range. We now describe a technique which monitors the turn-off behaviour in one cycle to determine the optimum base/gate drive in subsequent cycle(s).

Figure 34A:
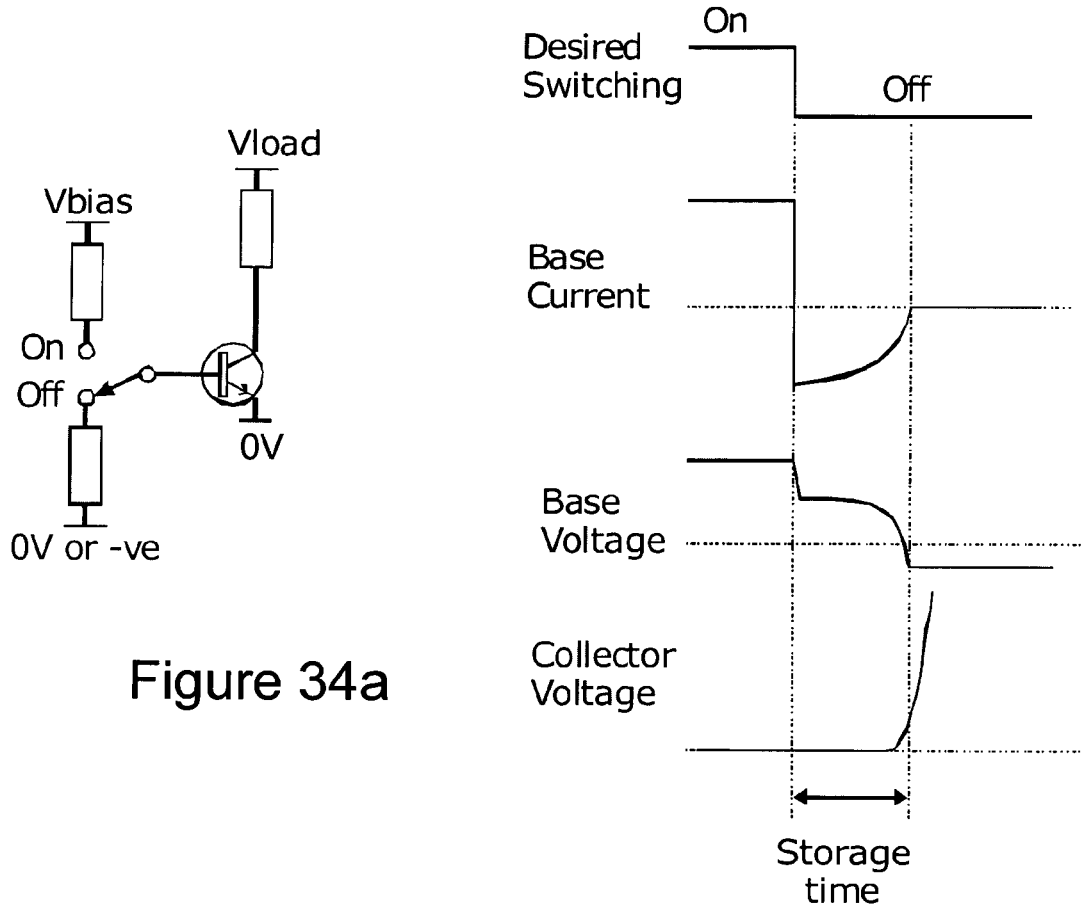
FIGS. 34a and 34b show, respectively, typical effects of charge storage in BJT and IGBT power switches.
Figure 34B:
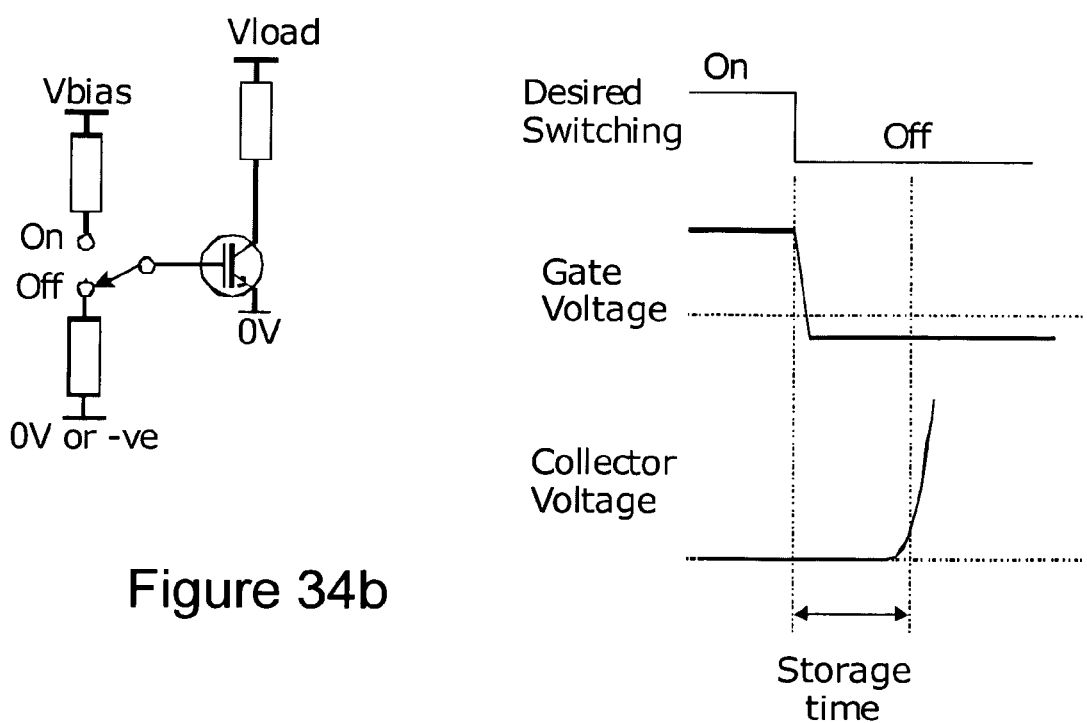

Turn-off behaviour is characterised by a turn-off time, during which the collector-emitter voltage remains low despite base/gate drive having been removed. BJTs during this time show negative base current but may show positive base voltage; this is illustrated in FIGS. 34a and b.

An increased on-state gate or base drive causes increased storage time. In cyclic switching applications where the load conditions do not change by a large degree between successive cycles, the turn-off behaviour in one cycle can be used to determine the optimum drive in subsequent cycles.

This storage time can be sensed in either BJT or IGBT applications as the time between removal of the base/gate drive and when the collector voltage rises substantially. The latter can be determined using a comparison between sensed collector voltage and a fixed threshold, or a relative rise of the collector voltage from an on-state value (e.g. by capacitive sensing as described above). Alternatively, in BJTs, the base voltage and/or current can be used. For example, the transistor can be turned off by applying a negative base current (ie pulling current out of the base); when this ceases the transistor is off. Thus measuring the charge storage time may comprise measuring a fall in a negative base current of the transistor. A further option is to detect fall in the collector or emitter current.

To turn off a BJT, the positive base (on-state) base current is removed and, preferably, current is taken from the base to a zero or negative voltage. During the period of charge storage a negative base current is observed, hence the condition of negative current can be used to determine the storage time. The base current may be compared against a threshold, the end of storage time being deduced as the time when the base current increases above the (negative) threshold. Alternatively, when the base turn-off is supplied via a resistor, the base voltage also indicates the end of the storage time; it is held at a more-positive value until the end of the storage time when it falls to the turn-off bias voltage. However, the actual base voltage during the off-period depends on the external resistor, the base spreading resistance and the turn-off bias voltage and other transistor parameters (including temperature). If the turn-off bias is a significant negative voltage then it is possible to detect end of storage time reliably, (but there remains a restriction on the magnitude of the turn-off current and, hence, on reduction of turn-off time, that can be used before detection is unreliable).

Preferably collector voltage (for BJT or IGBT) or base current (in the case of BJTs) are used to determine the storage time. A saturation control system can monitor the time between removal of base (or gate) drive and the time when the collector voltage rises substantially or the collector or emitter current falls substantially. This can then be used to control the amount of base or gate drive applied in subsequent cycles. It is preferable to have a target desaturation time so that the drive is adjusted until the desaturation time is close to the target. If the desaturation time is longer than the target, the drive is reduced; if the desaturation time is shorter than target then the drive is increased. The target time is preferably chosen carefully: if it is set too short then low values of drive are applied and the on state saturation voltage may be too high. Conversely if it is set too long this could be inappropriate for the converter application.

Figure 35:
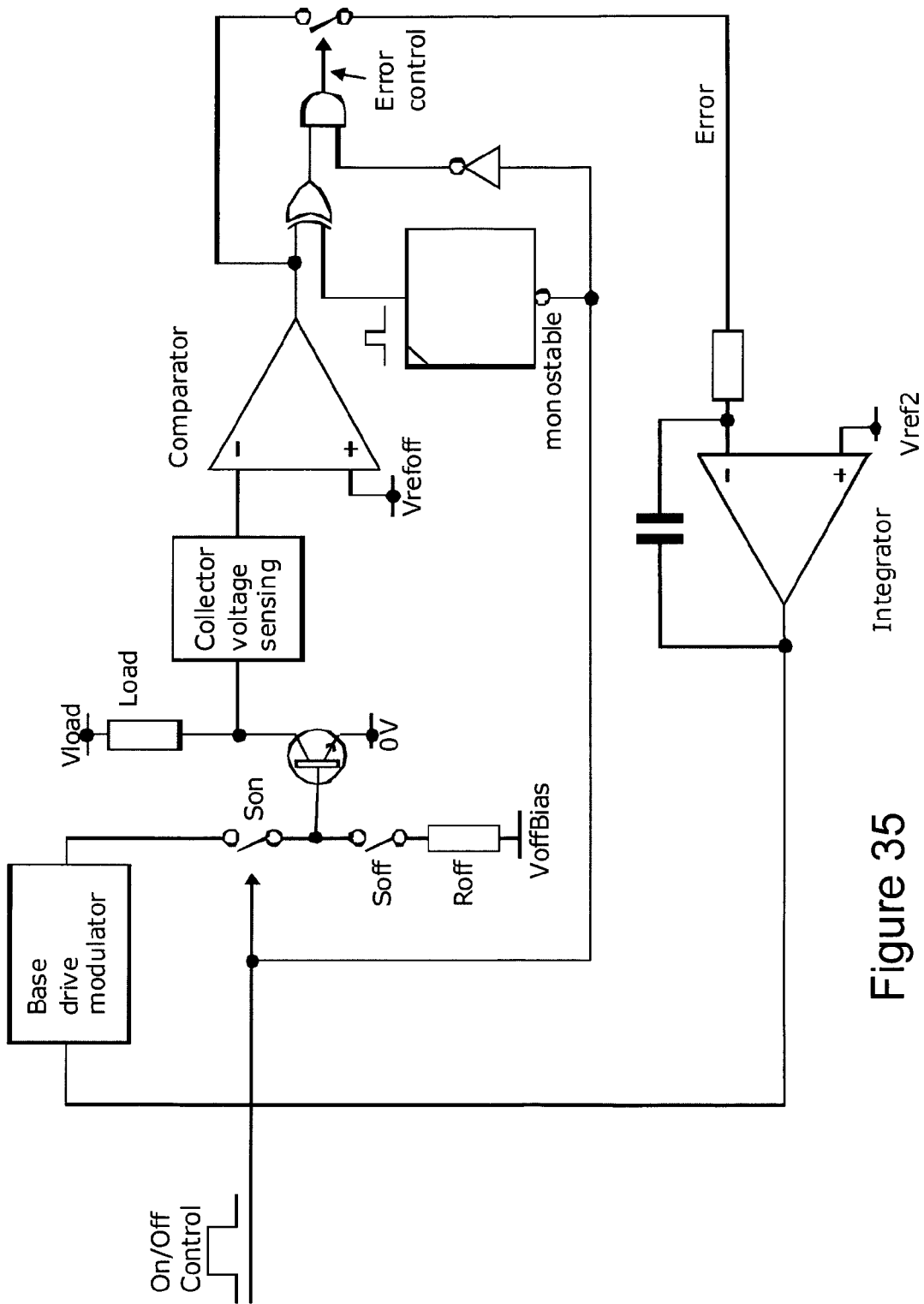
FIG. 35 shows an embodiment of a saturation control system based on cyclic measurement of storage time.
Figure 36:
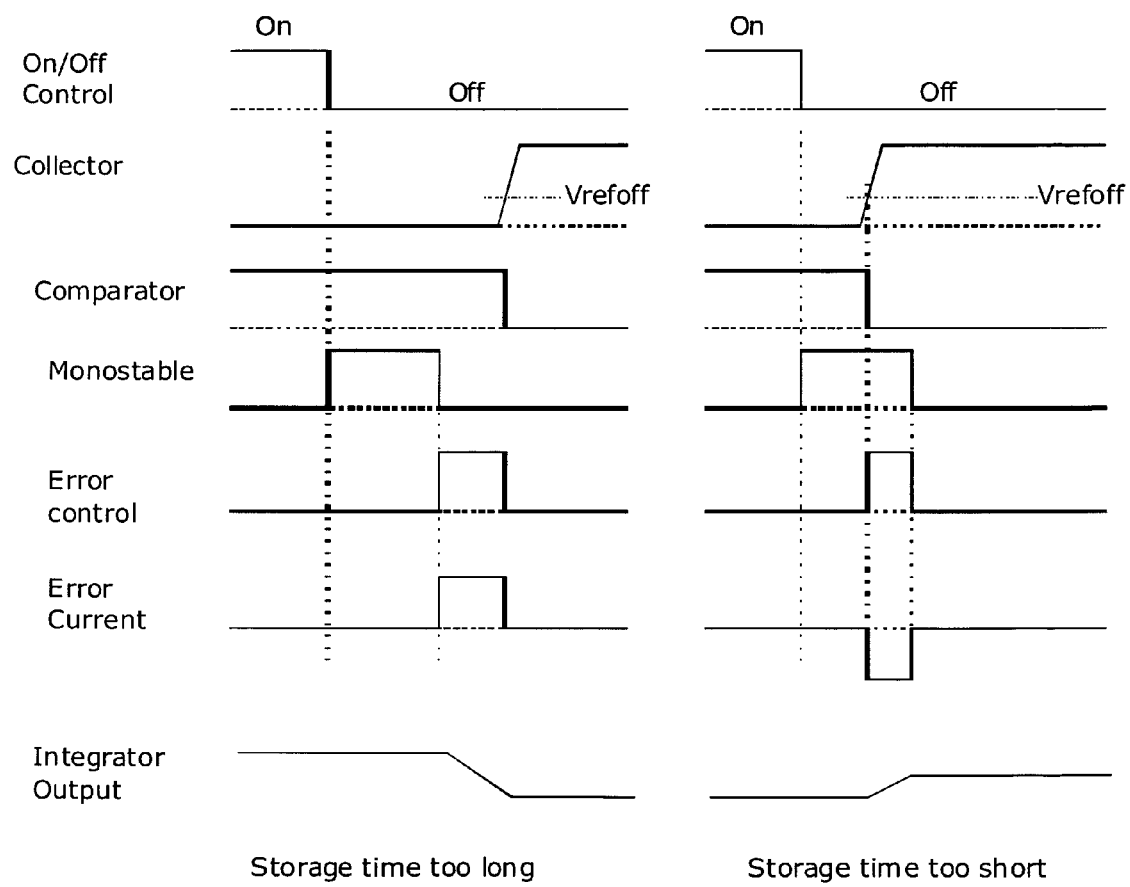
FIG. 36 shows timing and signals of a system as in FIG. 35 for the two conditions a) where the drive is too low and the storage time is less than the target duration and b) where the drive is too high and the storage time is longer than the target duration

Once the storage time has been sensed it may then be used to control the level of base/gate drive during subsequent on-period(s). Base/gate drive may be varied by a number of methods described previously, including pulse amplitude modulation, pulse width, frequency or slope modulation and the like. Amplitude refers to base current in the case of BJTs and gate voltage in the case of IGBTs. The control law should be arranged to reduce drive (amplitude or net duration) when storage time increases. The control scheme preferably includes a method/device, such as an integrator or peak detector, to store value(s) from one switching cycle to another. A circuit to achieve this is shown in FIG. 35, the operation of which is illustrated in FIG. 36.

SUMMARY

The above-described techniques are particularly applicable to cyclic power converters where bipolar transistors (bipolar junction transistors or insulated gate bipolar transistors) are used as power switching devices. In such applications it is important to minimise power loss and provide a high degree of control of the switching periods. It is also important to achieve low on-state voltage drop in the switch while having a fast turn-off, on command from the power control system. In addition to the on-state power loss consequent of the on-state voltage, power may be lost in the turn-off transition; fast turn off reduces this loss. In flyback converters, energy loss at turn-off directly erodes energy delivered to the load. In forward converters, though turn-off loss does not directly reduce load power, it does result in power wasted in the switching device. In all power converters, delivered power can be controlled via the on and off periods of the switch. For optimum control it is desirable that the switch can be turned off on command from a control signal with minimum delay. Particularly in conditions of overload, small extensions to on-time can degrade power control and, possibly, lead to excessive power dissipation or component failure. The techniques described using coupling capacitor(s) are particularly applicable to resonant discontinuous forward converters because the capacitor(s) can serve both to support the resonant behaviour and as means to manage the on-state switch voltage.

Thus we have described systems in which the base current is controlled by monitoring the voltage at the collector of the BJT during on time of the primary switch, and the methods of measuring the voltage at the collector of the BJT during turn-on.

We have also described the methods and apparatus for controlling the rate of change of collector voltage to control the maximum current that can flow through the COL pin during turn-on. By controlling this, significant area savings can be made within the chip. Also the magnitude of ground bounce during the turn-on can be reduced. We have still further described the methods and apparatus for detecting a negative magnetising current during the proportional drive period. This assists in resetting the feedback capacitor properly thereby facilitating the functioning of the proportional base driver. This circuit aims to ensure that the ESD diodes are not conducting under such circumstances.

Advantages of dv/dt control include the area reduction that can be made within the chip, and that the magnitude of ground bounce during the turn-on can be reduced. Further advantages of the negative magnetising current detector include that this circuit assists in resetting the feedback capacitor properly thereby facilitating the functioning of the proportional base driver. The circuit also aims to ensure that the ESD diodes are not conducting under such circumstances.

We have described some preferred embodiments of the invention with particularly reference to common-emitter configuration bipolar transistors, but the skilled person will understand that corresponding principles may be applied to common-base or gate operation by using base bias, emitter switching and base current or gate voltage control. Likewise, although we have described some preferred embodiments of the invention with reference to bipolar junction transistors, as previously mentioned the techniques are also applicable insulated gate bipolar transistors (IGBTs). Some preferred embodiments of the control system are implemented on a single integrated circuit (with or without the power switching device).

Some preferred embodiments of the invention are particularly useful for power converters including (but not limited to) forward power converters such as resonant discontinuous power converters and flyback converters; these may be powered either from ac mains or from a dc source. However applications for embodiments of the invention are not limited to power converters and include other circuits with cyclic operation, as well as acyclically operating circuits.

Although in the main we have referred to analogue circuitry the skilled person will understand that embodiments of the control systems we describe may equally be implemented in corresponding digital circuitry (or in a combination of analogue and digital circuitry), using digital representations of the control signals mentioned.

No doubt many other effective alternatives will occur to the skilled person. It will be understood that the invention is not limited to the described embodiments and encompasses modifications apparent to those skilled in the art lying within the spirit and scope of the claims appended hereto.

We claim:

1. A power converter comprising a bipolar switching device switching an inductive load, said power converter including a closed-loop control system for controlling the degree of saturation of said bipolar switching device when said bipolar switching device is switched on, said bipolar switching device having a collector terminal connected to switch said inductive load and a control terminal for controlling said switching, said closed-loop control system comprising:

a voltage sensing system to sense a voltage on said collector terminal and to provide a voltage sense signal;

a controller having an input coupled to receive said voltage sense signal from said voltage sensing system and having a control signal output; and a drive modulation system coupled to said output of said controller for modulating a drive to said control terminal of said bipolar switching device responsive to said controller control signal; and wherein said controller is configured to monitor changes in said sensed voltage during a period when a drive signal is applied to said control terminal of said switching device, said drive signal to drive said switching device to be on and said controller configured to control said drive modulation system to control said degree of saturation of said bipolar switching device when said drive signal maintains said switching device on, wherein said voltage sensing system comprises a first capacitor, one side of said first capacitor being coupled to said collector terminal of said switching device and a second side of said first capacitor being coupled to a reset device to reset a voltage on said first capacitor when a said drive signal to drive said switching device on is applied to said control terminal, whereby said changes in said sensed voltage when said drive signal maintains said switching device on subsequent to said reset may be monitored by said controller to control said drive modulation system to control said degree of saturation of said bipolar switching device.

2. A power converter as claimed in claim 1 wherein said switching device has an internal collector resistance, said device having a quasi-saturated state in which said device is substantially saturated and said voltage on said collector terminal varies with current through said device, and wherein said controller is configured to control said degree of saturation of said bipolar switching device to be adjacent a boundary of said quasi-saturated state.

3. A power converter as claimed in claim 1 wherein said bipolar switching device comprises a BJT or IGBT, and wherein said control terminal comprises a base or gate terminal of said bipolar switching device.

4. A power converter as claimed in claim 1 wherein said voltage sensing system includes a voltage limiter such that variations in said sensed voltage are detectable when said device is in saturation and said sensed voltage is limited when said device is off.

5. A power converter as claimed in claim 1 further comprising a second capacitor coupled to said second side of said first capacitor to provide a capacitative divider for voltage sharing between said first and second capacitors.

6. A power converter as claimed in claim 1 further comprising a second switch connected to apply a forcing drive to said switching device when said device is initially turned on to force said device into saturation or quasi-saturation.

7. A power converter as claimed in claim 1 wherein said controller includes a comparator to compare a signal derived from said sensed voltage with a reference and to provide an output for modulating said drive responsive to a difference between said signal derived from said sensed voltage and said reference.

8. A power converter as claimed in claim 1 wherein said controller includes a third switch to inhibit said sensed voltage from modulating said drive when said switching device is off.

9. A power converter as claimed in claim 1 wherein said power converter is configured to cyclically switch said switching device, and wherein said controller includes a memory to store a value dependent on a signal derived from said sensed voltage from one cycle for use in controlling said drive modulation system in a subsequent said cycle.

10. A power converter as claimed in claim 1 wherein said controller comprises a proportional-integral controller to control said drive modulation system responsive to a combination of a level of said voltage sense signal and an integral of said voltage sense signal.

11. A power converter as claimed in claim 1 wherein said controller includes a peak detector having an input coupled to said voltage sense signal and an output coupled to said control signal output, and wherein said controller control signal is dependent on a peak value of said voltage sense signal.

12. A power converter as claimed in claim 11 wherein said power converter is configured to cyclically switch said switching device, and wherein said peak detector is configured to hold a detected peak level and to reduce said held detected peak level stepwise switching cycle-by-switching cycle.

13. A power converter as claimed in claim 11 wherein said peak detector is configured to provide an output which has a rate of rise dependent on said voltage sense signal.

14. A power converter as claimed in claim 11 wherein said controller control signal has a value dependent on the higher of an output of said peak detector and a level of said voltage sense signal.

15. A power converter as claimed in claim 11 wherein said peak detector comprises a unidirectional follower coupled to said peak detector input, and wherein said unidirectional follower is series coupled to a peak detector resistor and a peak detector capacitor, and wherein said peak detector output is coupled to a junction between said unidirectional follower and said peak detector resistor.

16. A power converter as claimed in claim 1 wherein said drive modulation system comprises a transconductance amplifier.

17. A power converter as claimed in claim 1 wherein said drive modulation system comprises a pulse amplitude modulation system.

18. A power converter as claimed in claim 1 wherein said drive modulation system comprises a pulse width or pulse frequency modulation system.

19. A power converter as claimed in claim 1 wherein said power converter is configured to cyclically switch said switching device, and wherein said drive modulation system is configured to deliver a pulse shorter than an on-period of said switching cycle to maintain said device in saturation for substantially the complete duration of the remainder of an on-period of the switching cycle of said device.

20. A power converter as claimed in claim 1 wherein said power converter is configured to cyclically switch said switching device, and wherein said drive modulation system is configured to deliver a pulse of length equal to or shorter than an on-period of said switching cycle to maintain said device in saturation for substantially the complete duration of an on-period of the switching cycle of said device following the start of said pulse, and wherein said pulse has a pulse shape comprising a first substantially constant level portion and a second decaying portion.

21. A power converter as claimed in claim 1 further comprising a further controller to control an on-off timing of said bipolar switching device.

22. A switch mode power converter including a bipolar switching device and a voltage sensing system for sensing a voltage on a terminal of said switching device, wherein said voltage sensing system comprises:
   a driver configured to apply to a control terminal of said switching device a drive signal, said drive signal to drive said switching device to be on;
   a capacitor having one plate coupled to a terminal of said device and a second plate coupled to an output of said voltage sensing system;
   and a reset device having a first connection coupled to said second plate of said capacitor and a second connection coupled to a reference voltage to reset said voltage on said second plate of said capacitor when a said drive is applied to a control terminal of said switching device and to enable monitoring of variations of said voltage on said terminal of said switching device when said drive signal maintains said switching device on subsequent to said reset, whereby said driver may control said degree of saturation of said bipolar switching device.

23. A switch mode power converter including a bipolar switching device and a saturation control system for controlling a degree of saturation of said switching device when said device is switched on, said saturation control system having a control loop including a controller responsive to a peak value of a signal derived from a voltage on a terminal of said bipolar switching device,
   wherein the converter comprises a driver configured to apply to a control terminal of said switching device a drive signal, said drive signal to drive said switching device to be on, and
   wherein said converter has a voltage sensing system for sensing a voltage on a terminal of said switching device, the voltage sensing system comprising a first capacitor, one side of said first capacitor being coupled to said collector terminal of said switching device and a second side of said first capacitor being coupled to a reset device to reset a voltage on said first capacitor when said drive signal is applied to a control terminal of said switching device, whereby variations in said sensed voltage when said drive signal maintains said switching device on subsequent to said reset may be monitored by said converter to control said degree of saturation of said bipolar switching device.

24. A switch mode power supply as claimed in claim 23 wherein said controller is responsive to a combination of said peak value and a value dependent on a present sensed voltage on said terminal of said bipolar switching device.

25. A switch mode power supply as claimed in claim 23 wherein said controller comprises a peak detector having an input and an output, and a unidirectional follower coupled to said peak detector input, and wherein said unidirectional follower is series coupled to a peak detector resistor and a peak detector capacitor, and wherein said peak detector output is coupled to a junction between said unidirectional follower and said peak detector resistor.

26. A switch mode power converter including a bipolar switching device and a saturation control system for controlling a degree of saturation of said switching device when said device is switched on, said saturation control system having a control loop including a controller responsive to a sensed voltage on a terminal of said bipolar switching device and including a system to apply a forcing drive to said bipolar switching device to initially force said device into saturation, and wherein said saturation control system is configured to afterwards control a degree of saturation of said switching device,
   wherein the converter comprises a driver configured to apply to a control terminal of said switching device a drive signal, said drive signal to drive said switching device to be on, and
   wherein said converter has a voltage sensing system for sensing a voltage on a terminal of said switching device, the voltage sensing system comprising a first capacitor, one side of said first capacitor being coupled to said collector terminal of said switching device and a second side of said first capacitor being coupled to a reset device to reset a voltage on said first capacitor when a said drive signal is applied to a control terminal of said switching device, whereby variations in said sensed voltage when said drive signal maintains said switching device on subsequent to said reset may be monitored by said converter to control said driver to control said degree of saturation of said bipolar switching device.

27. A switch mode power supply as claimed in claim 26 wherein said device comprises a bipolar junction device, and further comprising a transconductance amplifier having a voltage input coupled to an output of said controller and having a current output coupled to a control connection of said bipolar junction switching device, and wherein said transconductance amplifier includes a control device to control said transconductance amplifier to apply a forcing current to said bipolar junction switching device.

28. A method of controlling the degree of saturation of a bipolar switching device when said bipolar switching device is switched on, said bipolar switching device having a collector terminal and a control terminal for controlling switching of said device, the method comprising:
  applying to a control terminal of said switching device a drive signal, said drive signal to drive said switching device to be on;
  sensing a voltage on said collector terminal during a period when said switching device is switched on;
  determining an error signal responsive to a difference between a signal derived from said sensed voltage and a reference; and
  modulating a drive to said control terminal of said bipolar switching device responsive to said error signal to control said degree of saturation of said bipolar switching device when said device is switched on,
  wherein said sensing uses a voltage sensing system for sensing voltage on a terminal of said switching device, the voltage sensing system comprises a first capacitor, one side of said first capacitor being coupled to said collector terminal of said switching device and a second side of said first capacitor being coupled to a reset device to reset a voltage on said first capacitor when a said drive signal is applied to said control terminal, whereby variations in said sensed voltage when said drive signal maintains said switching device on subsequent to said reset are monitored to control said degree of saturation of said bipolar switching device.

29. A method as claimed in claim 28 wherein said switching device has an internal collector resistance, said device having a quasi-saturated state in which said device is substantially saturated and said voltage on said collector terminals varies with current through said device, and wherein said controlling of said degree of saturation comprises controlling saturation of said bipolar switching device to be within or adjacent a boundary of said quasi-saturated state.

30. A method as claimed in claim 28 wherein said bipolar switching device comprises a BJT or IGBT, and wherein said control terminal comprises a base or gate terminal of said bipolar switching device.

31. A protection system for a power converter including a bipolar switching device and a switching control system to control switching on of said bipolar switching device for an on-period, the protection system comprising: a voltage sensing system to sense a voltage on a collector terminal of said device; a comparator coupled to said voltage sensing system to compare said sensed voltage to a threshold; and a protection mechanism coupled to said comparator and responsive to said sensed voltage exceeding said threshold to terminate said on-period early, wherein said voltage sensing system comprises a first capacitor, one side of said first capacitor being coupled to said collector terminal of said switching device and a second side of said first capacitor being coupled to a reset device to reset a voltage on said first capacitor when a drive signal drives said switching device to be on, whereby variations in said sensed voltage when said drive signal maintains said switching device on subsequent to said reset may be monitored by said protection system to control said degree of saturation of said bipolar switching device.

32. A power converter according to claim 1, wherein said converter is a resonant converter having a resonant circuit, said first capacitor configured to support resonance in said resonant circuit.

33. A switch mode power converter according to claim 22, wherein said converter is a resonant converter having a resonant circuit, said capacitor configured to support resonance in said resonant circuit.

34. A switch mode power converter according to claim 26, wherein said converter is a resonant converter having a resonant circuit, said first capacitor configured to support resonance in said resonant circuit.

35. The protection system of claim 31, wherein said bipolar switching device is provided in a resonant power converter having a resonant circuit, wherein said first capacitor supports resonance in said resonant circuit.

\* \* \* \* \*

UNITED STATES PATENT AND TRADEMARK OFFICE
CERTIFICATE OF CORRECTION

| | | |
|---|---|---|
| PATENT NO. | : 7,961,484 B2 | Page 1 of 1 |
| APPLICATION NO. | : 12/109087 | |
| DATED | : June 14, 2011 | |
| INVENTOR(S) | : Vinod A. Lalithambika et al. | |

It is certified that error appears in the above-identified patent and that said Letters Patent is hereby corrected as shown below:

In column 33, line 64, in Claim 1, after "on" insert -- , --.

Signed and Sealed this
Ninth Day of August, 2011

David J. Kappos
*Director of the United States Patent and Trademark Office*